(12) United States Patent
Brederlow et al.

(10) Patent No.: US 7,733,157 B2
(45) Date of Patent: *Jun. 8, 2010

(54) NOISE-REDUCING TRANSISTOR ARRANGEMENT

(75) Inventors: Ralf Brederlow, Poing (DE); Jeongwook Koh, Seoul (KR); Christian Pacha, Munich (DE); Roland Thewes, Groebenzell (DE)

(73) Assignee: Infineon Technologies AG, Neubiberg (DE)

( * ) Notice: Subject to any disclaimer, the term of this patent is extended or adjusted under 35 U.S.C. 154(b) by 553 days.

This patent is subject to a terminal disclaimer.

(21) Appl. No.: 10/583,538

(22) PCT Filed: Dec. 3, 2004

(86) PCT No.: PCT/DE2004/002657

§ 371 (c)(1),
(2), (4) Date: May 25, 2007

(87) PCT Pub. No.: WO2005/060099

PCT Pub. Date: Jun. 30, 2005

(65) Prior Publication Data

US 2007/0279120 A1 Dec. 6, 2007

(30) Foreign Application Priority Data

Dec. 15, 2003 (DE) ................... 103 58 713

(51) Int. Cl.
*H03K 17/687* (2006.01)
(52) U.S. Cl. ...................... 327/427; 327/404
(58) Field of Classification Search ............ 327/384, 327/386, 389, 403, 404, 427, 534, 537; 257/347, 257/348, 365
See application file for complete search history.

(56) References Cited

U.S. PATENT DOCUMENTS

| 5,392,043 | A | 2/1995 | Ribner |
| 7,012,468 | B2 | 3/2006 | Brederlow et al. |
| 2003/0128776 | A1 | 7/2003 | Rawlins et al. |
| 2006/0033170 | A1* | 2/2006 | Brederlow .................. 257/401 |
| 2007/0176634 | A1* | 8/2007 | Brederlow et al. ............ 326/68 |

FOREIGN PATENT DOCUMENTS

| DE | 44 35 305 A1 | 4/1995 |
| DE | 100 01 124 C1 | 6/2001 |
| DE | 100 45 148 A1 | 3/2002 |

OTHER PUBLICATIONS

S. Christensson et al.; "Low Frequency Noise in MOS Transistors—I Theory"; Solid-State Electronics, Pergamon Press 1968, vol. 11, pp. 797-812.

(Continued)

*Primary Examiner*—Long Nguyen
(74) *Attorney, Agent, or Firm*—Dickstein, Shapiro, LLP.

(57) ABSTRACT

Noise-reducing transistor arrangement having first and second field effect transistors (FETs) having source terminals coupled together, drain terminals coupled together, and control terminals for application of a first or second signal. A clock generator unit is configured to provide the first and second signals alternately to the FETs with an alternating frequency which is at least as great as the cut-off frequency of the noise characteristic of the FETs, or with a reciprocal alternating frequency which is less than a mean lifetime of an occupation state of a defect in the boundary region between channel region and gate insulating layer of the FETs. The first signal is applied to the control terminal of the first FET and, simultaneously, the second signal to the control terminal of the second FET. The second signal is applied to the control terminal of the first FET and, simultaneously, the first signal to the control terminal of the second FET.

31 Claims, 27 Drawing Sheets

OTHER PUBLICATIONS

R. Brederlow et a.; "Influence of Fluorinated Gate Oxides on the Low Frequency Noise of MOS Transistors under Analog Operation"; Proceedings of the 28th European Solid-State Device Research Conference, pp. 472-475, 1998.

S.L.J. Gierkink et al.; "Reducing MOSFET $1/f$ Noise and Power Consumption by Switched Biasing"; Proceedings of the 28th European Solid-State Circuits Conference, pp. 154-157, 1999.

E. Simoen et al.; "Empirical Model for the Low-Frequency Noise of Hot-Carrier Degraded Submicron LDD MOSFET'S"; IEEE Electron Device Letters, vol. 18, No. 10, pp. 480-482, Oct. 1997.

I. Bloom et al.; "$1/f$ noise reduction of metal-oxide-semiconductor transistors by cycling from inversion to accumulation"; Appl. Phys. Lett. 58 (15), pp. 1664-1666, Apr. 15, 1991.

R. Gregorian et a.; "Analog MOS Integrated Circuits"; NY, John Wiley & Sons, 1986.

P.E. Allen et al.; "CMOS Analog Circuit Design"; New York, Oxford University Press, 1987.

P.R. Gray et al.; "Analysis and design of analog integrated circuits"; NY, John Wiley & Sons, 1993.

A.B. Grebene; "Bipolar and MOS analog integrated circuit design"; NY, John Wiley & Sons, 1984.

J. Tihanyi et al.;"Properties of ESFI MOS Transistors Due to the Floating Substrate and the Finite Volume"; IEEE Transactions on Electron Devices, vol. ED-22, No. 11, pp. 1017-1023, Nov. 1975.

M. Chan et al.; "Comparative Study of Fully Depleted and Body-Grounded Non Fully Depleted SOI MOSFET's for High Performance Analog and Mixed Signal Circuits"; IEEE Transactions on Electron Devices, vol. 42, No. 11, pp. 1975-1981, Nov. 1995.

B.M. Tenbroek et al.; "Impact of Self-Heating and Thermal Coupling on Analog Circuits in SOI CMOS"; IEEE Journal of Solid-State Circuits, vol. 33, No. 7, pp. 1037-1046, Jul. 1998.

A. Wei et al.; "Minimizing Floating-Body-Induced Threshold Voltage Variation in Partially Depleted SOI CMOS"; IEEE Electron Device Letters, vol. 17, No. 8, pp. 391-394, Aug. 1996.

J. Colinge; "Silicon-on-Insulator Technology: Materials to VLSI"; Norwel, MA: Kluwer, pp. 139-141, 1991.

K.A. Jenkins et al.; "Characteristics of SOI FET's Under Pulsed Conditions"; IEEE Transactions on Electron Devices, vol. 44, No. 11, pp. 1923-1930, Nov. 1997.

L.M. Perron et al.; "Switch-Off Behavior of Floating-Body PD SOI MOSFET's"; IEEE Transactions on Electron Devices, vol. 45, No. 11, pp. 2372-2375, Nov. 1998.

S.L.J. Gierkink et al.; "Intrinsic $1/f$ Device Noise Reduction and Its Effect on Phase Noise in CMOS Ring Oscillators"; IEEE Journal of Solid-State Circuits, vol. 34, No. 7, pp. 1022-1025, Jul. 1999.

E.A.M. Klumperink et al.; "Reducing MOSFET $1/f$ Noise and Power Consumption by Switched Biasing"; IEEE Journal of Solid-State Circuits, vol. 35, No. 7, pp. 994-1001, Jul. 2000.

\* cited by examiner

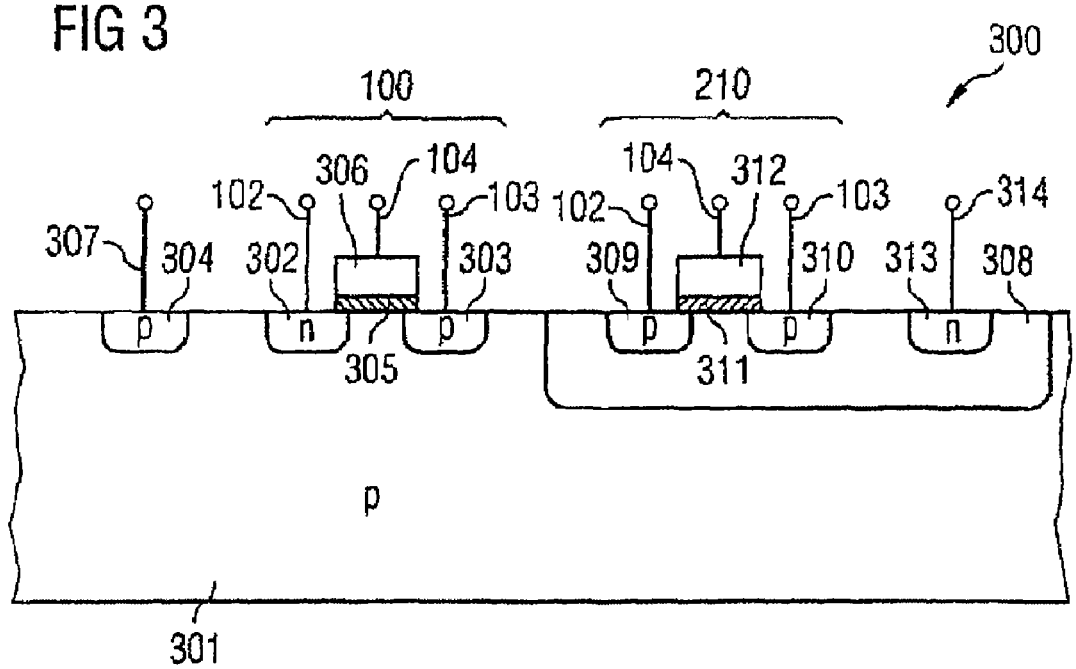
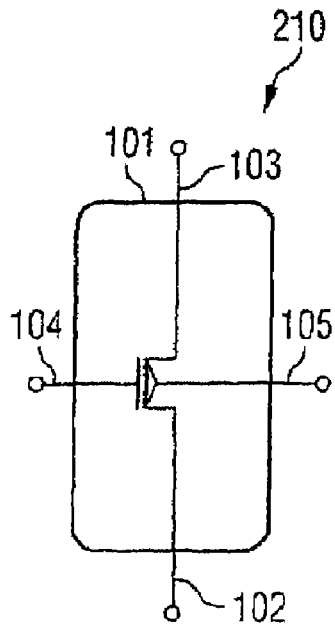
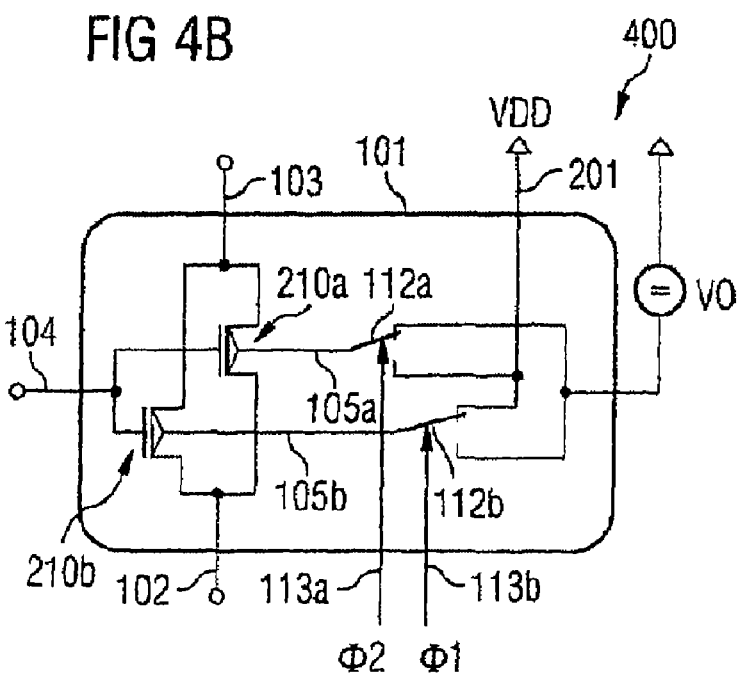

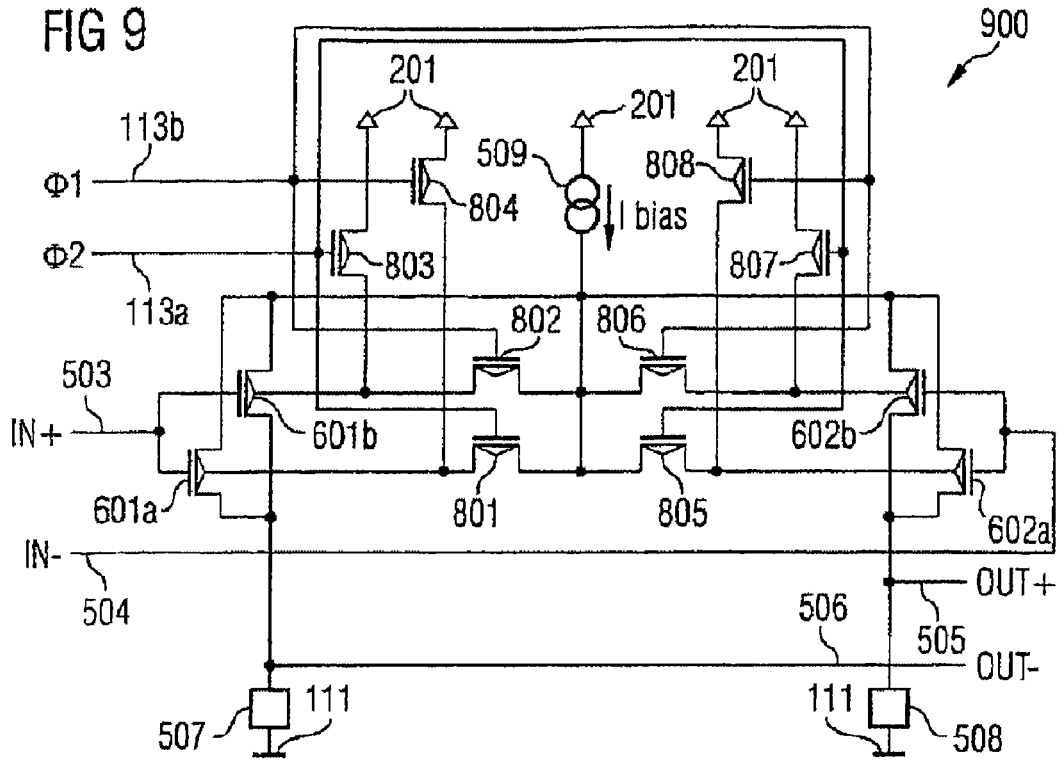
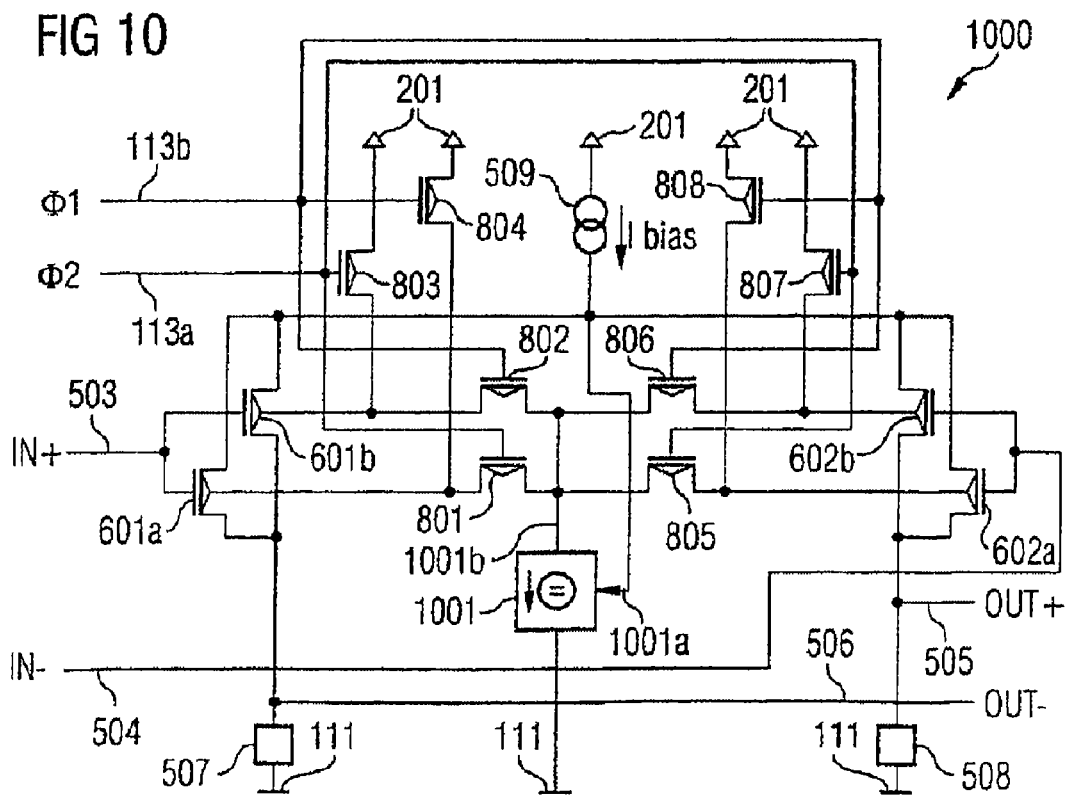

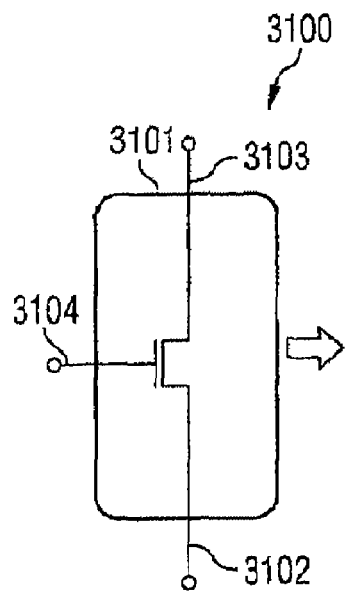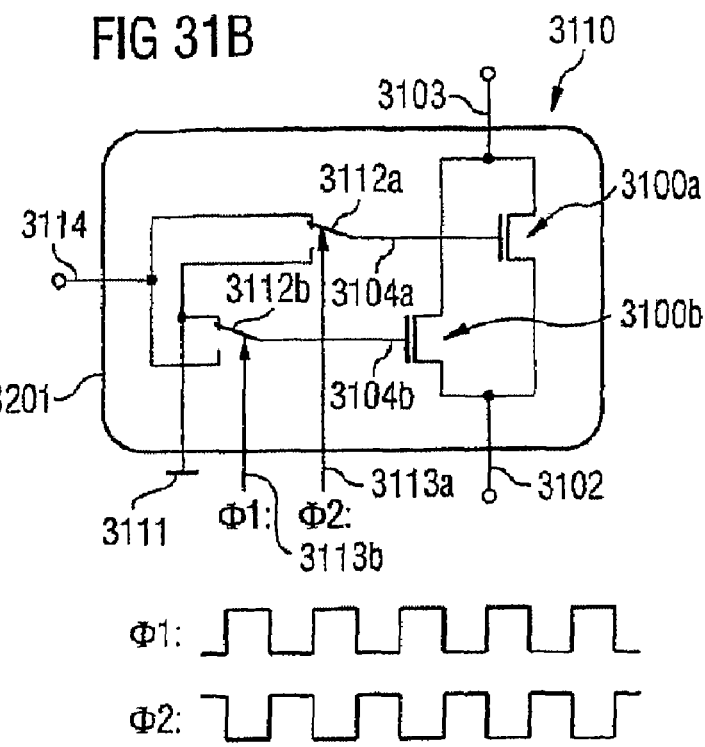
FIG 31A  FIG 31B
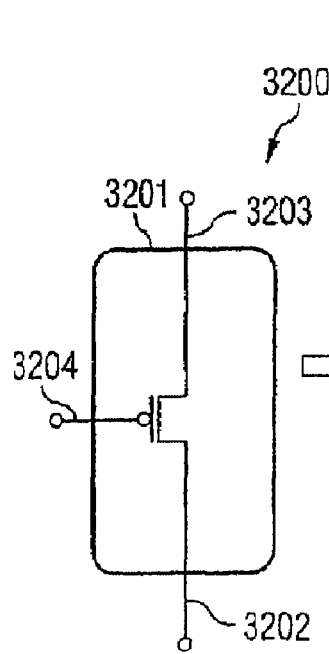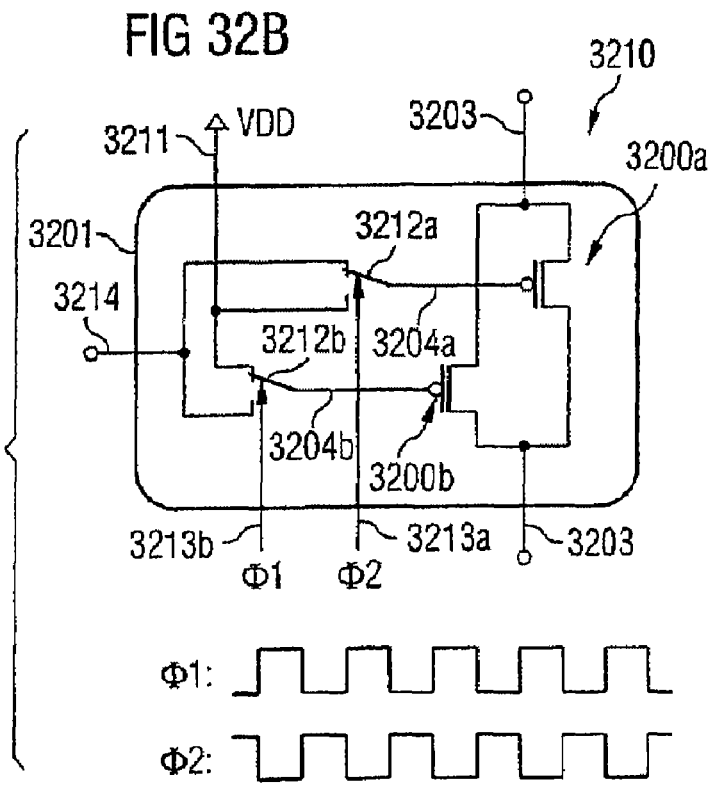
FIG 32A  FIG 32B

NOISE-REDUCING TRANSISTOR ARRANGEMENT

CROSS-REFERENCE TO RELATED APPLICATION

This application is a nation stage of International Patent Application Serial No. PCT/DE2004/002657, filed Dec. 3, 2004, which published in German on Jun. 30, 2005 as WO/2005/060099, and is incorporated herein by reference in its entirety.

FIELD OF THE INVENTION

The invention relates to a noise-reducing transistor arrangement, an integrated circuit, and a method for reducing the noise of field effect transistors.

BACKGROUND OF THE INVENTION

The noise of a field effect transistor (in particular MOSFET, "metal oxide semiconductor field effect transistor") limits the accuracy of an electrical circuit. This is problematic particularly when a signal having a small amplitude occurs in such a circuit. Therefore, the performance of an analog circuit, in particular, is limited by the phenomenon of noise.

The low-frequency noise of a MOS transistor is caused by statistical loading or unloading of defect states in particular at the interface between the channel region and the gate insulating region of the field effect transistor. At low frequencies, this mechanism supplies the dominant contribution to the noise. On account of their localization the defects are also often referred to as interface states. Predominantly those defects whose energy level lies close to the (quasi) Fermi level of the charge carriers contributing to the current flow contribute to the low-frequency noise. Other interface states whose energy level is significantly higher or lower are either completely occupied or completely unoccupied and thus do not contribute to the noise, cf. S. Christensson, I. Lundström, and C. Svensson, "Low frequency noise in MOS transistors—I theory," Solid-St. El. 11, pp. 791-812, 1968.

R. Brederlow, W. Weber, R. Jurk, C. Dahl, S. Kessel, J. Holz, W. Sauert, P. Klein, B. Lemaitre, D. Schmitt-Landsiedel, and R. Thewes, "Influence of fluorinated gate oxides on the low frequency noise of MOS transistors under analog operation," in Proceedings of the 28th European Solid-State Device Research Conference, pp. 472-5, 1998, discloses suppressing low-frequency noise by means of optimizing the fabrication process for the field effect transistors. This exploits the fact that the magnitude of the low-frequency noise critically depends on the quality of the interface between channel region and gate insulating layer. However, narrow limits are imposed on the technological optimization possibilities.

A further method for reducing the low-frequency noise is based on setting the operating point of the field effect transistors such that the low-frequency noise is minimized. By way of example, it is known that choosing the operating point within the framework of those operating points which are suitable for analog circuit technology permits a reduced noise power to be achieved, cf. S. Christensson, et al. If Vg designates the gate voltage, Vt designates the threshold voltage and Vd designates the drain voltage of a field effect transistor, then Vg−Vt=100 mV to 1V and Vd>Vg−Vt is a suitable choice. What is disadvantageous about this method, however, is the restriction of the degrees of freedom in the circuit design from other standpoints, such as e.g. power consumption, modulation range, bandwidth. Furthermore, the noise reduction that can be achieved by means of this method is small.

Since low-frequency noise voltages or noise currents in a MOSFET are inversely proportional to the root of the active area thereof, cf. S. Christensson et al., there is the possibility of reducing the low-frequency noise of a circuit by choosing the component areas to be sufficiently large. One disadvantage of this method is the increased area taken up. Moreover, an increased power consumption may result, particularly if the bandwidth of the circuit cannot be reduced, since then only the widths, but not the lengths of the transistors are permitted to be increased. The current consumption of the circuit or of the paths in which the relevant transistors are operated rises approximately proportionally to the width of the relevant transistors. Furthermore, all the capacitive loads that occur in a predetermined circuit rise, in particular the input capacitance of sensitive amplifier circuits.

DE 10001124 C1, S. L. J. Gierkink, E. A. M. Klumperink, E. Van Tuijl, and B. Nauta, "Reducing MOSFET 1/f noise and power consumption by 'switched biasing'," in Proceedings of the 28th European Solid-State Circuits Conference, pp. 154-7, 1999, E. Simoen, P. Vasina, J. Sikula, and C. Claeys, "Empirical model for the low-frequency noise of hot-carrier degraded submicron LDD MOSFETs," IEEE El. Dev. Lett. 18, pp. 480-2, 1997, and I. Bloom, and Y. Nemirowsky, "1/f noise reduction of metal-oxide-semiconductor transistor by cycling from inversion to accumulation," Appl. Phys. Lett. 58, pp. 1664-6, 1991, disclose that the low-frequency noise of a transistor can be reduced if the quasi Fermi level at the interface is periodically altered.

DE 10001124 C1, S. L. J. Gierkink, E. A. M. Klumperink, E. Van Tuijl, and B. Nauta, "Reducing MOSFET 1/f noise and power consumption by 'switched biasing'," in Proceedings of the 28th European Solid-State Circuits Conference, pp. 154-7, 1999, and Klumpernik et al. "Reducing MOSFET 1/f Noise and Power Consumption by Switched Biasing" IEEE Journal of Solid-State Circuits Vol. 35, No. 7, pages 994 to 1001, 2000, describe circuitry methods for reducing the low-frequency noise of MOSFETs. The method described in S. L. J. Gierkink, E. A. M. Klumperink, E. Van Tuijl, and B. Nauta, "Reducing MOSFET 1/f noise and power consumption by 'switched biasing'," in Proceedings of the 28th European Solid-State Circuits Conference, pp. 154-7, 1999, and Klumpemik et al. "Reducing MOSFET 1/f Noise and Power Consumption by Switched Biasing" IEEE Journal of Solid-State Circuits Vol. 35, No. 7, pages 994 to 1001, 2000, is restricted, however, to circuits in which the transistors are periodically switched on and off. This is not desirable, however, particularly in many analog circuits since continuous signals are intended to be processed.

A description is given below of the floating body effect and the self-heating effect, which can occur in partially depleted (PD) and in fully depleted (FD) SOI transistors ("silicon on insulator") in CMOS technology. These effects have an influence on the circuit design in particular of analog circuits.

With regard to the future development of semiconductor technology, alterations are to be expected away from conventional bulk CMOS processes toward SOI processes, and moreover toward double or triple gate transistor architectures. This expectation is evident e.g. from the International Technology Roadmap for Semiconductors, ITRS 2001.

Despite the advantages of SOI CMOS transistor technology compared with bulk CMOS transistor technology (for example the reduction of parasitic capacitances, the possibility of diffusion resistances and capacitances, the better device insulation, whereby latch-up effects and substrate coupling effects are reduced, etc.), integrated SOI circuits using analog circuit technology have been investigated only little heretofore, see Tihanyi et al. "Properties of ESFI MOS transistors due to the floating substrate and the finite volume", IEEE Trans. Electron Devices, Vol. ED-22, p. 1017, 1975.

One problem of SOI field effect transistors is the floating body effect inherent to them, which leads to a kink effect in the case of the drain current. MOS transistors which are processed on SOI films, so that the channel region is partially depleted of charge carriers, or for example a double gate transistor on an SOI film, a vertical transistor on an SOI film (FinFET), etc., are exposed to the floating body effect, see Tihanyi et al. "Properties of ESFI MOS transistors due to the floating substrate and the finite volume", IEEE Trans. Electron Devices, Vol. ED-22, p. 1017, 1975, and Chan et al. "Comparative Study of Fully Depleted and Body-Grounded Non Fully Depleted SOI MOSFETs for High performance analog and Mixed Signal Circuits", IEEE Trans. On Electron Devices, Vol. ED-42, No. 11, p. 1975, 1995.

The kink effect is brought about by the injection of holes or electrons into the floating substrate of an n-MOS transistor or of a p-MOS transistor on an SOI film. For an n-MOSFET in SOI technology, said holes are generated by means of impact ionization (clearly ionization through charge carrier introduction) into a region with a high electric field near the drain. Once they have been generated, the holes migrate into the region in which the electrical potential is lowest, that is to say in the direction of the floating substrate. Accumulation of holes increases the floating substrate potential until the substrate-source junction is sufficiently biased, for compensating for the current generated by hole generation. The accumulated charge in the body depends on the previous state of the transistor (that is to say its history), on process parameters, device dimension, supply voltage, temperature, slew rate and switching frequency.

The increase in the substrate potential leads to a reduction of the threshold voltage and results in a kink in the output characteristic curve or characteristic, as a result of which the gain of analog amplifiers and the constancy of current sources are impaired.

Another particular feature of SOI technology compared with bulk MOSFET technology is that the self-heating of individual devices is not negligible. This results from the poor thermal conductivity of the buried silicon oxide layer arranged beneath a silicon layer of an SOI substrate, so that the channel temperature of the SOI device may rise by tens of ° C. above the temperature at normal operation. The insulating substrate forms a thermal barrier, so that the heat generated by the operated device cannot simply be transferred to the substrate. The thermal conductivity of silicon oxide ($SiO_2$) is a few orders of magnitude worse than that of bulk silicon. Therefore, in contrast to a bulk MOS transistor, significant self-heating can occur in the case of a MOS transistor on an SOI film. This self-heating occurs in any type of transistor structure which has a poor thermal coupling between the channel region and heat sinks, such as the bulk silicon or even the housing (e.g. all SOI or double or triple gate concepts).

If the device heats up, the mobility of charge carriers decreases in the channel region, which in turn reduces the drain current. Consequently, the device characteristic is significantly modified, with negative output conductivity, as can often be observed at high drain currents.

Thermal effects are in most cases not significant for digital circuits, on account of the low average energy dissipation, and by virtue of the fact that clock frequencies normally lie sufficiently far above thermal time constants. However, analog circuits can be significantly influenced by self-heating effects. The output conductivity can be low or even negative at low frequencies and can then rise with the frequency, which leads to unforeseen gain and phase variations. Interacting devices that adjoin one another may be at different temperatures, which may lead to a thermally induced mismatch. The temperature gradients which result from the self-heating effect and the thermal coupling effect lead to non-isothermal conditions and therefore to malfunctions, see Tenbroek et al. "Impact of Self-Heating and Thermal Coupling on Analog Circuits in SOI CMOS", IEEE Journal of Solid-State Circuits, Vol. 33, No. 7, p. 1037, 1998. Possibilities for alleviating floating body effects of a MOS transistor on an SOI film are known, see US 2003/0128776 A1. Among these possibilities, the body contact method appears to be the only circuit-oriented possibility. All the other concepts are related to device engineering. The body potential in a partially depleted SOI transistor is kept constant by the body contact, although the problem occurs as to how the system configuration can be optimized given simultaneous minimization of the effect of stray resistance and stray capacitance between the body contact path and the active region. Furthermore, it is known that the effectiveness of hole absorption falls rapidly if the channel width is increased. In particular, the physical definition of the contact to the FinFET or to the planar double gate transistor requires tricky lithography.

Fully depleted (FD) SOI devices in which an ultra thin silicon body of an SOI substrate having a thickness of 10 nm to 30 nm is used are naturally a good choice for analog/mixed signal applications, since they suppress the kink effect, see Colinge "Silicon-on-Insulator Technology: Material to VLSI", Norwel, MA: Kluwer, p. 139-141, 1991. However, even fully depleted device structures cannot prevent self-heating effects, and it is necessary to take account of the small process margin of FD devices with regard to the threshold voltage control, and also a loss of area. Furthermore, the high inherent body resistance and the high inherent body capacitance which are introduced by the body contact are problematic, and the floating body effects are far more serious in an analog design.

Even advanced double and triple gate concepts suffer from self-heating and, depending on how they are constructed, they may also be exposed to charge accumulation effects such as the kink effect in partially depleted SOI substrates.

DE 44 35 305 A1 describes a signal integrator operated with a double sampling speed, an element comprising four CMOS transmission gates being described as the switch element, which realizes a so-called single hole double throw (SPDT) switch. DE 44 35 305 A1 does not contain any statement about the operating frequency of the switch.

US 2003/0128776 A1 describes methods and circuit arrangements for reducing a DC offset in a communication system.

DE 100 01 124 C1 discloses a circuit arrangement and a method for reducing the 1/f noise of a MOSFET, a periodically oscillating source being assigned to a DC voltage source, so that the operating point oscillates about the constant operating point prescribed by the DC voltage source in such a way that defect states in the oxide of the MOSFET which are subjected to charge reversal and of the condition of a constant operating point according to the laws of statistics, such that they determine the 1/f noise signal, are no longer subjected to charge reversal statistically, but rather with lower probability on account of the modulation frequency of the periodically oscillating voltage source.

Gierkink, S et al. "Intrinsic 1/f Device Noise Reduction and Its Effect on Phase Noise in CMOS Ring Oscillators" IEEE Journal of Solid-State Circuits, Vol. 34, No. 7, pages 1022 to 1025, 1999, describes a circuit arrangement for reducing the 1/f noise in a CMOS ring oscillator.

SUMMARY OF THE INVENTION

A noise-reducing transistor arrangement, including a first and a second field effect transistor, each of which has a source terminal, a drain terminal, and a control terminal for application of a first signal or a second signal, wherein the source terminal of the first field effect transistor and the source terminal of the second field effect transistor are coupled to one another, and wherein the drain terminal of the first field effect transistor and the drain terminal of the second field effect transistor are coupled to one another. The arrangement also includes a clock generator unit, which is coupled to the field effect transistors such that the clock generator unit provides the first signal and the second signal alternately to the field effect transistors with an alternating frequency which is at least as great as the cut-off frequency of the noise characteristic of the field effect transistors, or with a reciprocal alternating frequency which is less than a mean lifetime of an occupation state of a defect in the boundary region between channel region and gate insulating layer of the field effect transistors. The clock generator unit applies the first signal to the control terminal of the first field effect transistor and, simultaneously, the second signal to the control terminal of the second field effect transistor, and applies the second signal to the control terminal of the first field effect transistor and, simultaneously, the first signal to the control terminal of the second field effect transistor.

BRIEF DESCRIPTION OF THE DRAWINGS

Exemplary embodiments of the invention are illustrated in the figures and are explained in more detail below.

In the figures:

FIG. 3 shows a cross-sectional view of an integrated CMOS circuit according to the invention with an n-MOS transistor and a p-MOS transistor, FIG. 4A shows a conventional p-MOS transistor and FIG. 4B shows a transistor arrangement that replaces the latter in accordance with a third exemplary embodiment of the invention, FIGS. 7 to 11 show differential stages as integrated circuits in accordance with first to fifth exemplary embodiments of the invention, FIG. 31A shows a conventional n-MOS SOI transistor and FIG. 31B shows an n-MOS SOI transistor arrangement that replaces the latter in accordance with a fourth exemplary embodiment of the invention, FIG. 32A shows a conventional p-MOS SOI transistor and FIG. 32B shows a p-MOS SOI transistor arrangement that replaces the latter in accordance with a fifth exemplary embodiment of the invention.

Identical or similar components in different figures are provided with identical reference numerals.

DETAILED DESCRIPTION OF THE INVENTION

Figure 1A:
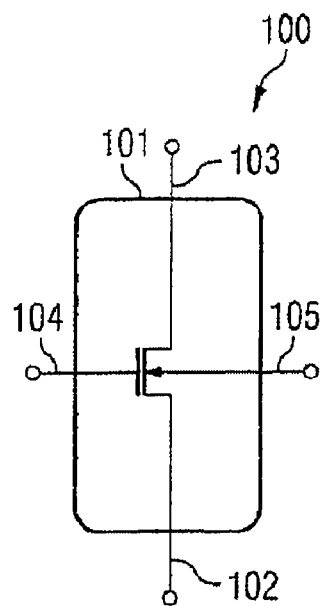
FIG. 1A shows a conventional n-MOS transistor and FIG. 1B shows a transistor arrangement that replaces the latter in accordance with a first exemplary embodiment of the invention.

The invention is based on the problem of effectively reducing the low-frequency noise of transistors with little outlay.

The problem is solved by means of a noise-reducing transistor arrangement, by means of an integrated circuit, and by means of a method for reducing the noise of field effect transistors.

The noise-reducing transistor arrangement according to the invention has a first and a second field effect transistor, each of which has a first source/drain terminal (source terminal) and a second source/drain terminal (drain terminal) and a control terminal for application of a first and a second signal. The first source/drain terminals of the first and second field effect transistors are coupled to one another. The second source/drain terminals of the first and second field effect transistors are coupled to one another. The transistor arrangement is set up in such a way that alternately the first signal can be applied to the control terminal of the first field effect transistor and, simultaneously, the second signal can be applied to the control terminal of the second field effect transistor, and the second signal can be applied to the control terminal of the first field effect transistor and, simultaneously, the first signal can be applied to the control terminal of the second field effect transistor.

The integrated circuit according to the invention contains at least one transistor arrangement having the abovementioned features.

In accordance with the method according to the invention for reducing the noise of field effect transistors, a first and a second field effect transistor are connected up, each of the field effect transistors having a first and a second source/drain terminal and having a control terminal for application of a first or a second signal. The first source/drain terminals of the first and second field effect transistors are coupled to one another, and the second source/drain terminals of the first and second field effect transistors are coupled to one another. The transistor arrangement is set up in such a way that alternately the first signal is applied to the control terminal of the first field effect transistor and, simultaneously, the second signal is applied to the control terminal of the second field effect transistor, and the second signal is applied to the control terminal of the first field effect transistor and, simultaneously, the first signal is applied to the control terminal of the second field effect transistor.

In other words, signals are alternately applied to the control terminals, for example gate terminals or substrate terminals, of the two field effect transistors. In a first time interval, by way of example, the first signal, e.g. an electrical ground potential, may be applied to the control terminal of the first field effect transistor and, simultaneously, the second signal, e.g. a useful signal, may be applied to the control terminal of the second field effect transistor. In a second time interval, by way of example, the second signal may be applied to the control terminal of the first field effect transistor and, simultaneously, the first signal may be applied to the control terminal of the first field effect transistor. A changeover is made between these two operating states with a predeterminable frequency.

Clearly, according to the invention, physical properties of interface states are advantageously used and combined with a simple and efficient circuit architecture, whereby the noise, in particular the low-frequency noise of the circuit or the contributions of the transistors contained therein is significantly reduced.

One basic idea of the invention consists in the fact that a transistor of a circuit is replaced by two preferably structurally identical replacement transistors. The first source/drain terminals of the first and second transistors are coupled to one another and the second source/drain terminals of the two transistors are coupled to one another. The control terminals of the transistors are in each case switched back and forth alternately between two circuit nodes with different electrical potentials. What is clearly achieved in this way is that one of the two transistors in each case assumes an operating point in depletion or accumulation, and the other transistor assumes an operating point in inversion. It should be noted that the (quasi) Fermi levels in inversion, on the one hand, and in depletion or accumulation, on the other hand, are sufficiently far apart from one another.

As is explained below, this interconnection leads to a reduction of the low-frequency noise. An interface state whose energy level is close to the quasi Fermi level in inversion and in depletion or accumulation endeavors to statically change its occupation state at said quasi Fermi level. This phenomenon brings about the low-frequency noise of a transistor since, as a result, a charge carrier is in each case taken from the channel current or a charge carrier is fed to the channel current. Furthermore, the electrical charge that is or is not present in the interface state modulates the channel current.

The low-frequency noise of the transistor can be reduced if first and second signals are applied alternately to the control terminals of the two field effect transistors, so that a resulting signal which is altered temporally with an alternating frequency is applied to a respective control terminal. The interconnection according to the invention therefore makes it possible to switch the quasi Fermi level back and forth in the channel region with the alternating frequency between the values in inversion and in depletion or accumulation. The low-frequency noise can be reduced very effectively in particular if the energy difference between the quasi Fermi levels in inversion, on the one hand, and in depletion or accumulation, on the other hand, is large relative to the thermal noise energy kBT or if the reciprocal of the frequency of this change is chosen to be sufficiently small in relation to the time constants of the relevant interface states.

The control terminal may be a gate terminal or a substrate terminal (e.g. bulk terminal). In the case of an SOI transistor ("silicon-on-insulator"), by way of example, the dictates of the technology mean that a substrate terminal may not be present, so that the field effect transistor is controlled by means of the gate terminal in this case. In another case, a transistor may have both a gate terminal and a substrate terminal, so that control can then optionally be effected by means of the gate terminal or by means of the substrate terminal.

For the case where the control terminal of the first and of the second field effect transistor is a gate terminal, the first and the second field effect transistor may have a substrate terminal as additional control terminal. For the case where the control terminal of the first and of the second field effect transistor is a substrate terminal, the first and the second field effect transistor may have a gate terminal as additional control terminal. The additional control terminals of the first and of the second field effect transistor are preferably coupled to one another. In other words, when a gate terminal and a substrate terminal are present, the alternate application of the first and second signals may optionally be effected at the two gate terminals or at the two substrate terminals. The respective two control terminals or additional control terminals to which the first and second signals are alternately not applied may then be coupled to one another.

One of the first and second signals may be a useful signal and the respective other signal may be a reference potential. By way of example, the first signal may be an analog useful signal to be processed and the second signal may be a ground or supply voltage potential, or vice versa.

The first and the second field effect transistor are preferably structurally identical. In other words, the two field effect transistors may have the same geometrical dimensions, be produced from the same materials, etc. This leads to a particularly symmetrical arrangement and consequently to a particularly effective reduction of the noise.

Furthermore, the first and the second signal may alternate at the control terminals of the first and second field effect transistors with an alternating frequency which is at least as great as the cut-off frequency of the noise characteristic of the field effect transistors. The noise power characteristic of a semiconductor component, in particular of a field effect transistor, depending on a frequency is a function with a characteristic kink at the so-called cut-off frequency. The low-frequency noise (LF noise) is effectively suppressed particularly at frequencies which are higher (preferably at least a factor of two higher) than the kink or cut-off frequency.

Preferably, the first and the second signal alternate at the control terminals of the first and second field effect transistors with an alternating frequency which is greater than the frequencies of a useful frequency band of an assigned circuit. Clearly, this is intended to effectively decouple a useful frequency band from a clock frequency band (a clock signal serving for the alternate application of the first and second signals to the control terminals of the first and second field effect transistors). Many integrated circuits are operated at a characteristic frequency, the so-called useful frequency, or the so-called useful frequency band.

The first and the second signal at the control terminals of the first and second field effect transistors may alternate with a reciprocal alternating frequency which is less, more preferably significantly less, than a mean lifetime of an occupation state of a defect in the boundary region between channel region and gate insulating layer of the field effect transistor.

Preferably, at least one of the substrate terminals is set up as a well terminal of one of the two field effect transistors, which is formed in a well.

When a p-doped substrate, for example, is used in which a field effect transistor is formed, a MOSFET of the n conduction type may be formed directly in the p-doped substrate. In order to form a MOSFET of the p conduction type in the p-doped substrate, it is necessary to dope the associated surface region of the substrate (the so-called well region) with doping atoms of the n conduction type and thus to form an n-conductive well. In the configuration of the transistor arrangement according to the invention in which the gate terminals of the first and of the second field effect transistor are coupled to one another, the first and the second signal can be applied alternately to the well terminals of the first and second field effect transistors.

Preferably, both field effect transistors have the same conduction type. In other words, both field effect transistors are either of the n conduction type, in particular n-MOSFETs, or of the p conduction type, in particular p-MOSFETs.

In accordance with one exemplary embodiment, the transistor arrangement may be set up in such a way that a respective one of the two field effect transistors is operated at an inversion operating point and the respective other of the two field effect transistors is operated at an accumulation or depletion operating point.

An explanation is given below, for the example of a p-doped substrate, as to the manner by which the operating points of accumulation, depletion and inversion differ. In the case of electrical voltages having a negative sign between the gate region and the semiconductor material, free charge carriers (holes) are attracted from the p-doped material of the substrate by the negatively charged electrode, so that a layer of positive electrical charge is formed below the gate insulating region. A corresponding opposite charge forms at the gate region. The state established is called accumulation.

In the case of a positive voltage at the gate terminal, the electrically positively charged holes migrate away from the positive region. In the depleted region, only the negatively ionized doping atoms remain, and a space charge zone is formed. This state is referred to as depletion.

If the voltage at the gate terminal is increased further proceeding from the scenario described last, the positive holes migrate into the substrate and the negative electrons are attracted by the positive electrode. In the channel region, they form a conducting inversion layer. The operating point established is referred to as inversion.

In the case of the transistor arrangement according to the invention, the control terminal of the first field effect transistor may be coupled to a first switching element, which can be switched by means of a first clock signal with an alternating frequency. Furthermore, the control terminal of the second field effect transistor may be coupled to a second switching element, which can be switched by means of a second clock signal, which is complementary to the first clock signal, with the alternating frequency. By means of the respective switching element, the first or the second signal is alternately applied to the respective control terminal of the respective field effect transistor with the alternating frequency. Clearly, a switching element that can be switched using a clock signal can be used to apply the first or the second signal alternately to the control terminal of a respective field effect transistor.

The first and second switching elements may be first and second switching transistors, to the respective gate terminal of which the respective clock signal can be applied, and a respective source/drain terminal of a respective switching transistor being coupled to the control terminal of the respective field effect transistor.

The transistor arrangement of the invention may be formed on and/or in a silicon on insulator substrate (SOI substrate).

In particular, in accordance with this refinement, the first field effect transistor and the second field effect transistor may be realized as SOI field effect transistors.

The invention's driving of the first and of the second field effect transistor with alternate first and second signals opens up important advantages in particular for SOI applications. Apart from the reduction of the noise, in particular of the low-frequency noise, the advantageous effect that the floating body effect and self-heating effects are reduced additionally occurs in the case of SOI transistor arrangements of the invention. This is a significant improvement in particular for analog circuit technology using SOI CMOS technology.

This aspect of the invention utilizes characteristics of an SOI transistor under periodic switching conditions, see Jenkins, K. A. "Characteristics of SOI FETs Under Pulsed Conditions", IEEE Transactions on Electron Devices, Vol. 44, No. 11, 1997, and Perron, L. M. "Switch-Off Behaviour of Floating-Body PD SOI-MOSFETs", IEEE Transactions on Electron Devices, Vol. 45, No. 11, 1998. If the switching frequency is increased, the charging or discharging current of the floating body in an SOI transistor, reflecting the intrinsic capacitive coupling in the device, limits the hole accumulation, driven by impact ionization. According to the invention this leads to a suppression of the body-source bias voltage and of the kink effect. This periodic switching operation of the SOI transistor enables a good linearity in the output characteristic (e.g. output conductivity). In addition, this operation permits the SOI transistor to be exposed less to the self-heating effect, see Tenbroek et al. "Impact of Self-Heating and Thermal Coupling on Analog Circuits in SOI CMOS", IEEE Journal of Solid-State Circuits, Vol. 33, No. 7, p. 1037, 1998.

However, this switching operation of the transistor is not always possible in analog/radiofrequency circuits. Only some analog circuits such as voltage controlled oscillators (VCO) or switched-capacitor circuits permit these switching conditions to be applied to them, a bias current only being required during specific time intervals or signal processing not taking place continuously.

The invention for the first time implements the realization of this switching condition in an analog circuit operated in a temporally continuous fashion.

The advantages of the transistor arrangement according to the invention become apparent to a particularly high degree when the first and the second field effect transistor are realized on and/or in a silicon-on-insulator substrate since, apart from the reduction of the noise, the floating body effect and the self-heating effect are reduced in the case of SOI substrates on account of the clocked operation of the two field effect transistors. The self-heating effect is reduced in particular because each of the two transistors is operated only for half of a clock cycle and has time to relax in the respective other half of the clock cycle, as a result of which thermal energy can be dissipated from the transistor and the transistor can be brought back to its normal operating temperature.

The transistor arrangement of the invention may be realized using analog circuit technology. In analog circuit technology, the floating body effect and self-heating occur to a particularly great extent in the case of an SOI circuit arrangement, so that reducing the floating body effect and the self-heating effect is particularly important in an analog circuit.

In accordance with another refinement of the transistor arrangement in the realization in and/or on an SOI substrate, at least one additional field effect transistor is provided. Each of the at least one additional field effect transistor has a first and a second source/drain terminal and has a control terminal, to which the first or the second signal can be applied. The first source/drain terminals of the first and second field effect transistors are coupled to the first source/drain terminals of each of the at least one additional field effect transistor. The second source/drain terminals of the first and second field effect transistors are coupled to the second source/drain terminals of each of the at least one additional field effect transistor. The transistor arrangement is set up in such a way that, in a first operating state, the first signal is applied to the control terminal of the first field effect transistor or of the second field effect transistor or of precisely one of the at least one additional field effect transistor and, simultaneously, the second signal is applied to the control terminals of all of the other field effect transistors. In subsequent operating states the first signal is applied progressively to the control terminal of in each case one of the remaining field effect transistors and, simultaneously, the second signal is applied to the control terminals of all of the other field effect transistors.

In other words, in accordance with this refinement compared with the prior art, an individual transistor is replaced not only by two transistors but by three, four or more transistors. The first and second signals are then switched back and forth in a temporally variable manner between these transistors in such a way that, in the case of a respective one of the transistors, the first signal is applied to its control terminal, and the second signal is applied in the case of all the other transistors. Consequently, it is progressively possible for a respective one of the transistors to be operated as an active transistor, in which case, during the activity of this transistor, all of the other transistors are inactive and can relax. To put it another way, at a specific point in time there is always precisely one of the end transistors active, whereas n−1 transistors are inactive. As a result, self-heating effects can be reduced even more effectively since, clearly, a respective field effect transistor is active only for 1/n-th of the time and is inactive during (n−1)/n-th of the time. The configuration described is particularly advantageous for SOI field effect transistors or for circuits appertaining to analog circuit technology.

The transistor arrangement may have a clock generator unit which is coupled to the field effect transistors in such a way that it provides the signals to the field effect transistors alternately by means of clock signals that are shifted relative to one another.

In particular, such a clock generator unit may be provided in the transistor arrangement having more than two field effect transistors, the clock generator unit being coupled to the field effect transistors in such a way that it switches the field effect transistors between the first operating state and the subsequent operating states by means of providing clock signals that are shifted relative to one another.

In accordance with this refinement, the switching between different operating states is carried out with the aid of switching elements which can be controlled by means of a respective clock signal. The clock signals are shifted relative to one another in such a way that a clock signal with a logic value "1" is provided to a respective one of the field effect transistors at a specific point in time, whereas a clock signal with a logic value "0" is provided to all the other field effect transistors.

This realization makes it possible to activate a respective one of the field effect transistors and to deactivate all the other field effect transistors with respect to a specific operating state.

In the case of the transistor arrangement, the clock generator unit may be set up in such a way that it prescribes the clock signals for reducing the heating of the field effect transistors formed on and/or in the silicon on insulator substrate and/or for reducing the floating body effect of the field effect transistors formed on and/or in the silicon on insulator substrate.

The transistor arrangement may be set up for reducing the two effects described by virtue of the fact that, in particular, the switching frequency (or the clock signal) with which the two field effect transistors are operated alternately are coordinated with a value such that the charging or discharging parameters reduce the floating body effect and/or that the quiescent times of a transistor between adjacent active operation times are long enough to ensure that the transistor cools down sufficiently. The clock frequency may be chosen e.g. such that the quiescent time of one field effect transistor, during which the other field effect transistor is actively operated, suffices for dissipating the thermal energy to the surroundings. The setting of the clock signal parameters also influences the floating body effect, which can therefore be greatly reduced by a favorable choice of the clock signal parameters.

The integrated circuit according to the invention is described in more detail below. Refinements of the transistor arrangement also hold true for the integrated circuit.

The integrated circuit may be set up for example as a differential stage circuit, current source circuit, current mirror circuit or operational amplifier circuit. However, any other type of circuit is also possible provided that at least one transistor is present therein.

The method according to the invention for reducing the noise of field effect transistors is described in more detail below. Refinements of the transistor arrangement also hold true for the method for reducing the noise of field effect transistors.

In the case of the method, a gate terminal or a substrate terminal may be used as the control terminal.

In accordance with the method, by means of the alternating application of the first and second signals, the quasi-Fermi energy in the boundary region between channel region and gate insulating layer of the field effect transistors is periodically altered by a value which is greater, preferably significantly greater and more preferably at least one order of magnitude greater, than the product of the Boltzmann constant and the absolute temperature.

Preferably, by means of the alternating application of the first and second signals, the quasi-Fermi energy in the boundary region between channel region and gate insulating layer of the field effect transistors is periodically altered by between approximately 100 meV and approximately 1 eV. More preferably, the quasi-Fermi energy is altered periodically by between approximately 150 meV and approximately 700 meV.

The arrangement of the field effect transistors may be formed on and/or in a silicon on insulator substrate.

In accordance with this refinement, the floating body and self-heating effects occurring in SOI circuits are effectively suppressed since, on account of the alternate operation of the first and second field effect transistors, no additional electrical energy is provided to the respectively inactive field effect transistor, so that it can emit its energy to the surroundings during an inactivity phase, which results in cooling. An undesirable heating of such a field effect transistor can thus be effectively avoided.

In accordance with the method, the first signal and the second signal may furthermore be applied alternately to the control terminals of the first field effect transistor and of the second field effect transistor in such a way that the heating of the field effect transistors formed on and/or in the silicon on insulator substrate is reduced and/or the floating body effect of the field effect transistors formed on and/or in the silicon on insulator substrate is reduced.

By means of adjusting the operating parameters for alternately applying first and second signals to the control terminals of the first and second field effect transistors, it is possible to achieve an optimization to the effect that heating effects are sufficiently reduced and the floating body effect is sufficiently reduced.

The basic principle of the invention is explained below referring to FIG. 1A and FIG. 1B.

FIG. 1A shows a conventional n-MOS transistor 100 integrated in a silicon substrate 101. The n-MOS transistor 100 has a first source/drain terminal 102, a second source/drain terminal 103, a gate terminal 104 and a substrate terminal 105 (bulk terminal).

When operated in a circuit, the n-MOS transistor 100 makes a contribution to the low-frequency noise of the circuit.

Figure 1B:
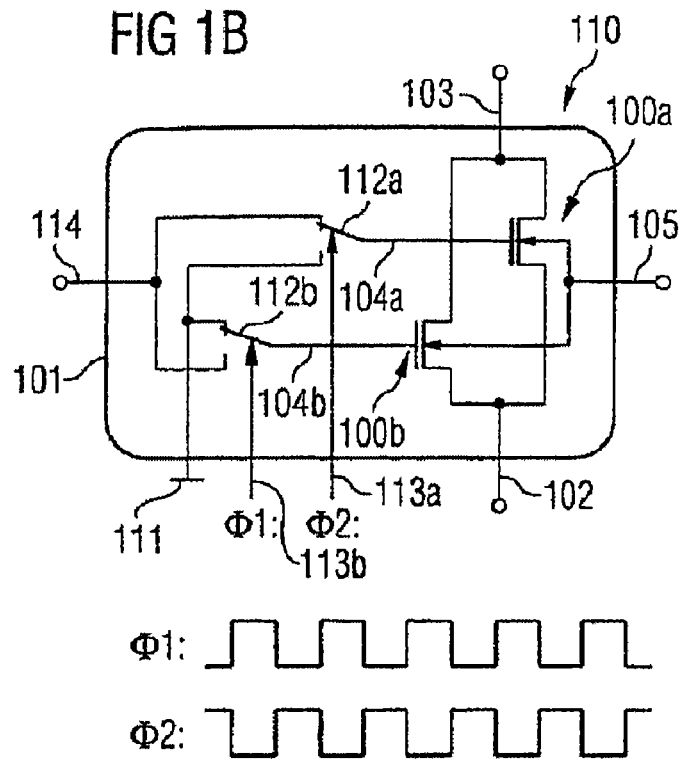

FIG. 1B shows a transistor arrangement 110 in accordance with a first exemplary embodiment of the invention, in which the n-MOS transistor 100 is replaced according to the invention, so that low-frequency noise is suppressed.

In the case of the transistor arrangement 110, the n-MOS transistor 100 is replaced by a first and a second n-MOS replacement transistor 100a, 100b, which are in each case structurally identical to the n-MOS transistor 100, in particular have the same geometrical dimensions as the n-MOS transistor 100. The first source/drain terminals 102 of the n-MOS replacement transistors 100a, 100b are coupled to one another, the second source/drain terminals 103 of the two n-MOS replacement transistors 100a, 100b are coupled to one another and the substrate terminals 105 of the n-MOS replacement transistors 100a, 100b are coupled to one another. As can furthermore be seen from FIG. 1B, the gate terminal 104 from FIG. 1A is replaced by a first replacement gate terminal 104a as gate terminal of the first n-MOS replacement transistor 100a and by a second replacement gate terminal 104b as gate terminal of the second n-MOS replacement transistor 100b. The first replacement gate terminal 104a of the first n-MOS replacement transistor 100a is coupled to a first switch element 112a, which is controlled by means of a first clock signal $\phi_2$ applied to a first clock signal input 113a. Furthermore, the second replacement gate terminal 104b of the second n-MOS replacement transistor 100b is coupled to a second switch element 112b, which is controlled by means of a second clock signal $\phi_1$. The switch elements 112a, 112b are driven with the clock signals $\phi_1$ and $\phi_2$ that are in antiphase (as shown in FIG. 1B). As a result, a respective one of the replacement gate terminals 104a, 104b is brought to ground potential 111 and the respective other replacement gate terminal 104b, 104a is brought to the potential applied to a gate circuit node 114. If the electrical potential of the gate circuit node 114 is applied to a replacement gate terminal 104a, 104b of one of the transistors 100a, 100b, then the corresponding transistor 100a or 100b is brought to a conductive state and assumes an operating point in inversion. If, on the other hand, the electrical ground potential 111 is applied to the replacement gate terminal 104a, 104b of one of the transistors 100a or 100b, then the corresponding transistor 100a, 100b turns off and assumes an operating point in depletion or accumulation. It should be noted that the exact position of the operating point depends on the source/drain potentials. In particular, the electrical signals at the terminals of the transistor arrangement 110 are chosen in such a way that the quasi Fermi levels, which are designated hereinafter by $E_{inv}$ (for inversion) and $E_{depl/acc}$ (for depletion or accumulation), are sufficiently far apart from one another in energetic terms.

As is explained below, the low-frequency noise is reduced in the case of the transistor arrangement 110. An interface state whose energy level is close to $E_{inv}$ or $E_{depl/acc}$ endeavors to change its occupation state at said quasi Fermi level according to the random principle. This phenomenon leads to the low-frequency noise of the transistor since a charge carrier is taken from or fed to the channel current. The charge that is or is not present in the interface state furthermore modulates the channel current. The low-frequency noise of the transistor is reduced if the quasi Fermi level is periodically altered at the interface between channel region and gate insulating layer, in which case the energy difference should be large relative to kBT. Furthermore, the reciprocal of the frequency of this change, that is to say of the signals $\phi_1$ and $\phi_2$, is chosen to be shorter than the time constants of the relevant interface states which cause the low-frequency noise.

A transistor arrangement 200 in accordance with a second exemplary embodiment of the invention is described below referring to FIG. 2A, FIG. 2B.

Figure 2A:
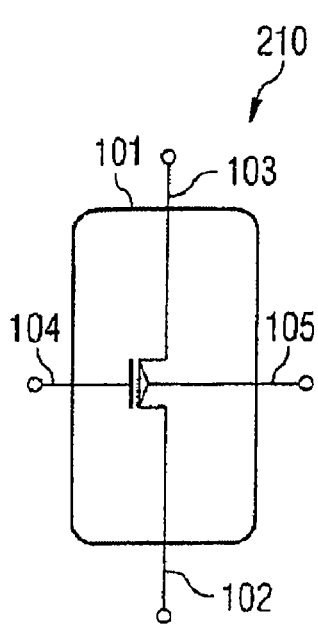
FIG. 2A shows a conventional p-MOS transistor and FIG. 2B shows a transistor arrangement that replaces the latter in accordance with a second exemplary embodiment of the invention.

FIG. 2A shows a conventional p-MOS transistor 210, which is connected up in an analogous manner to the n-MOS transistor 100.

Figure 2B:
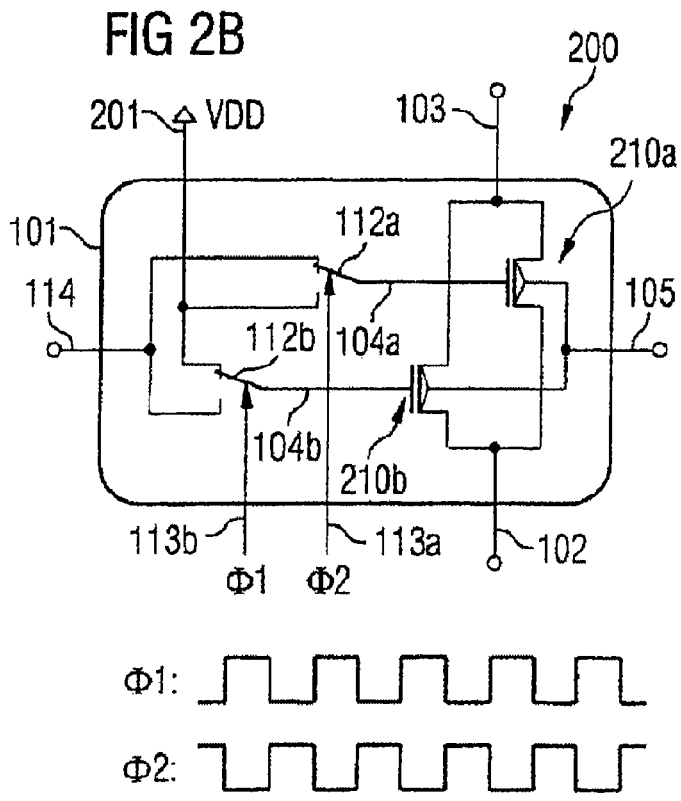

FIG. 2B shows a transistor arrangement 200 in accordance with a second exemplary embodiment of the invention, in which the p-MOS transistor 210 is replaced according to the invention by a first p-MOS replacement transistor 210a and by a second p-MOS replacement transistor 210b.

In a departure from the configuration of FIG. 1B, now the gate potentials of the p-MOS replacement transistors 210a, 210b are switched between the potential of the gate circuit node 114 and a supply potential VDD 201. In accordance with this configuration, the p-MOS replacement transistors 210a, 210b turn off if the supply potential VDD 201 is present at their respective gate terminal 104a, 104b.

A description is given below, referring to FIG. 3, FIG. 4A, FIG. 4B, of a further variant as to how, according to the invention, the low-frequency noise is reduced by means of a sufficiently rapid change of the quasi Fermi levels of the transistors used. In accordance with this variant, the operating point can be set by means of driving the relevant transistor or transistors via well terminals. Consequently, the alternative described can be applied for transistors which are realized in a dedicated well.

Firstly, an explanation is given below, referring to the integrated circuit 300 from FIG. 3 of what is understood by a bulk terminal or a well terminal (examples of the substrate terminal).

The n-MOS transistor 100 is integrated in a first surface region of a p-doped silicon substrate 301. Said n-MOS transistor contains one n-doped surface region as first source/drain region 302, another n-doped surface region as second source/drain region 303 and a p-doped substrate region 304. A gate insulating layer 305 made of silicon oxide is applied on a surface region of the p-doped substrate 301 between the source/drain regions 302, 303, a metallically conductive gate region 306 (e.g. made of highly doped polysilicon, made of aluminum or made of tungsten) being formed on said gate insulating layer. The gate region 306 is coupled to the gate terminal 104, the first source/drain region 302 is coupled to the first source/drain terminal 102, the second source/drain region 303 is coupled to the second source/drain terminal 103 and the p-doped substrate region 304 is coupled to a bulk terminal 307.

Furthermore, the p-MOS transistor 210 is integrated in the p-doped silicon substrate 301. In order to form said p-MOS transistor in the p-doped silicon substrate 301, an n-doped well region 308 is previously formed in a surface region of the p-doped silicon substrate 301. First and second source/drain regions 309, 310 are formed as p-doped regions in the n-doped well region. A gate insulating layer 311 is formed between the source/drain regions 309, 310, a gate region 312 being formed on said gate insulating layer. A further n-doped substrate region 313 in the n-doped well region 308 is coupled to a well terminal 314. Furthermore, the first source/drain region 309 is coupled to the first source/drain terminal 102, the second source/drain region 310 is coupled to the second source/drain terminal 103 and the gate region 312 is coupled to the gate terminal 104.

As shown schematically in FIG. 3, the use of a p-doped substrate 301 is the general case in many CMOS processes, so that firstly an n-doped well region 308 is to be formed in order to form p-MOS transistors 210 in the p-doped substrate 301. By contrast, n-MOS transistors 100 can be formed directly in a p-doped substrate 301.

It should be noted that the following embodiments referring to FIG. 4A, FIG. 4B, in which the operating point is changed over between inversion and depletion or accumulation by means of a well terminal 314, are shown and explained in each case for p-MOS transistors. However, this interconnection is also possible for n-MOS transistors. This is because, on the one hand, processes on the basis of an n-doped substrate exist in which a p-MOS transistor can be formed directly in a substrate, whereas an n-MOS transistor is then fabricated in a p-doped well. In the case of such processes, the principle of changing over the operating point between inversion and depletion or accumulation by means of a well terminal is possible for n-MOS transistors. On the other hand, modem CMOS processes permit the fabrication of n- and p-MOS transistors in a dedicated well. If such processes are carried out for example on the basis of a p-doped substrate, then the p-MOSFET is situated there in an n-type well, whereas the n-MOSFET is situated in a p-type well, which is in turn situated in a superordinate n-type well. In this case, it is possible to change over the operating point between inversion and accumulation or depletion by means of the well terminal for n- and p-MOS transistors.

A transistor arrangement 400 in accordance with a third exemplary embodiment of the invention is described below referring to FIG. 4A, FIG. 4B.

FIG. 4A once again shows the conventional p-MOS transistor 210 shown in FIG. 2A.

In the case of the transistor arrangement 400 shown in FIG. 4B, the p-MOS transistor 210, in a manner similar to that in FIG. 2B, is replaced by a first and a second p-MOS replacement transistor 210a, 210b. In contrast to FIG. 2B, however, in accordance with FIG. 4B a common gate terminal 104 is provided for the two p-MOS replacement transistors 210a, 210b. By contrast, in the case of the transistor arrangement 400, the substrate terminals (that is to say the well terminals) of the two transistors 210a, 210b are provided separately from one another.

By means of a first replacement substrate terminal 105a, the substrate or well terminal of the first p-MOS replacement transistor 210a is coupled to a first switch element 112a. The first replacement substrate terminal 105a is switched back and forth between the supply voltage potential VDD 201 and a reference voltage V0 (which is negative relative to VDD in accordance with the exemplary embodiment described) by means of the switch element 112a, which is controlled by a first clock signal $\phi_2$. Furthermore, the potential of the well terminal of the second p-MOS replacement transistor 210a is switched back and forth between the supply potential 201 VDD and the reference voltage V0 by means of a second replacement substrate terminal 105b and a second switch element 112b coupled thereto. The second switch element 112b is controlled by means of a second clock signal $\phi_1$, which is in antiphase with respect to the first clock signal $\phi_2$.

According to the invention, the p-MOS transistor 210 in the circuit is replaced by the two p-MOS replacement transistors 210a and 210b, which are in each case structurally identical to the p-MOS transistor 210, in particular have the same geometrical dimensions as the p-MOS transistor 210. Once again the first source/drain terminals 102 of the p-MOS replacement transistors 210a, 210b, are coupled to one another, the second source/drain terminal 103 of the p-MOS replacement transistors 210a, 210b are coupled and the gate terminals of said transistors 210a, 210b are coupled to one another. The well terminals 105a, 105b of the p-MOS replacement transistors 210a, 210b are switched by means of the switch elements 112a, 112b in each case alternately between the supply potential 201 VDD as positive operating voltage and the reference voltage V0 as a negative voltage relative to VDD. The reference voltage V0 is not necessarily a constant voltage, but rather may also be derived from other potentials within the circuit, in particular for example from the potential at the second source/drain terminal 103 of the transistors 210a, 210b. Furthermore, instead of the supply potential VDD, it is also possible to use a voltage greater than VDD provided that such a voltage is available. Furthermore, instead of the supply potential 201 VDD, it is possible to use a regulated voltage, that is to say a voltage that is derived from other potentials within the circuit. Since it is generally favorable, however, for the difference between the two voltages for driving the wells to be kept as large as possible, it is often advantageous for practical reasons to choose the highest potential available in the given application for one of the two voltages, that is to say also not to regulate these voltages. For the reference voltage V0, the boundary condition should be complied with that the difference between the potential of a source/drain terminal and the potential V0 should be less than approximately 0.6 V to 0.7 V, so that an excessively large current does not flow through the diode (pn junction) formed between well and source/drain region. The value of 0.6 V to 0.7 V results from the threshold voltage of the diode formed by means of the pn junction. The potentials are to be applied in such a way that the diode formed between a source/drain region and the well region (or channel region) is essentially not forward-biased.

The switch elements 112a, 112b are driven by means of the clock signals $\phi_1$, $\phi_2$ that are complementary to one another. If the well node 105a of the transistor 210a or the well node 105b of the transistor 210b is coupled to the reference voltage V0, then the associated transistor is electrically conductive and assumes an operating point in inversion. If the well node 105a or 105b is coupled to the supply potential 201 VDD, then the associated transistor turns off and assumes an operating point in depletion or accumulation, the exact position of the operating point again depending on the potential at the source terminal 103.

The noise suppression mechanism is effected in a manner analogous to that described with reference to FIG. 1A to FIG. 2B. In order to attain an effective noise reduction, the reciprocal of the frequency of the signals $\phi_1$, $\phi_2$ is chosen to be shorter than the time constants of the interface states which cause the low-frequency noise. In other words, the frequency of the clock signals $\phi_1$, $\phi_2$ is chosen to be sufficiently high. Furthermore, the difference in the gate-source voltages between the two states should be large enough to significantly alter the quasi Fermi level in the transistor, in particular large with respect to $k_B T$.

Exemplary embodiments of the integrated circuit according to the invention are described below.

For this purpose, in each case a description is given firstly of a realization of a respective circuit (in particular differential stage, current source, current mirror and operational amplifier) in accordance with the prior art, and in each case subsequently of an example of a realization according to the invention in which low-frequency noise is suppressed by virtue of noise-critical transistors being replaced by a transistor arrangement according to the invention.

Figure 5A:
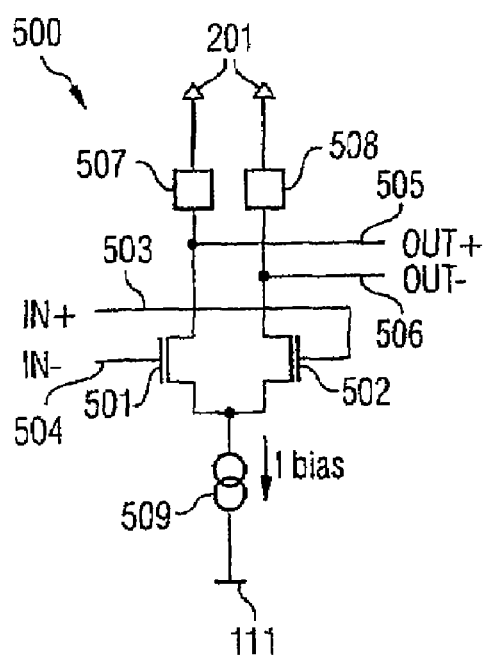
FIGS. 5A to 6B show differential stages in accordance with the prior art.

FIG. 5A shows a differential stage 500 having a first and a second n-MOS input transistor 501, 502 which is known from the prior art. The differential stage 500 contains differential first and second inputs 503, 504 IN+, IN− and differential first and second outputs 505, 506 OUT+, OUT−. Furthermore, further circuit elements in the form of abstracted first and second load elements 507, 508 and a current source 509 Ibias are provided.

Figure 5B:
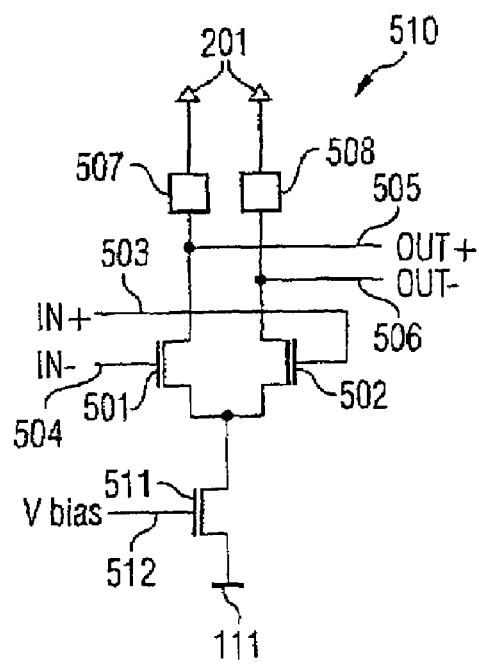

The differential stage 510 in accordance with the prior art as shown in FIG. 5B differs from the differential stage 500 by virtue of the fact that the current source 509 is embodied by means of an n-MOS current source transistor 511, to the gate terminal of which a bias voltage 512 Vbias is applied.

Figure 6A:
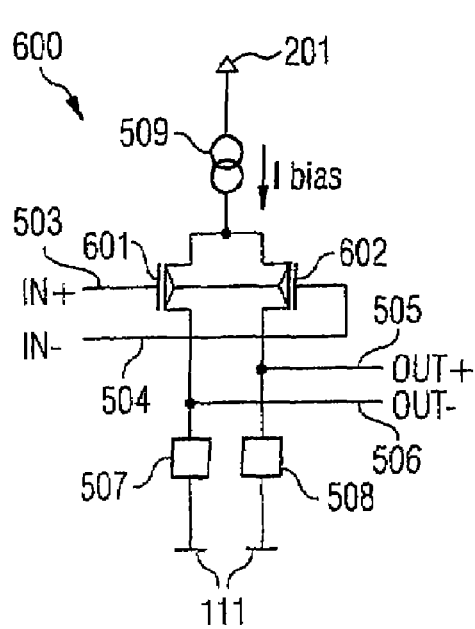

The differential stage 520 in accordance with the prior art as shown in FIG. 6A differs from the differential stage 500 essentially by virtue of the fact that first and second p-MOS input transistors 601, 602 are used as input transistors. Furthermore, in FIG. 6A, the well terminal of the p-MOS input transistors 521, 522 is coupled to a common source node of said transistors. Instead of the ground potential 111, the supply potential 201 is applied to a terminal of the current source 509 in FIG. 6A. The current source 509 may be realized using a p-MOS field effect transistor, to the gate terminal of which a bias voltage is applied, and the two source/drain terminals of which are connected between the supply potential 201, on the one hand, and the upper source/drain terminals of the transistors 601, 602 in accordance with FIG. 6A, on the other hand (in a manner similar to that in FIG. 5B).

Figure 6B:
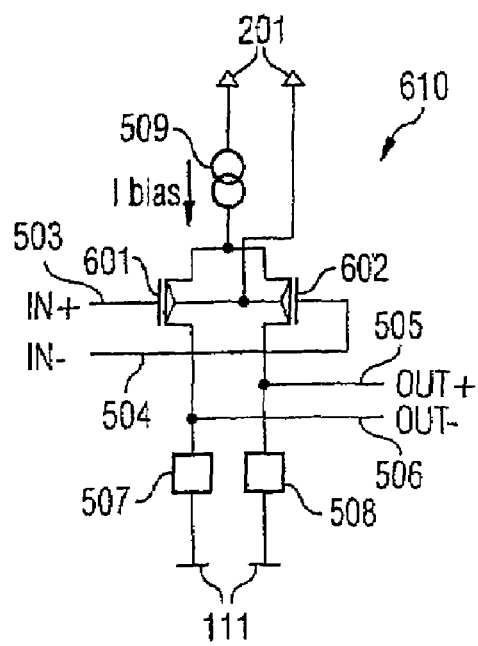

In the case of the differential stage 610 known from the prior art as shown in FIG. 6B, the well terminals of the first and second p-MOS input transistors 601, 602 are fixedly at the positive operating voltage, that is to say at the supply potential 201, in a departure from the differential stage 600.

A description is given below, referring to FIG. 7, of a differential stage 700 as an integrated circuit in accordance with a first exemplary embodiment of the invention.

In the case of the differential stage 700, the principle according to the invention is applied for reducing the noise of transistors in relation to the differential stage 500 from FIG. 5A. For this purpose, the first n-MOS input transistor 501 is replaced by a first and a second n-MOS replacement input transistor 501a, 501b, and the second n-MOS input transistor 502 is replaced by a third and by a fourth n-MOS replacement input transistor 502a, 502b. By means of the first and second clock signal inputs 113a, 113b, using first to eighth switching transistors 701 to 708, alternate signals are applied to the gate terminals of the transistors 501a, 501b and 502a, 502b in the manner shown in FIG. 7. If the circuits from FIG. 7 and FIG. 5A are intended to have essentially identical electrical properties with regard to shunt current, transconductance and driver capability, the dimensions of the first to fourth n-MOS replacement input transistors 501a, 501b, 502a, 502b are to be provided in the same dimensions as the n-MOS input transistors 501, 502. Clearly, the gate terminals of the n-MOS replacement input transistors 501a, 501b, 502a, 502b are alternately switched back and forth between the potentials of the respective input 503 or 504 and the ground potential 111, which is realized by means of the first to eighth switching transistors 701 to 708. The switching transistors 701 to 708 are in turn driven by means of the mutually complementary clock signals $\phi_1$ and $\phi_2$, the clock signals $\phi_1$ and $\phi_2$ having a duty cycle ratio of approximately 50%.

If, by way of example, the potential of the second clock signal $\phi_1$ is at VDD potential, and that of the first clock signal $\phi_2$ is at ground potential, the first, fourth, fifth and eighth switching transistors 701, 704, 705, 708 turn on, whereas the second, third, sixth and seventh switching transistors 702, 703, 706, 707 turn off, so that the gate terminals of the first and third n-MOS replacement input transistors 501a, 502a are coupled to the inputs 503, 504 IN+, IN− of the differential stage 700, so that these transistors 501a, 502a carry current and are operated in inversion. By contrast, the gate terminals of the second and fourth n-MOS replacement input transistors 501b, 502b are at ground potential 111, so that these transistors 501b, 502b are free of current and are operated in depletion or accumulation. A change in the second clock signal $\phi_1$ to ground potential and in the first clock signal $\phi_2$ to VDD potential has the effect that the second and fourth n-MOS input transistors 501b, 502b are coupled to the inputs 503, 504 IN+, IN− of the differential stage 700 and are thus operated in inversion. By contrast, the first and third n-MOS replacement input transistors 501a, 502a are operated in depletion or accumulation. A sufficiently rapid switching of the first and second clock signals $\phi_1$ and $\phi_2$ back and forth between ground potential and VDD potential has the effect that the noise contributions of the transistors are reduced according to the invention.

It should be noted that, in the case of the differential stage 700, on average over time, an input current Icg flows into the circuit, said input current being calculated in accordance with $$Icg = Vg, on \times f \times (Cg501a + Cg501b) \quad (1)$$

where f is the frequency of the clock signals $\phi_1$ and $\phi_2$, Vg,on is the voltage present at the gate terminal of the input transistors if the latter are in the on state, and Cg501a+Cg501b is the sum of the gate capacitances of the first and second n-MOS replacement input transistors 501a, 501b (which is identical to the sum of the gate capacitances of the third and fourth n-MOS replacement input transistors 502a, 502b).

In the case of even more precise modeling, it would be necessary to take account of the sum of the integrals of the gate capacitances over the voltage range swept over during clocked operation according to the invention of the transistors, which leads to a somewhat lower value for the sum of the capacitances. The gate capacitance is approximately constant in strong inversion and in strong accumulation, but in depletion operation a relatively great voltage dependence and a reduction compared with the values in inversion and accumulation are apparent.

Applying a standpoint known from switched-capacitor circuit technology, as is described for example in R. Gregorian, G. C. Temes, "Analog MOS Integrated Circuits", NY, John Wiley & Sons, 1986, P. E. Allen, and D. R. Holberg, "CMOS analog circuit design," New York, Oxford University Press, 1987, and P. R. Gray, R. G. Meyer, "Analysis and design of analog integrated circuits," NY, John Wiley & Sons, 1993, the operation of the differential stage 700 has an effect as if a nonreactive resistance R of magnitude $$R = Vg, \text{on}/Icg = 1/[fx(Cg501a+Cg501b)] \qquad (2)$$

were present at the input of the circuit. It can be assumed that the total input impedance of the circuit 700 decreases compared with the circuits from FIG. 5A to FIG. 6B, or the input impedance is no longer purely capacitive but rather contains a resistive contribution in addition to its capacitive component.

Figure 8:
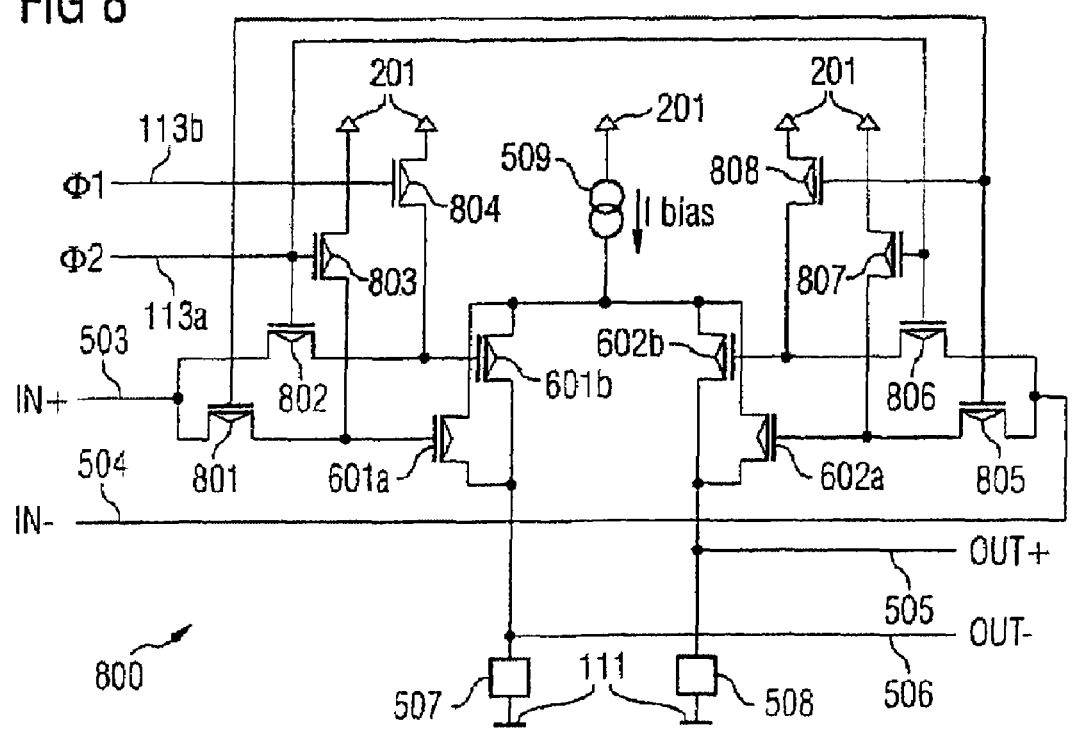

The differential stage 800 shown in FIG. 8 as an integrated circuit in accordance with a second exemplary embodiment of the invention constitutes a realization according to the invention of the differential stage 600 from FIG. 6A with reduced low-frequency noise.

Figure 7:
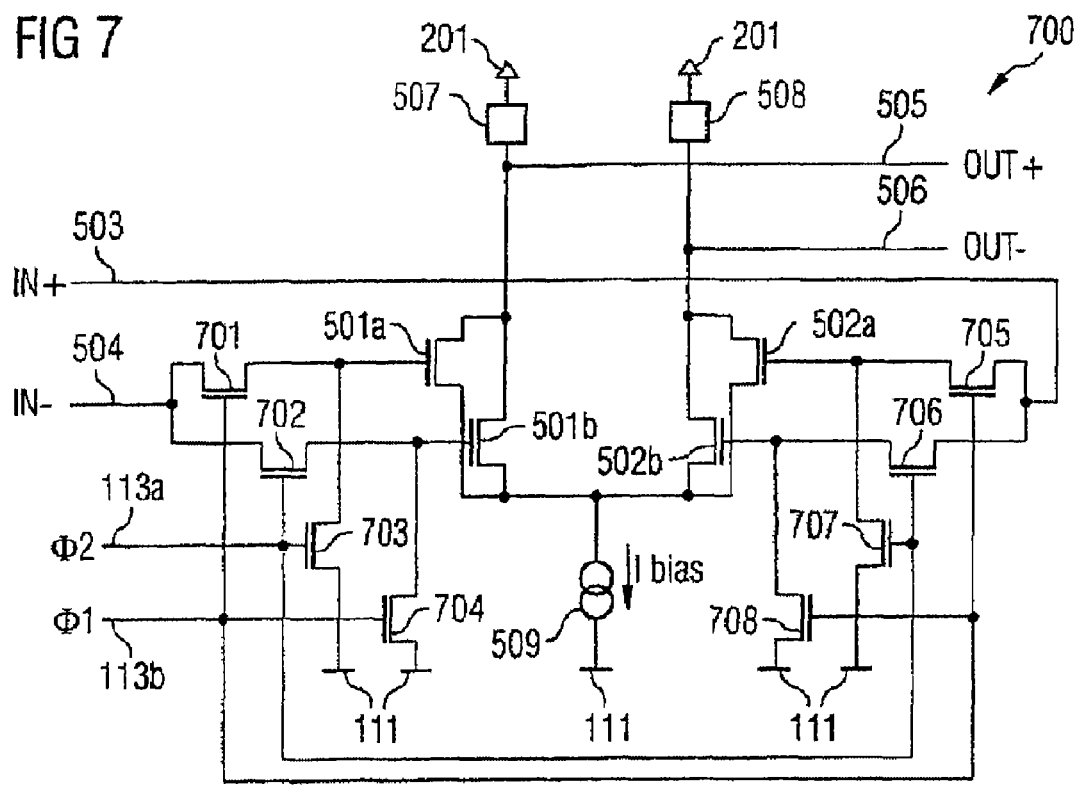

In other words, the differential stage 800 is a complementary variant of the differential stage 700 since the differential stage 800 uses p-MOS transistors instead of the n-MOS transistors used in FIG. 7. In particular, the first p-MOS input transistor 601 from FIG. 6A is replaced by a first and a second p-MOS replacement input transistor 601a, 601b and connected up in the manner according to the invention. Furthermore, the second p-MOS input transistor 602 from FIG. 6A is replaced by a third and a fourth p-MOS replacement input transistor 602a, 602b and connected up according to the invention. Moreover, instead of the first to eighth n-MOS switching transistors 701 to 708, the first to eighth p-MOS switching transistors 801 to 808 are correspondingly provided, which correspond to the switching transistors 701 to 708 in accordance with their functionality. It should be noted, that in the case of the differential stage 800, the first and second p-MOS replacement switching transistors 601a, 601b have gate terminals that are separate from one another, that is to say that the operating point of these transistors is set by means of applying alternate signals to the gate terminals thereof.

The differential stages 700, 700 according to the invention as shown in FIG. 7, FIG. 8 can be realized particularly advantageously in SOI technology ("silicon on insulator"). In this case, the transistors from FIG. 7, FIG. 8 are formed on and/or in an SOI substrate. Said transistors may be embodied in particular as partially depleted transistors. In the case of a differential stage 700, 800 with SOI transistors, disturbing self-heating effects and floating body effects are greatly reduced on account of the clocked driving according to the invention (with a duty cycle of preferably approximately 50%).

In the case of the differential stage 900 shown in FIG. 9 as an integrated circuit in accordance with a third exemplary embodiment of the invention, the interconnection is similar to that in the case of the differential stage 800 in FIG. 8 with the difference that the first and second p-MOS replacement input transistors 601a, 601b are coupled at the gate terminals thereof, whereas their well terminals are provided separately from one another and are switched to alternate potentials by means of the clock signals $\phi_1$ and $\phi_2$. The same applies analogously to the third and fourth p-MOS replacement input transistors 602a, 602b. In the case of the differential stage 900 shown in FIG. 9, therefore, the changeover of the p-MOS replacement input transistors 601a, 601b, 602a, 602b between inversion operation and depletion or accumulation operation is not effected by driving these transistors via their gate terminal, but rather via their well terminal. These are switched back and forth here between one source/drain potential of the transistors and the supply potential 201 VDD using the first to eighth p-MOS switching transistors 801 to 808 and also the clocked control signals $\phi_1$ and $\phi_2$.

The differential stage 900 has the particular advantages that the switching signals $\phi_1$ and $\phi_2$ cannot couple over directly onto the input signals at the inputs 503, 504 IN+, IN− via the first to eighth p-MOS switching transistors 801 to 808. Furthermore, the differential stage 900 avoids the situation in which the input impedance contains quasi-resistive components.

A description is given below, referring to FIG. 10, of a differential stage 1000 as an integrated circuit in accordance with a fourth exemplary embodiment of the invention.

The differential stage 1000 differs from the differential stage 900 essentially by virtue of the fact that a regulating circuit 1001 is provided, at the input 1001a of which one source/drain potential of the first to fourth p-MOS replacement input transistors 601a, 601b, 602a, 602b is present, the regulating circuit 1001 being used to generate a value which is offset by a negative voltage contribution $\Delta V$ with respect to said source/drain potential and is used (given activated p-MOS switching transistors 801, 802, 805 and 806) for driving the well potentials of the first to fourth p-MOS replacement input transistors 601a, 601b, 602a, 602b. The difference between the well potentials by means of which the input transistors 601a, 601b, 602a, 602b are switched back and forth between inversion and accumulation is therefore even greater in the case of the differential stage 1000 than in the case of the differential stage 900. Therefore, the differential stage 1000 has the particular advantage that a sufficiently large signal swing occurs at the respective well terminals of the input transistors 601a, 601b, 602a, 602b, which results from the fact that the difference between VDD and the other potential applied to the well terminal of the input transistors 601a, 602b is sufficiently large. A reliable setting of the operating point of the transistors is thus ensured.

Figure 11:
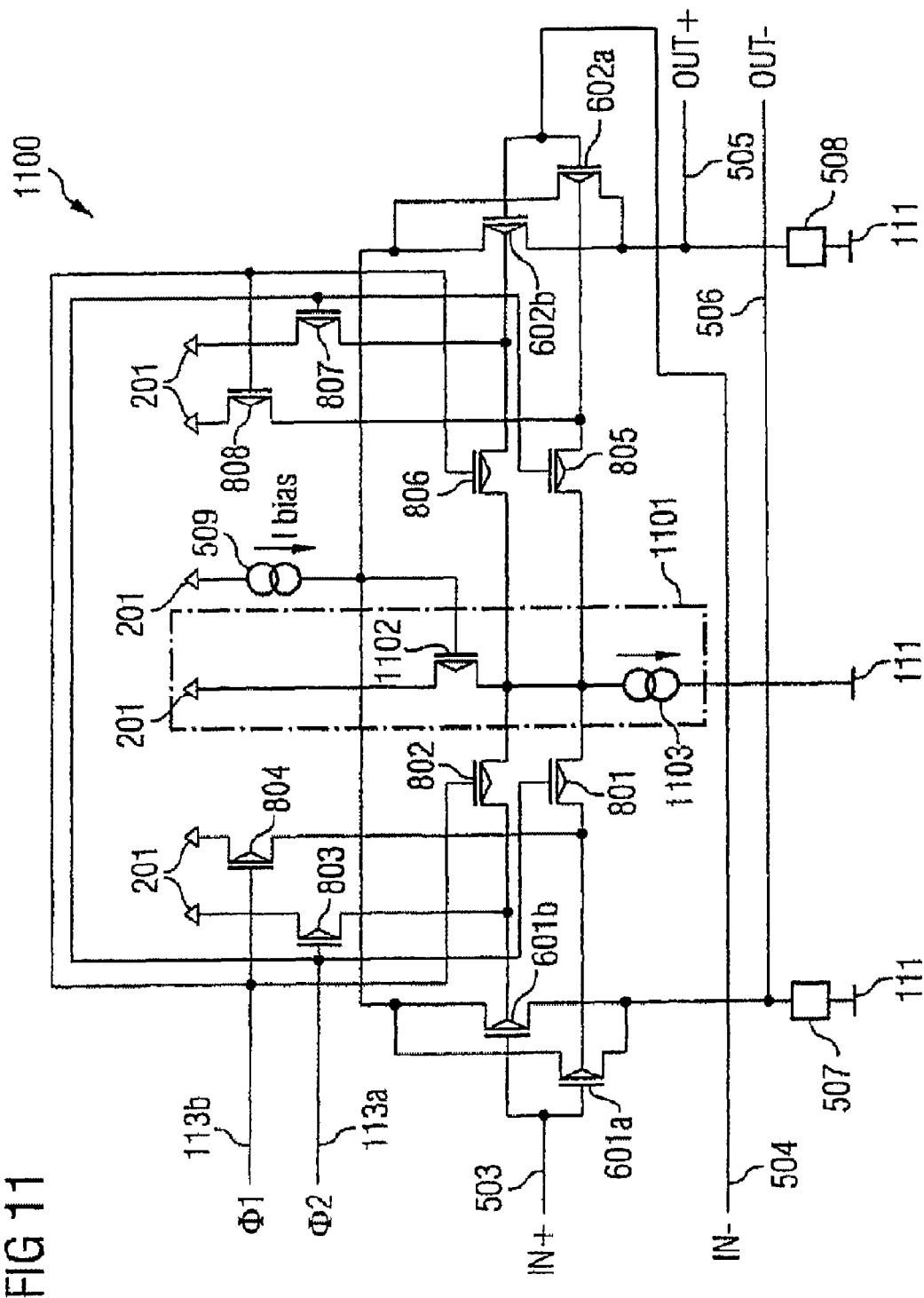

A description is given below, referring to FIG. 11, of a differential stage 1100 as an integrated circuit in accordance with a fifth exemplary embodiment of the invention.

The differential stage 1100 differs from the differential stage 1000 essentially in that the regulating circuit 1001 is configured as a source follower circuit 1101 in the case of the differential stage 1100. The source follower circuit 1101 contains an auxiliary transistor 1102, the gate terminal of which is coupled to the current source 509, and contains another current source 1103. The value of the voltage offset $\Delta V$, generated by means of the regulating circuit 1101 or the source follower transistor 1102, can be set by means of setting the geometrical parameters of the auxiliary transistor 1102 and by means of setting the value of the current of the other current source 1103.

The noise of the current source 509 Ibias is discussed below, or the noise of the transistor or transistors with which said current source 509 is realized (e.g. the n-MOS current source transistor 511 from FIG. 5B). This noise to a good approximation makes no contribution to the noise of the output signal of the differential stage since it is fed in equal portions and in correlated fashion into both branches of the stage. Consequently this parameter represents a common-mode contribution that is not manifested appreciably in the output signal. In this respect, circuitry means for suppressing the noise of the components with which the current source 509 is realized are not usually necessary or have only a negligible influence on the performance of the differential stage with regard to a further improvement of its noise properties. It should be noted, however, that the current source 509 may also as required be subjected to noise suppression according to the invention.

The properties of the load elements 507, 508 may, by contrast, have an effect on the overall noise of the differential stages in accordance with the exemplary embodiments of the invention described with reference to FIG. 7 to FIG. 11. Here circuitry approaches for suppression may mean a gain in performance.

A description is given below firstly, referring to FIG. 12A to FIG. 15B, of current sources in accordance with the prior art and subsequently, referring to FIG. 16A to FIG. 24, of current sources with the transistor arrangement according to the invention for reducing the low-frequency noise of such circuits.

Figure 12A:
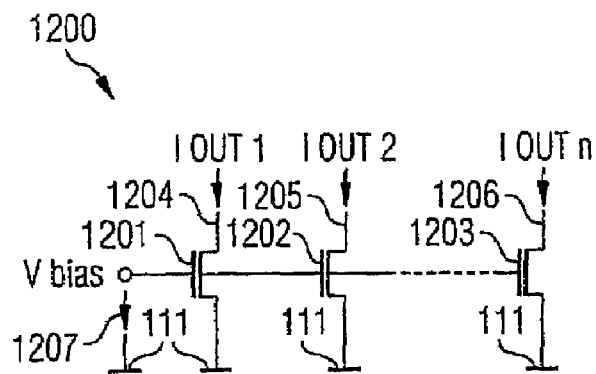
FIGS. 12A to 15B show current source circuits in accordance with the prior art.

FIG. 12A shows a current source circuit 1200 in accordance with the prior art.

Said current source circuit has first to n-th current source transistors, the first current source transistor 1201, the second current source transistor 1202 and the n-th current source transistor 1203 of which are shown in FIG. 12A. Each of the current source transistors is coupled at one of the two source/drain terminals to an associated one of n output terminals, a first output 1204, a second output 1205 and an n-th output 1206 of which are shown in FIG. 12A. The first source/drain terminal of all the current source transistors 1201 to 1203 are generally at ground potential 111, a bias voltage 1207 Vbias is applied to the gate terminals of all the current source transistors 1201 to 1203, and the second source/drain terminal of the current source transistors are coupled to the outputs 1203 to 1206. In order that the current source circuit 1200 has a current source character, that is to say that the output current or the output currents at the outputs 1203 to 1206 exhibits or exhibit no or at most a small dependence on the applied output voltage or the applied output voltages, the transistors 1201 to 1203 are to be operated in the saturation region, that is to say that the condition is to be met that the applied source/drain voltages are at least as high as the difference between the bias voltage Vbias 1207 and the threshold voltage Vt of the transistors 1201 to 1203. The above statement holds true for Vbias>Vt, that is to say for an operating point at which one of the transistors 1201 to 1203 (or to put it more precisely part of the channel of the respective transistor 1201 to 1203) is operated in inversion.

Furthermore, a current source character also results for specific conditions in the subthreshold region under the condition Vbias<Vt, in the case of which inversion prevails nowhere in the entire transistor. This operating region is characterized in that the currents considered for a given geometry of the transistor, are significantly (up to two or more decades) lower than in inversion operation, and that this operating region is of interest in only few specific analog circuits.

Transistors 1201 to 1203 having channel regions of identical length are usually used in a current source circuit 1200 as shown in FIG. 12A. By means of setting the width of the transistors 1201 to 1203, it is then possible to define the ratio of the output currents.

FIG. 12B to FIG. 12E show bias voltage generating circuits 1210, 1220, 1230 and 1240, by means of which the bias voltage Vbias 1207 can be generated if it is not applied directly. Each of the bias voltage generating circuits shown in FIG. 12B to FIG. 12E is provided with a converter transistor 1211, which acts as a current-voltage converter since one of its source/drain nodes is coupled to its gate node. In particular, the converter transistor 1211 forms a current mirror with the respective current source transistor 1201 to 1203.

Figure 12B:
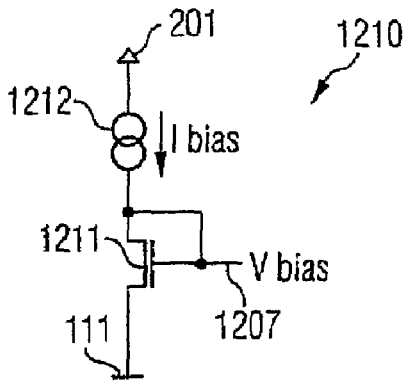

In the case of the bias voltage generating circuit 1210 from FIG. 12B, the current through the converter transistor 1211 is supplied by means of a current source 1212 Ibias.

Figure 12C:
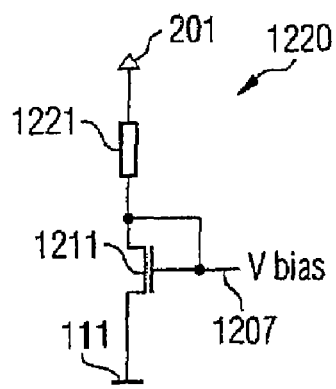
Figure 12D:
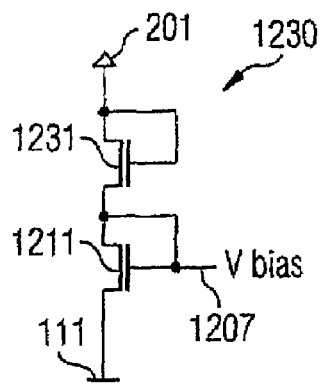
Figure 12E:
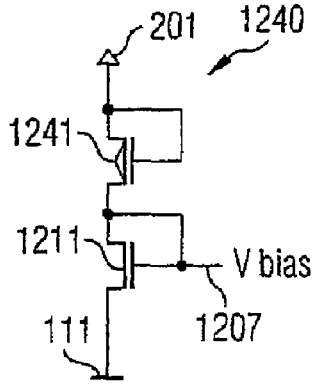

In the case of the bias voltage generating circuits 1220, 1230, 1240 shown in FIG. 12C to FIG. 12E, a load element is arranged between the gate or one of the source/drain nodes of the converter transistor 1211 and the supply voltage 201 (positive supply voltage), which load element is configured as a nonreactive resistor 1221 in FIG. 12C, as an n-MOS load transistor 1231 in FIG. 12D, and as a p-MOS load transistor 1241 in FIG. 12E.

Figure 13:
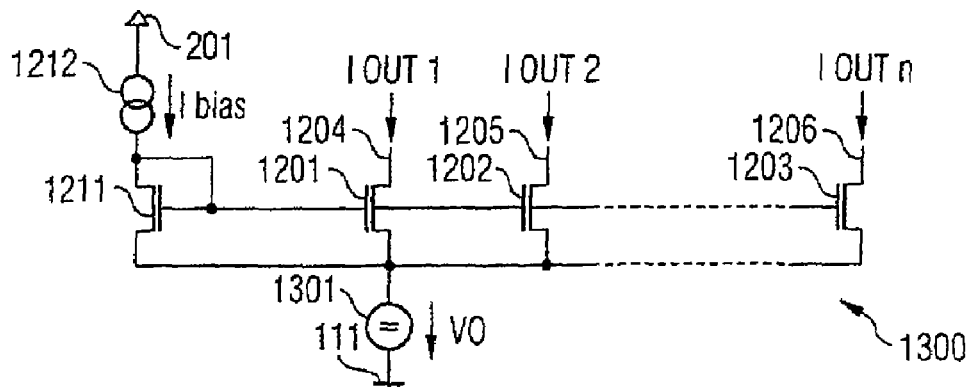

FIG. 13 shows a current source circuit 1300 in accordance with the prior art (can also be used as a current mirror circuit), in which the common source/drain potential of all the current source transistors 1201 to 1203 is brought to a value that is different from the electrical ground potential 111. This potential is provided by means of a voltage source 1301 V0 connected between the electrical ground potential 111 and the common source/drain terminal of all the transistors 1201 to 1203. The statement made with respect to FIG. 12A to FIG. 12E holds true with regard to the supply of all the current source transistors 1201 to 1203 with a common gate potential. In particular, the generation of the bias voltage 1207 Vbias in FIG. 13 can be realized in a manner similar to that in FIG. 12B.

Figure 14A:
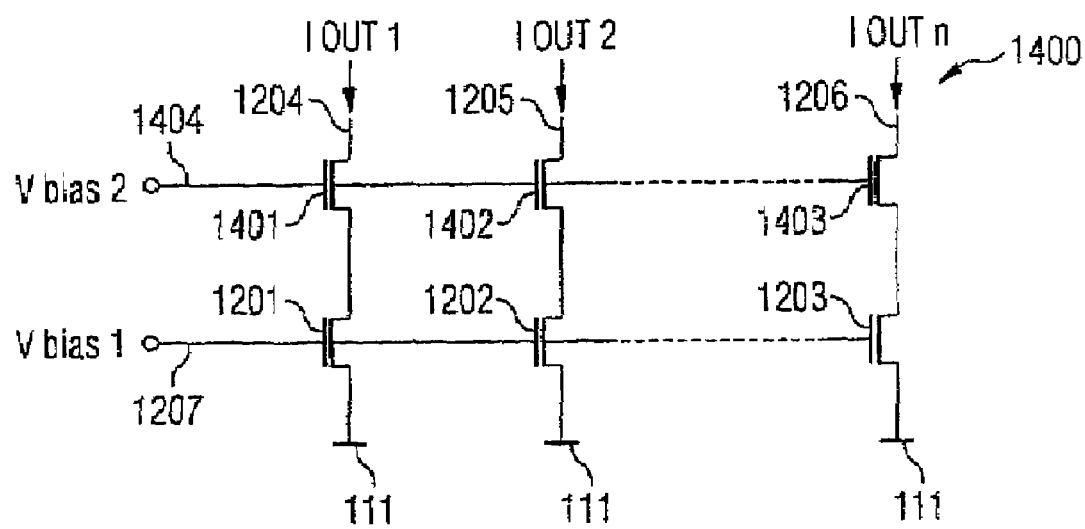

The cascaded current source circuit 1400 in accordance with the prior art as shown in FIG. 14A is described below.

In addition to the components of the current source circuit 1200 from FIG. 12A, in the case of the cascaded current source circuit 1400 a further n transistors (cascode transistors) are provided, the (n+1)-th cascode transistor 1401, the (n+2)-th cascode transistor 1402 and the 2n-th cascode transistor 1403 of which are shown in FIG. 14A. Furthermore, another bias voltage 1404 Vbias2 is provided in addition to the bias voltage 1207 Vbias (designated as Vbias1 in FIG. 14A) the other bias voltage 1404 being applied to all the gate terminals of the cascode transistors 1401 to 1403. The source/drain terminals of the cascode transistors 1401 to 1403 are connected between a respective source/drain terminal of a respective one of the current source transistors 1201 to 1203 and a respective one of the outputs 1204 to 1206.

The cascading from FIG. 14A has the advantage over the circuit from FIG. 12A that the differential output impedance, which is an important parameter for the assessment of the quality of a current source, is greater in the case of the cascaded current source circuit 1400, that is to say that the current source properties are better pronounced. Details on the method of operation of the circuit shown in FIG. 14A can be found in R. Gregorian, G. C. Temes, "Analog MOS Integrated Circuits", N.Y., John Wiley & Sons, 1986, P. E. Allen, and D. R. Holberg, "CMOS analog circuit design," N.Y., Oxford University Press, 1987, P. R. Gray, R. G. Meyer, "Analysis and design of analog integrated circuits," N.Y., John Wiley & Sons, 1993, and A. B. Grebene, "Bipolar and MOS analog integrated circuit design", N.Y., John Wiley & Sons, 1984, for example.

Figure 14B:
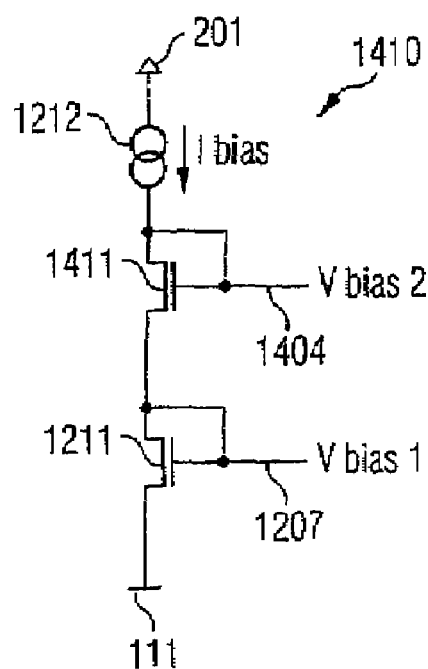

In the case of the cascaded bias voltage generating circuit 1410 from FIG. 14B for the generation of Vbias1 and Vbias2, in addition to the components of the bias voltage generating circuit 1210 from FIG. 12B, another converter transistor 1411 (connected up in a manner similar to the converter transistor 1211) is provided in order to generate the other bias voltage 1404 Vbias2.

Figure 14C:
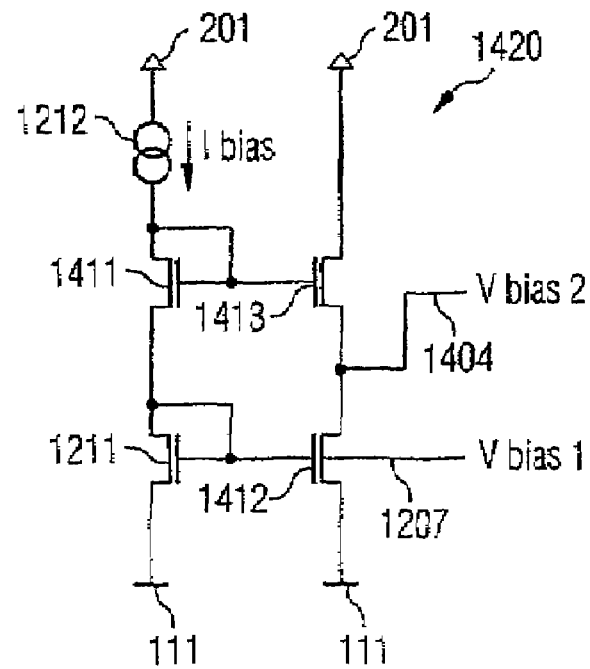

The cascaded bias voltage generating circuit 1420 from FIG. 14C contains first and second auxiliary transistors 1412 and 1413 in addition to the components of the cascaded bias voltage generating circuit 1410.

Figure 15A:
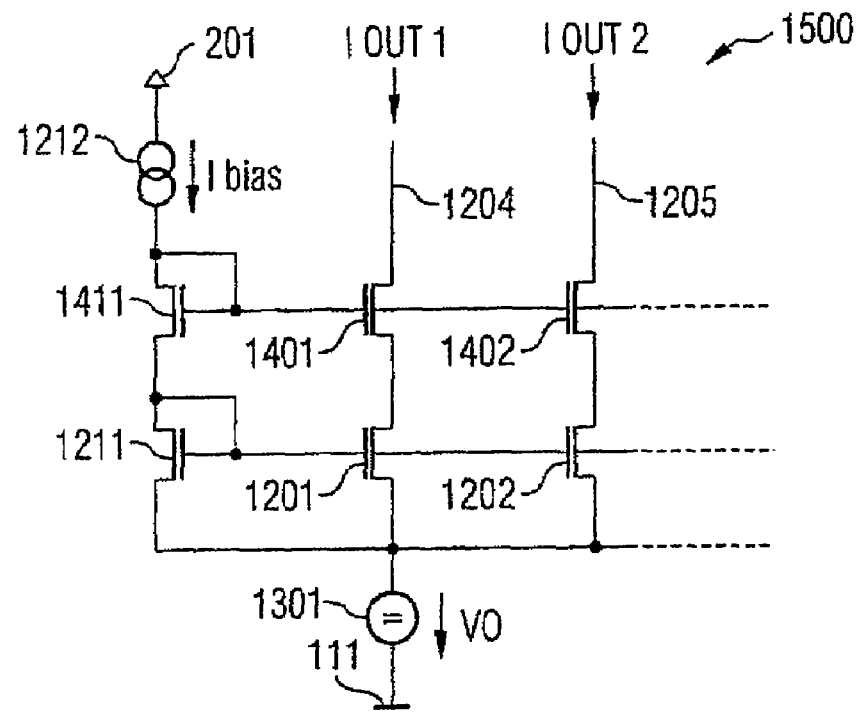

The current source circuit 1500 shown in FIG. 15A constitutes a combination of the circuits from FIG. 14A and FIG. 14B. The combination of the circuits from FIG. 14A and FIG.

14B produces the functionality of a current mirror circuit given adequate dimensioning of the transistors.

Figure 15B:
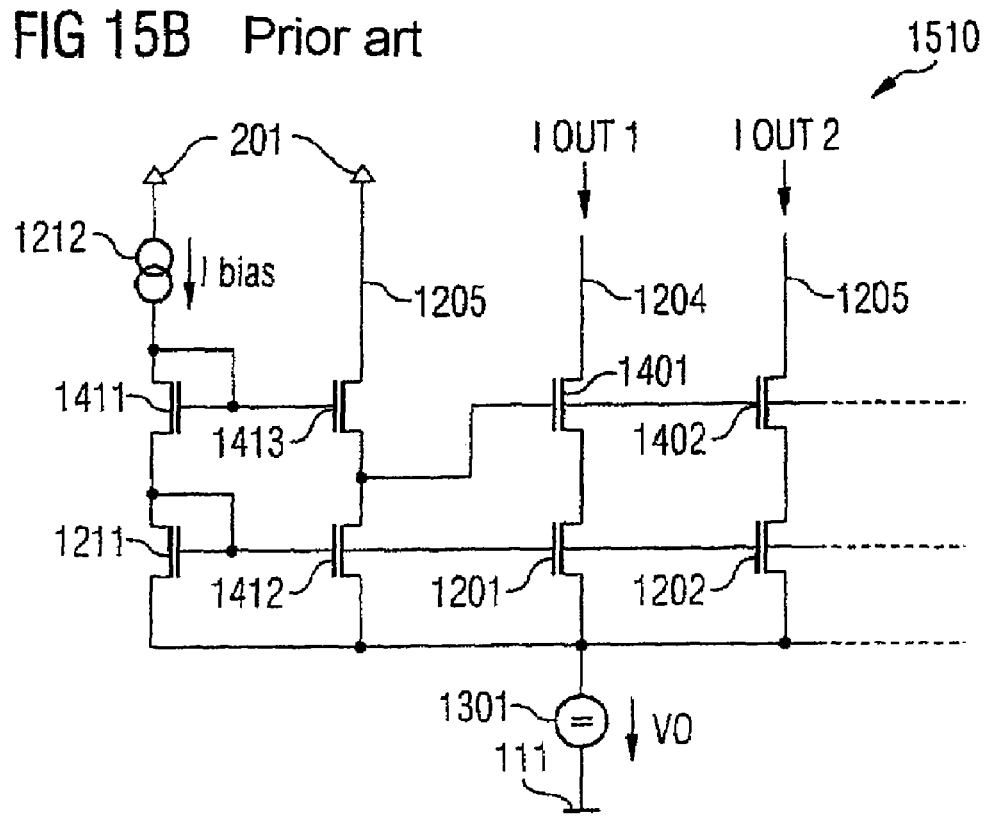

The current source circuit 1510 shown in FIG. 15B constitutes a combination of the circuit from FIG. 14A with that from FIG. 14C.

Both in the case of the current source circuit 1500 from FIG. 15A and in the case of the current source circuit 1510 from FIG. 15B, on account of the use of the voltage source 1301 V0 the common source/drain potential of the converter transistor 1211, of the first auxiliary transistor 1412, and of the first to n-th current source transistors 1201 to 1203 is brought to a value that is different from the ground potential 111.

A description is given below, referring to FIG. 16A, of a current source circuit 1600 as an integrated circuit in accordance with a sixth exemplary embodiment of the invention.

In the case of the current source circuit 1600, the current source transistors 1201 and 1202 are replaced according to the invention by first to fourth replacement current source transistors 1201*a*, 1201*b*, 1202*a*, 1202*b*. In other words, the principle of FIG. 1B is applied to the current source circuit 1200 in order to obtain the current source circuit 1600.

The dimensions of the replacement current source transistors 1201*a*, 1201*b*, 1202*a*, 1202*b* are identical to those of the first and second current source transistors 1201, 1202. The gate terminals of the first and second replacement current source transistors 1201*a*, 1201*b* and of the third and fourth replacement current source transistors 1202*a*, 1202*b* are respectively switched back and forth alternately between the bias voltage 1207 Vbias, on the one hand, and the ground potential 111, on the other hand, which is realized by means of the first to eighth switching transistors 1601 to 1608. The first to eighth switching transistors 1601 to 1608 are driven by means of the clock signals $\phi_1$, $\phi_2$, which are complementary to one another and have a duty cycle ratio of approximately 50%.

If, by way of example, $\phi_2$ is at a VDD potential and $\phi_1$ is at a ground potential, the first, fourth, fifth and eighth switching transistors 1601, 1604, 1605, 1608, are electrically conductive, whereas the other switching transistors 1602, 1603, 1606, 1607 turn off, so that the bias voltage 1207 Vbias is applied to the gate terminals of the first and third n-MOS replacement current source transistors 1201*a*, 1202*a*. Consequently, these transistors carry current and are therefore operated in inversion. The gate terminals of the second and fourth n-MOS replacement current source transistors 1201*b*, 1202*b*, by contrast, are at ground potential 111, are free of current and are therefore operated in depletion or accumulation.

A change in the clock signal $\phi_2$ to ground potential and in the clock signal $\phi_1$ to VDD potential has the effect that the second and fourth replacement current source transistors 1201*b*, 1202*b* are coupled to the bias voltage 1207 Vbias and are therefore operated in inversion, whereas in this scenario the first and third replacement current source transistors 1201*a*, 1202*a* are operated in depletion or accumulation. A sufficiently fast change in the clock signals $\phi_1$ and $\phi_2$ between the VDD potential and the ground potential, that is to say a sufficiently high clock frequency, has the effect that the noise contributions are reduced according to the invention.

A description is given below, referring to FIG. 16B, of a current source circuit 1610 as an integrated circuit in accordance with a seventh exemplary embodiment of the invention.

Figure 16A:
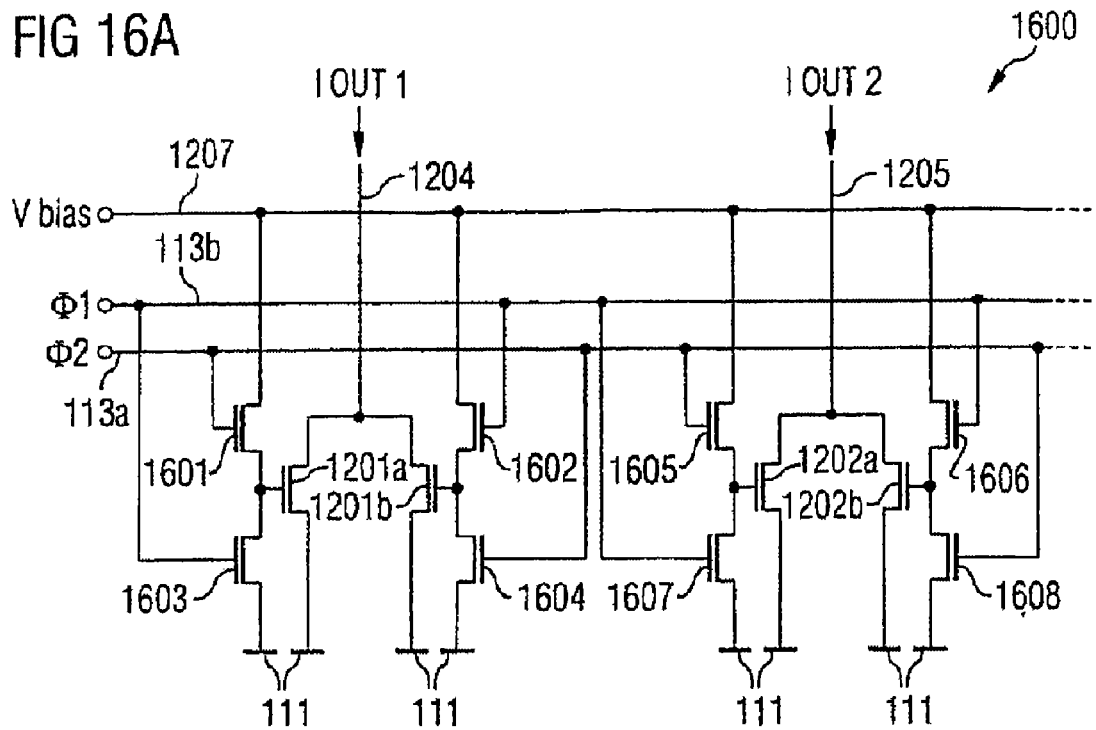
FIGS. 16A to 18, FIGS. 20 to 24 show current source circuits as integrated circuits in accordance with sixth to fourteenth exemplary embodiments of the invention.
Figure 16B:
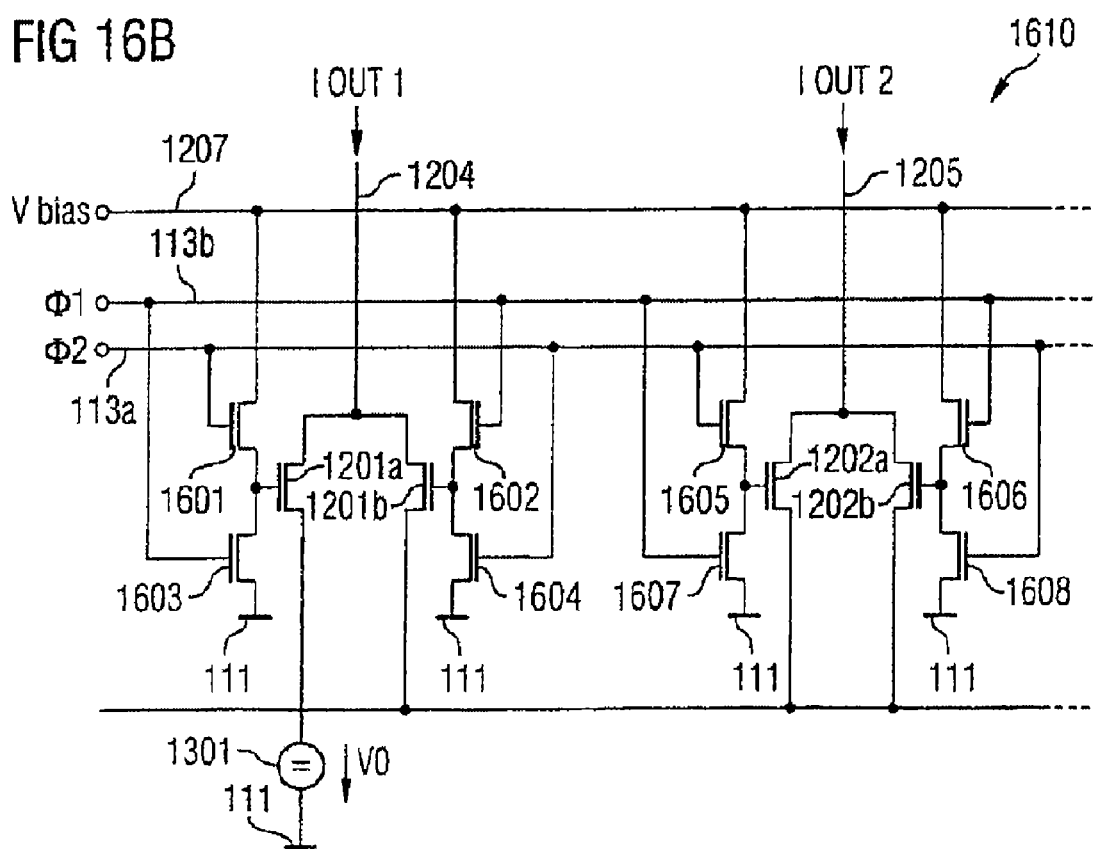

The current source circuit 1610 differs from the current source circuit 1600 essentially by virtue of the fact that the lower source/drain terminals in accordance with FIG. 16B of the first to fourth n-MOS replacement current source transistors 1201*a*, 1201*b*, 1202*a*, 1202*b* utilized as current sources are not brought to the electrical ground potential 111, but rather are brought to a potential that is different from the ground potential 111, here a positive potential, by means of the voltage source 1301 V0.

In the case of the current source circuit 1610, the noise suppression mechanism functions in just the same way as in the case of the current source circuit 1600. However, the voltage swing at the gate terminal of the first to fourth replacement current source transistors 1201*a*, 1201*b*, 1202*a*, 1202*b* in accordance with FIG. 16B is greater. The increased voltage swing has the effect that the two respective quasi Fermi levels associated with the two operating states of said transistors are even further apart from one another in energetic terms, as a result of which the noise is suppressed even more effectively.

A description is given below, referring to FIG. 17, of a current source circuit 1700 as an integrated circuit in accordance with an eighth exemplary embodiment of the invention.

Clearly, the current source circuit 1700 is similar to the current source circuit 1400 from FIG. 14A, the invention's principle of replacing a transistor by two transistors and of complementarily clocking the gate terminals of said transistors in order to reduce the noise voltage being realized in the case of the current source circuit 1700. It should be noted that only the two first column outputs 1204, 1205 with associated transistors are illustrated in FIG. 17. In comparison with the current source circuit 1400, in the case of the current source circuit 1700, the current source transistors 1201, 1202 and cascode transistors 1401, 1402 are replaced by first to eighth n-MOS replacement current source transistors 1201*a*, 1201*b*, 1202*a*, 1202*b*, 1401*a*, 1401*b*, 1402*a*, 1402*b* and connected up according to the manner shown in FIG. 1B. The lower source/drain terminals in accordance with FIG. 17 of the first to fourth replacement current source transistors 1201*a*, 1201*b*, 1202*a*, 1202*b* are not connected directly to electrical ground potential 111, but rather are brought to an electrical potential generated by a voltage source 1301. However, it should be noted that the voltage source 1301 can also be omitted in the current source circuit 1700.

Furthermore, apart from the first to eighth n-MOS switching transistors 1601 to 1608, ninth to sixteenth n-MOS switching transistors 1701 to 1708 are additionally provided, to the gate terminals of which the clock signals $\phi_1$ and $\phi_2$ are applied in such a way that the fifth to eighth current source transistors 1401*a*, 1401*b*, 1402*a*, 1402*b* can thereby be controlled according to the invention.

A description is given below, referring to FIG. 18, of a current source circuit 1800 as an integrated circuit in accordance with a ninth exemplary embodiment of the invention.

The current source circuit 1800 differs from the current source circuit 1700 essentially by virtue of the fact that although the transistors 1201, 1202 are replaced by the configuration according to the invention as shown in FIG. 1B, the cascode transistors 1401, 1402 are left in the configuration shown in FIG. 14A. As a result, the advantages of a cascaded current source circuit over a non-cascaded current source circuit and the noise reduction according to the invention are combined with a lower outlay and smaller area.

These facts are explained below on the basis of an auxiliary circuit diagram 1900 shown in FIG. 19.

Figure 19:
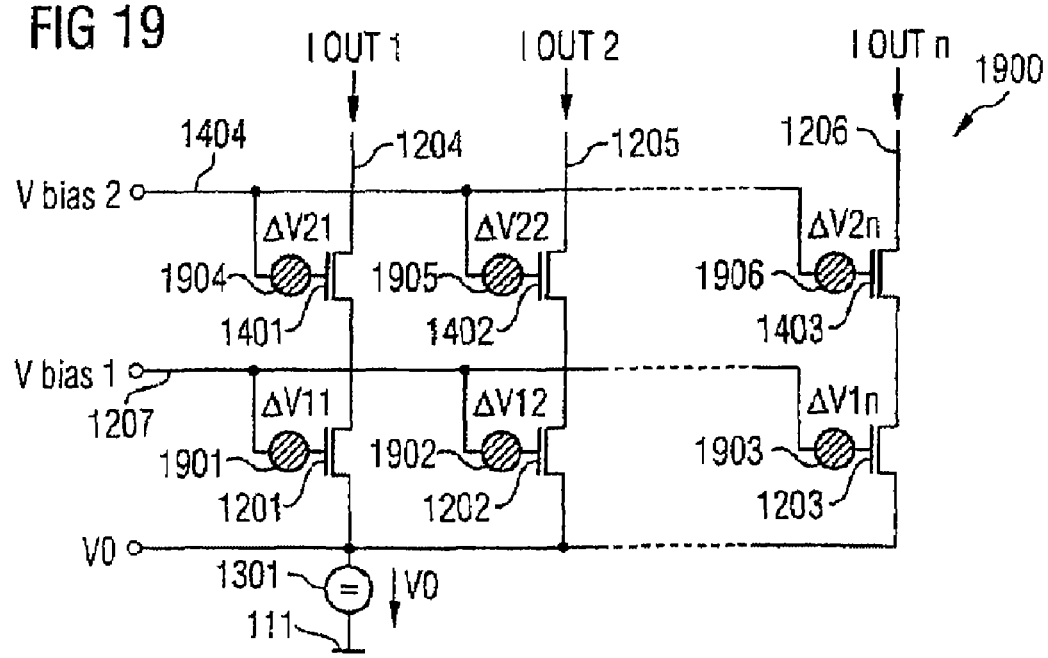
FIG. 19 shows an auxiliary circuit diagram for explaining the functionality of the current source circuits according to the invention.

The auxiliary circuit diagram 1900 is similar to the current source circuit 1400 from FIG. 14A, each real transistor 1201 to 1203, 1401 to 1403 shown in FIG. 14A being modeled in FIG. 19 by a transistor assumed to be noise-free and having identical reference symbols. In order to model the noise of the transistors 1201 to 1203, 1401 to 1403, the gate voltage of each of the transistors 1201 to 1203, 1401 to 1403 is acted on by an interference variable symbolizing the noise, which is modeled by means of a first to 2n-th noise voltage source 1901 to 1906 (clearly noise voltages ΔV1k for the first to n-th current source transistors 1201 to 1203, ΔV2k for the (n+1)-th to 2n-th cascode transistors 1401 to 1403, where k=1, 2, ..., n).

By means of a small-signal analysis, it is possible to determine the contributions or deviations ΔIout1, ΔIout2, ..., ΔIoutn with respect to the desired values Iout1, Iout2, ..., Ioutn. The following is obtained for k=1, 2, ..., n:

$$\Delta Ioutk = gm1k \times \Delta V1k + gDS1k \times \Delta V2K \quad (3)$$

The noise voltages ΔV1K and ΔV2k assigned to the individual transistors 1201 to 1203, 1401 to 1403 can be gathered from FIG. 19. The indices of the noise voltages ΔV1k correspond to the indices of gm1k and gDS1k in equation (3). In equation (3), gm1k denotes the transconductance (that is to say the derivative of the drain current with respect to the gate voltage) and gDS1k denotes the differential output conductance (that is to say the derivative of the drain or current with respect to the drain voltage) of the k-th transistor.

Since the following holds true to a good approximation:

$$gm1k \gg gDS1k \quad (4)$$

it follows that the noise of the cascode transistors 1401 to 1403 contributes considerably less to the overall noise of the output current than the noise of the transistors 1201 to 1203.

Consequently, in particular the noise in the current source circuit 1800 is low even though only the current source transistors 1201 to 1203, but not the cascode transistors 1401 to 1403 have been replaced in the manner according to the invention.

A description is given below, referring to FIG. 20, of a current source circuit 2000 as an integrated circuit in accordance with a tenth exemplary embodiment of the invention.

Figure 20:
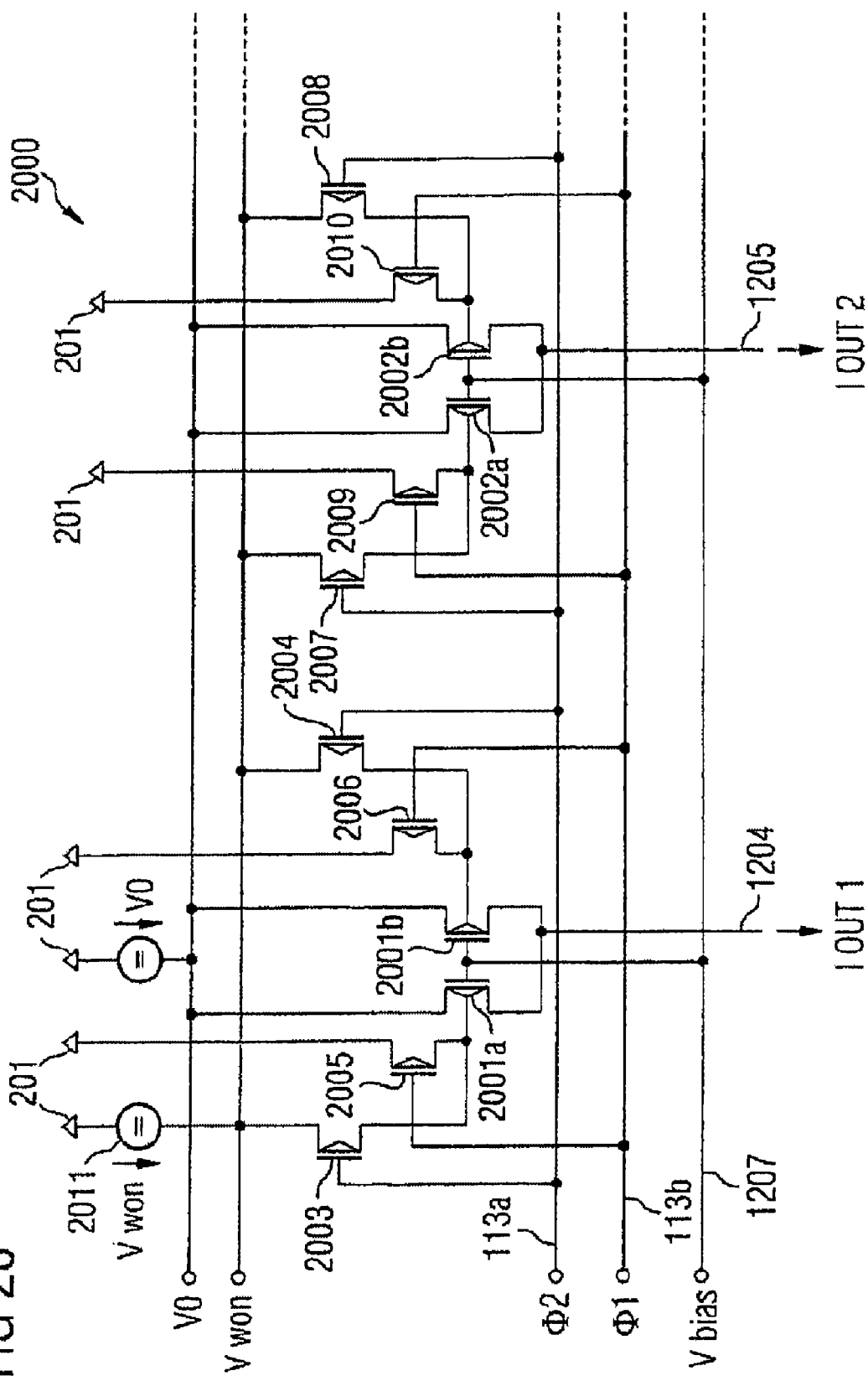

The current source circuit 200 from FIG. 20 is a non-cascaded current source circuit realized with p-MOS transistors. Consequently, the current source circuit 2000 corresponds approximately to the current source circuit 1610 from FIG. 16B with the difference that p-MOS transistors are used instead of n-MOS transistors, and that the transistor operating points are effected by means of setting the well potentials instead of the gate potentials. The gate regions of first and second p-MOS replacement current source transistors 2001a, 2001b are coupled, so that the operating point of these transistors is set by means of setting their well potentials. Third and fourth p-MOS replacement current source transistors 2002a, 2002b are analogously connected up and driven like the transistors 2001a, 2001b. Furthermore, first to eighth p-MOS switching transistors 2003 to 2010 are provided. The operating points of the transistors 2001a, 2001b, 2002a, 2000b are set by means of the p-MOS switching transistors 2003 to 2010, which are controlled using the mutually complementary clock signals $\phi_1$, $\phi_2$. In other words, the changeover of the first to fourth p-MOS replacement current source transistors 2001a, 2001b, 2002a, 2002b between inversion operation and depletion or accumulation operation is effected by means of periodically altering the potentials of the well terminals of said transistors. The two potentials required for this purpose are provided by the voltage source 1301 V0 and a further voltage source 2011 Vwon.

Figure 17:
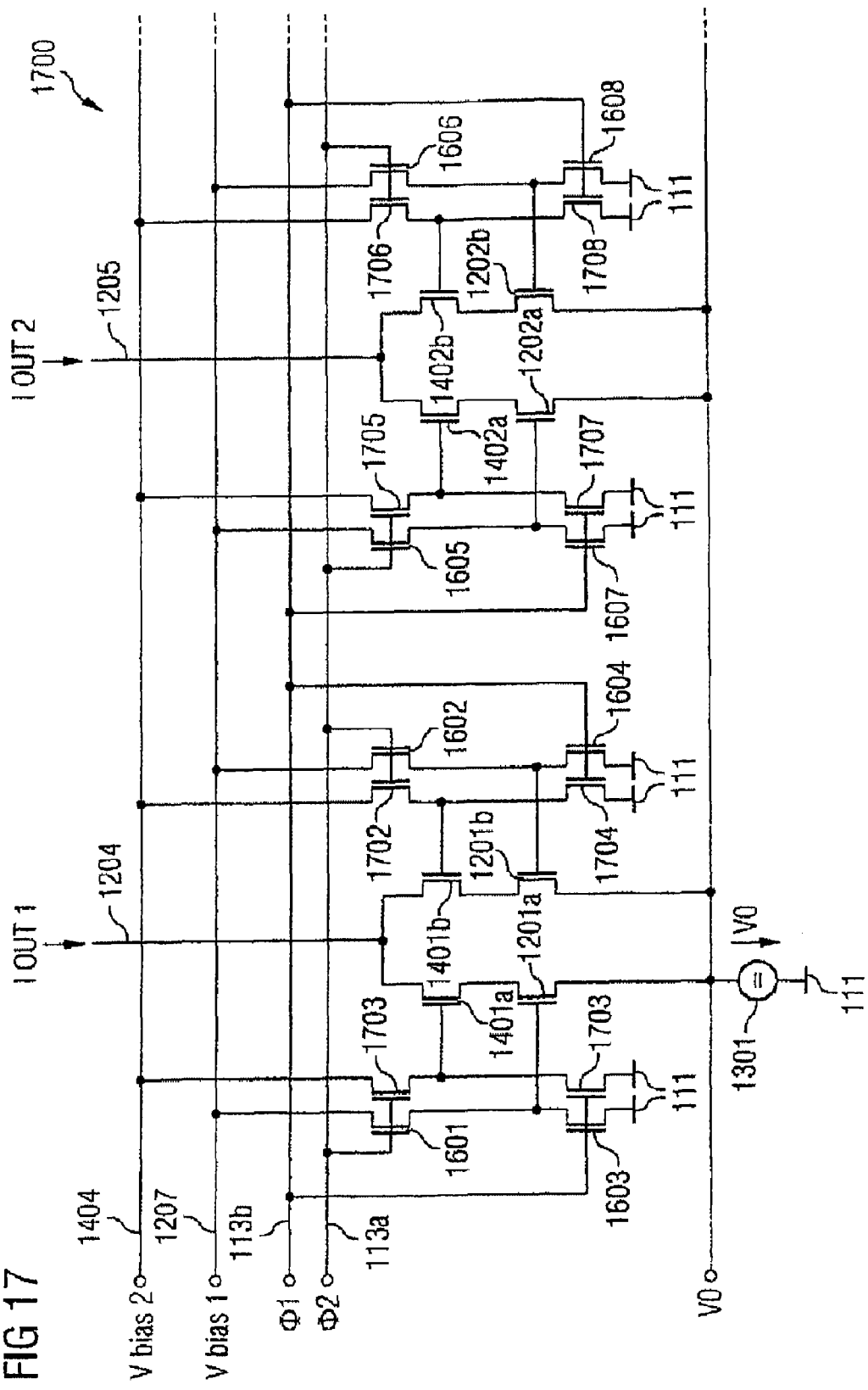
Figure 18:
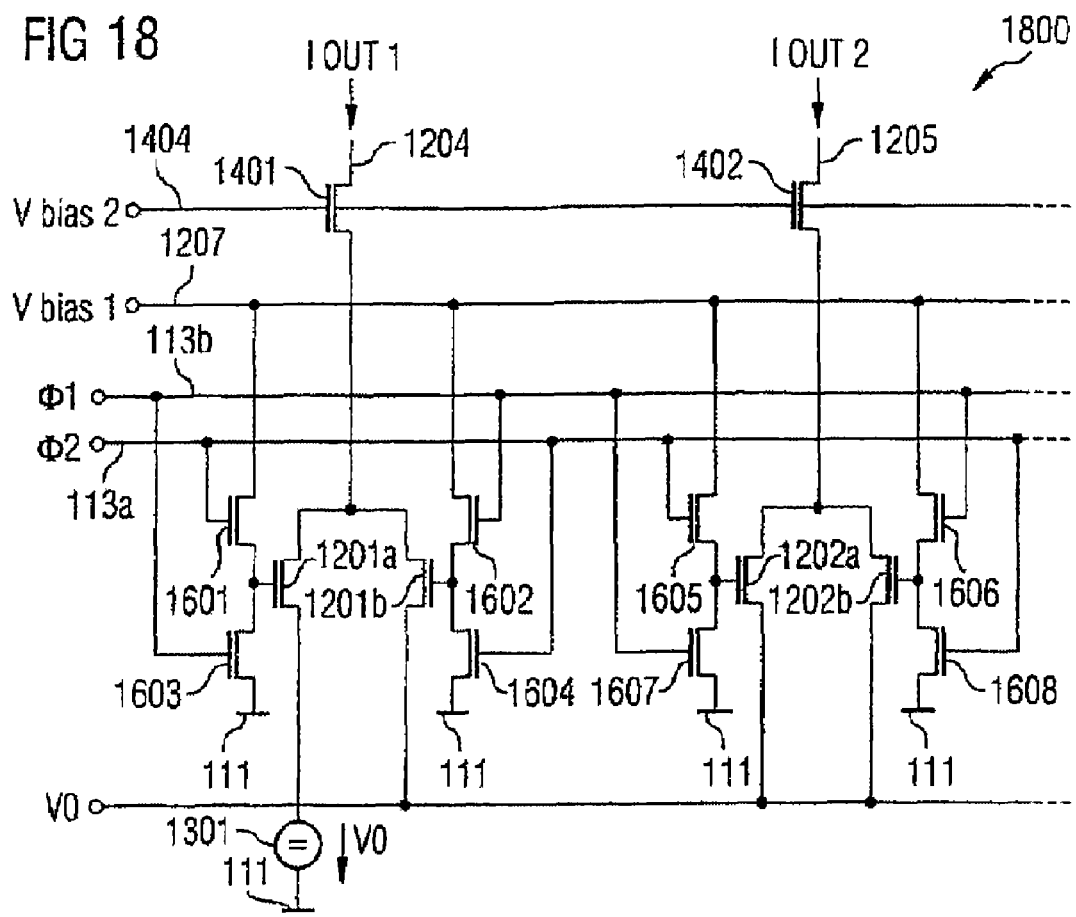

It goes without saying that cascaded current sources can also be constructed in accordance with this principle, in which case the cascode transistors can be operated either in noise-compensated fashion (as in the case of FIG. 17) or in non-noise-compensated fashion (as in the case of FIG. 18).

In the circuits shown in FIG. 16A, FIG. 16B, FIG. 17, FIG. 18 and FIG. 20, a separate switching transistor pair is introduced for each transistor that is to be operated in pulsed fashion according to the invention, by means of which pair the gate or well potential is changed over.

A description is given below, referring to FIG. 21 to FIG. 24, of current source circuits 2100, 2200, 2300, 2400 in which the respective switching transistors are embodied jointly for in each case a plurality of transistors that are to be pulsed according to the invention.

Figure 21:
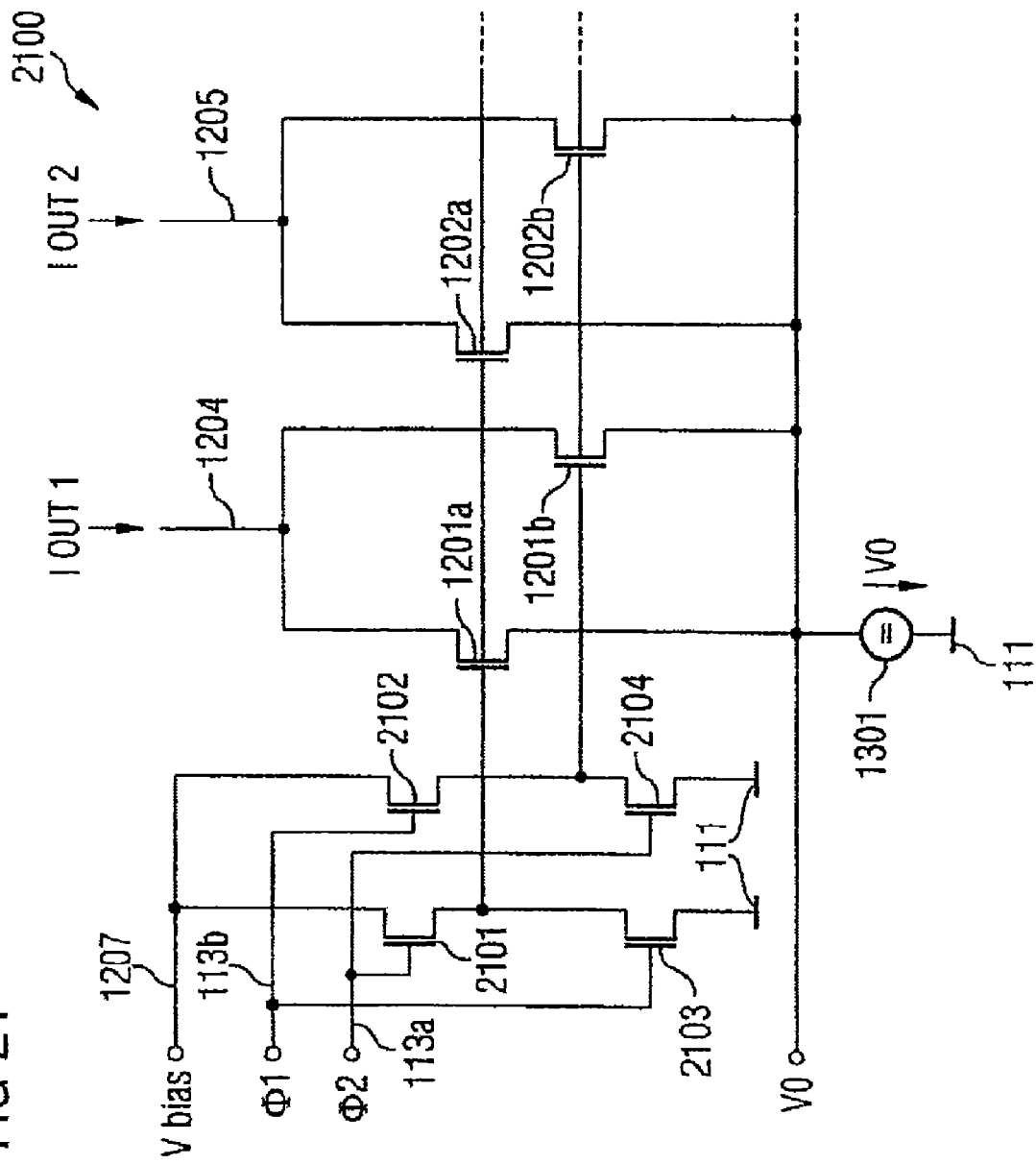

A description is given below, referring to FIG. 21, of a current source circuit 2100 as an integrated circuit in accordance with an eleventh exemplary embodiment of the invention.

The current source circuit 2100 differs from the current source circuit 1610 shown in FIG. 16B essentially by virtue of the fact that, in the case of the current source circuit 1610, in each case two separate switching transistors 1601, 1603 and 1602, 1604 and 1605, 1607 and 1606, 1608 are respectively provided for each of the first to fourth n-MOS replacement current source transistors 1201a, 1201b, 1202a, 1202b. By contrast, in the case of the current source circuit 2100, for the first to fourth n-MOS replacement current source transistors 1201a, 1201b, 1202a, 1202b, a total of only four common first to fourth n-MOS switching transistors 2101 to 2104 are provided for alternately applying the ground potential 111 or the bias voltage Vbias 1207 to the gate regions of the n-MOS replacement current source transistors, for which purpose the clock signals $\phi_1$, $\phi_2$ are used.

A description is given below, referring to FIG. 22, of a current source circuit 2200 as an integrated circuit in accordance with a twelfth exemplary embodiment of the invention.

Figure 22:
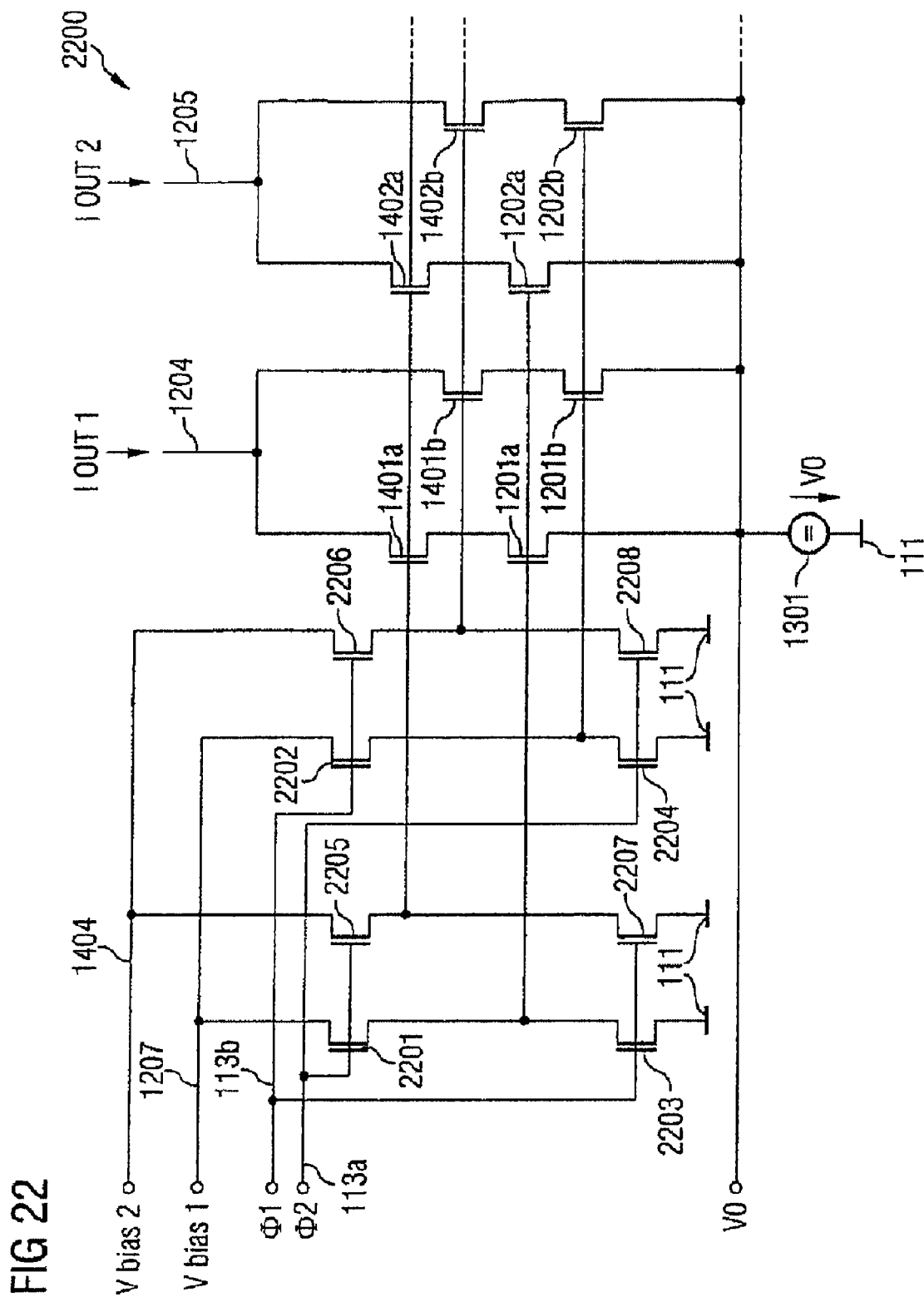

The current source circuit 2200 from FIG. 22 essentially corresponds to the current source circuit 1700 from FIG. 17, in which case, instead of the first to eighth n-MOS switching transistors 1601 to 1608 and the ninth to sixteenth n-MOS switching transistors 1701 to 1708, in the case of the configuration in accordance with FIG. 22, only eight switching transistors 2201 to 2208 are used for jointly driving the n-MOS replacement current source transistors 1201a, 1201b, 1202a, 1202b, 1401a, 1401b, 1402a, 1402b.

A description is given below, referring to FIG. 23, of a current source circuit 2300 as an integrated circuit in accordance with a thirteenth exemplary embodiment of the invention.

Figure 23:
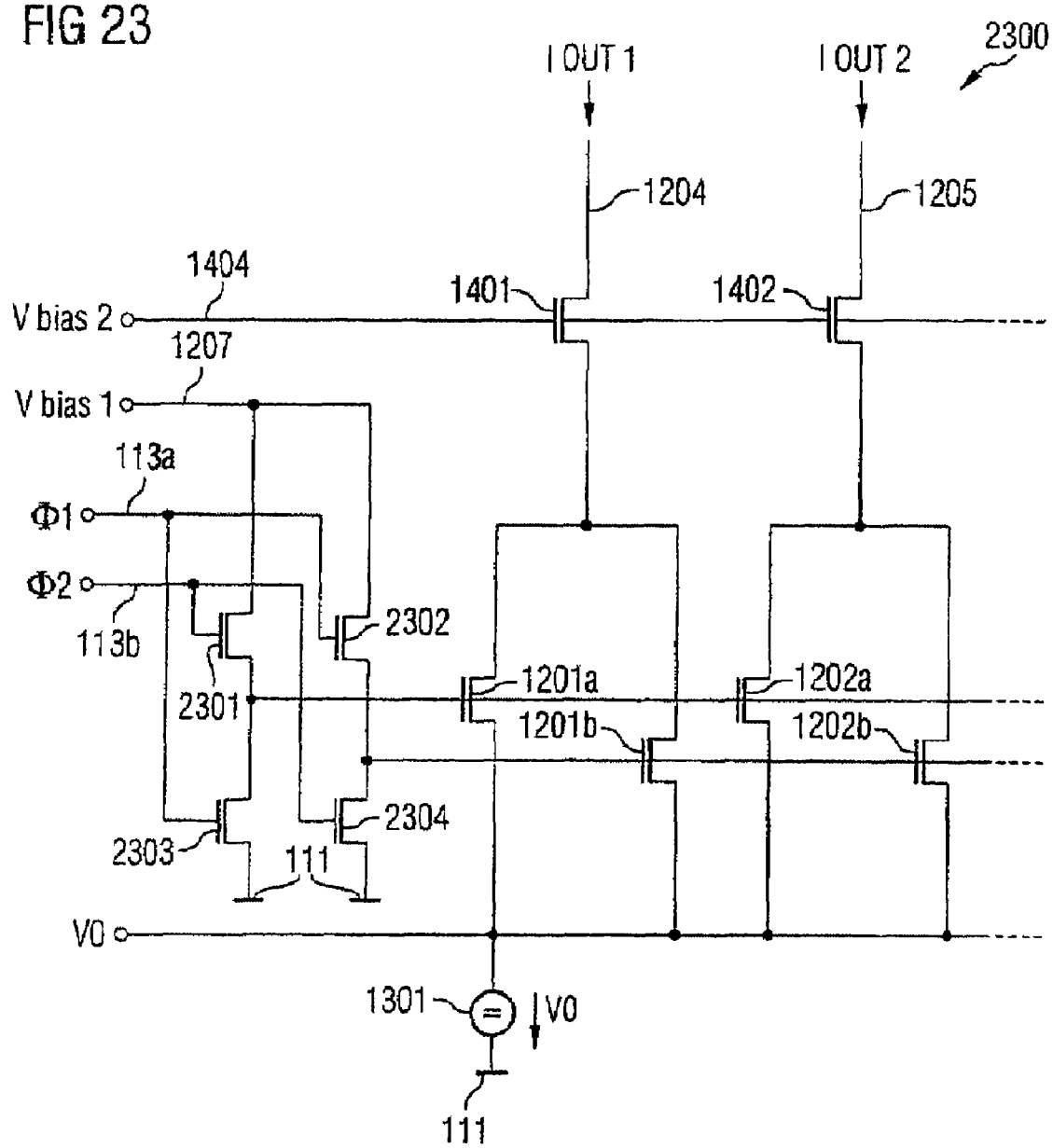

The current source circuit 2300 differs from the current source circuit 1800 shown in FIG. 18 essentially by virtue of the fact that, instead of the first to eighth n-MOS switching transistors 1601 to 1608, for driving the first to fourth n-MOS replacement current source transistors 1201a, 1201b, 1202a, 1202b, in accordance with FIG. 23, only first to fourth n-MOS switching transistors 2301 to 2304 are provided, by means of which the potentials of the gate terminals of the first to fourth n-MOS replacement current source transistors 1201a, 1201b, 1202a, 1202b can be controlled according to the invention.

A description is given below, referring to FIG. 24, of the current source circuit 2400 as an integrated circuit in accordance with a fourteenth exemplary embodiment of the invention.

Figure 24:
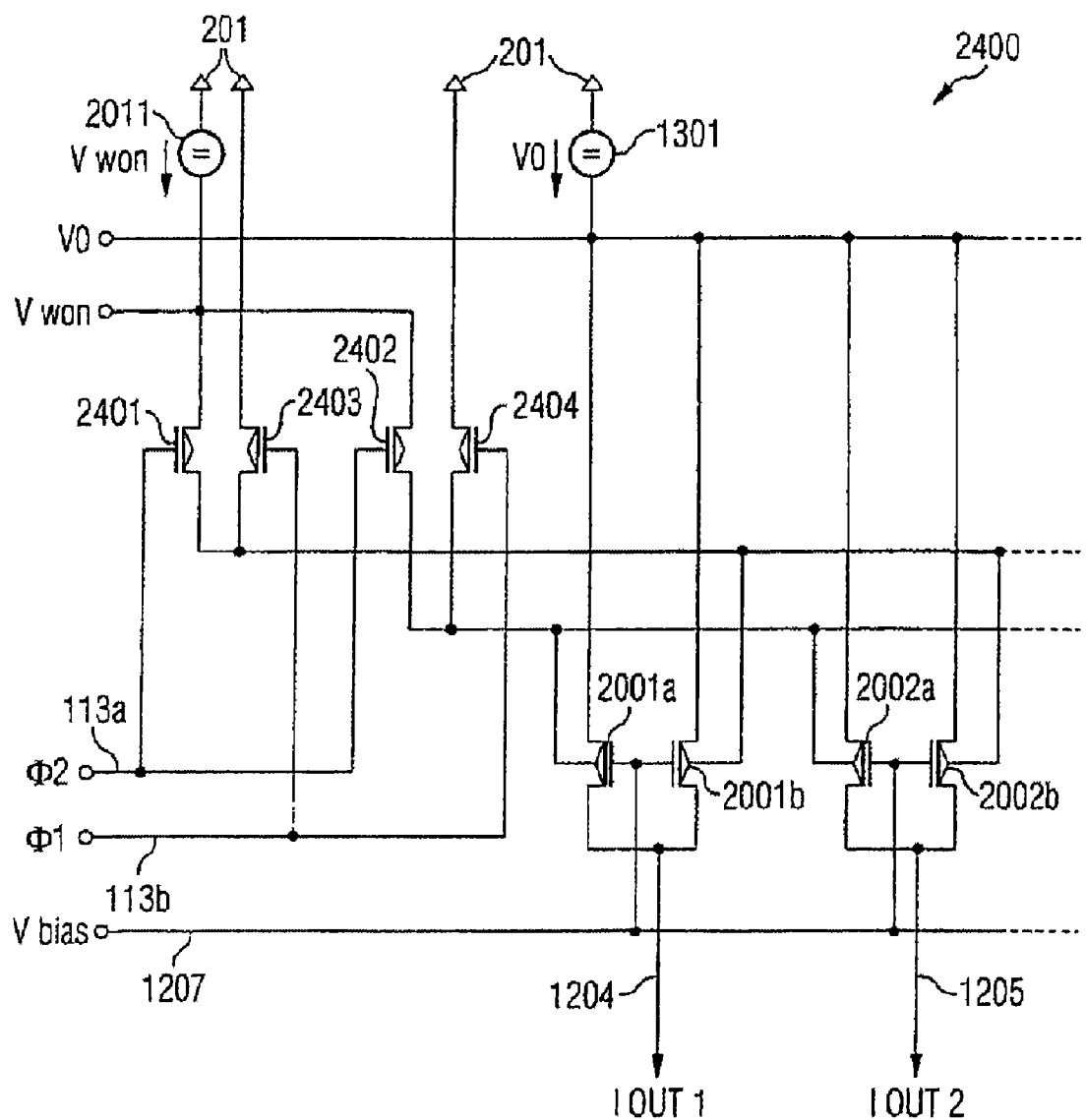

The current source circuit 2400 shown in FIG. 24 differs from the current source circuit 2000 shown in FIG. 20 essentially by virtue of the fact that, instead of the first to eighth p-MOS switching transistors 2003 to 2010, in the case of the current source circuit 2400, only first to fourth p-MOS switching transistors 2401 to 2404 are provided, to be precise jointly for the replacement current source transistors 2001a, 2001b, 2002a, 2002b.

Current mirrors in accordance with the prior art (FIG. 25A) and according to the invention (FIG. 25B, FIG. 26) are described below.

The task of an ideal current mirror is to make available at its output or its outputs a current impressed into the current mirror on the input side (if appropriate weighted with a predetermined factor). Depending on the application, tolerances are permitted with regard to exactly complying with the mirror ratio. There are furthermore applications in which the requirements with regard to complying with a mirror ratio do not have to be applied on the entire input or output current, but these requirements must be complied with for alternating or differential signals impressed on the input current.

If, by way of example, Iin is the mean value of the input current, ΔIin is the impressed differential or alternating signal of the input current, Iout is the mean value of the output current, ΔIout is the resulting differential or alternating signal of the output current, and n is the predetermined mirror factor, then complying with the relationship $$\Delta Iout = n \times \Delta Iin \text{ or } \Delta Iout/\Delta Iin = n \quad (5)$$

is demanded as exactly as possible, whereas for the ratio Iout/Iin greater deviations from the factor n are permitted.

A current mirror 2500 in accordance with the prior art is described below referring to FIG. 25A.

The current mirror circuit 2500 has a first and a second current mirror transistor 2501 and 2502, the gate terminals of which are coupled to one another. One respective source/drain terminal of the first current mirror transistors 2501 and 2502 is at electrical ground potential 111. The other source/drain terminal of the second current mirror transistor 2502 is coupled to an output 2503 of the current mirror 2500. The other source/drain terminal of the first current mirror transistor 2501 is coupled both to the latter's gate terminal and to one terminal of a current source 2504, Ibias, the other terminal of which is at the supply potential 201.

The current ratio (output current to input current) of the current mirror 2500 is given as the quotient of the ratio of the transistor width to the transistor length (W/L ratio) of transistor 2502 to transistor 2501. An ideal current mirror requires a high and linear output impedance (that is to say high output resistance and low output capacitance). Consequently, the output current is essentially independent of the output AC voltage or the output DC voltage.

A description is given below, referring to FIG. 25B, of a current mirror circuit 2510 as an integrated circuit in accordance with a fifteenth exemplary embodiment of the invention.

In the case of the current mirror circuit 2510, the first and second current mirror transistors 2501 and 2502 are replaced by a configuration according to the invention such as is shown in FIG. 1B. In particular, the first current mirror transistor 2501 is replaced by a first replacement current mirror transistor 2501a and by a second replacement current mirror transistor 2501b. The second current mirror transistor 2502 is replaced by a third replacement current mirror transistor 2502a and by a fourth replacement current mirror transistor 2502b.

In the case of the current mirror circuit 2500, the entire input current Iin flows through the first current mirror transistor 2501, whereas in the case of the current mirror circuit 2510 part of said current does not flow through the first and second replacement current mirror transistors 2501a and 2501b that replace the first current mirror transistor 2501a. Instead, part of the current is consumed for a periodically performed recharging or charging of the gate capacitances of the transistors 2501a, 2501b, 2502a, 2502b. This current portion Icg can be specified by $$Icg = Vg,on \times f \times \Sigma Cg \quad (6)$$

where f is the frequency of the clock signals $\phi_1$, $\phi_2$, Vg,on is the voltage established at the gate terminal of the transistors 2501a, 2501b, 2502a, 2502b, and ΣCg is the sum of the gate capacitances of all the transistors 2501a, 2501b, 2502a, 2502b (or more precisely the sum of the integrals of the gate capacitances over the voltage range swept over during clocked operation of the transistors in accordance with the invention).

It should be noted that the gate capacitance is approximately constant in very strong inversion and in very strong accumulation, but in the depletion region it exhibits a relatively great voltage dependence and a reduction in comparison with the values in inversion and accumulation.

Figure 25A:
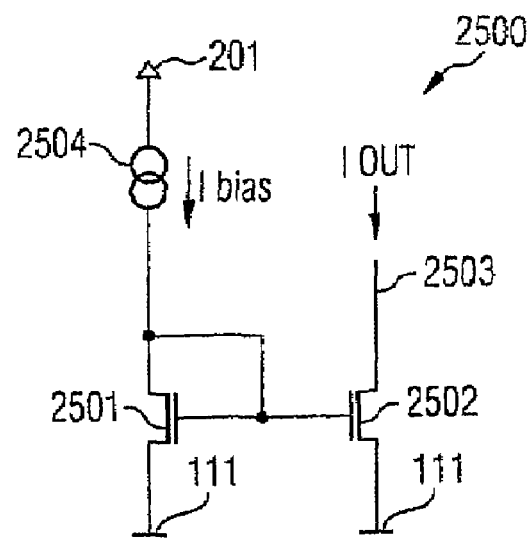
FIG. 25A shows a current mirror with n-MOS transistors in accordance with the prior art.
Figure 25B:
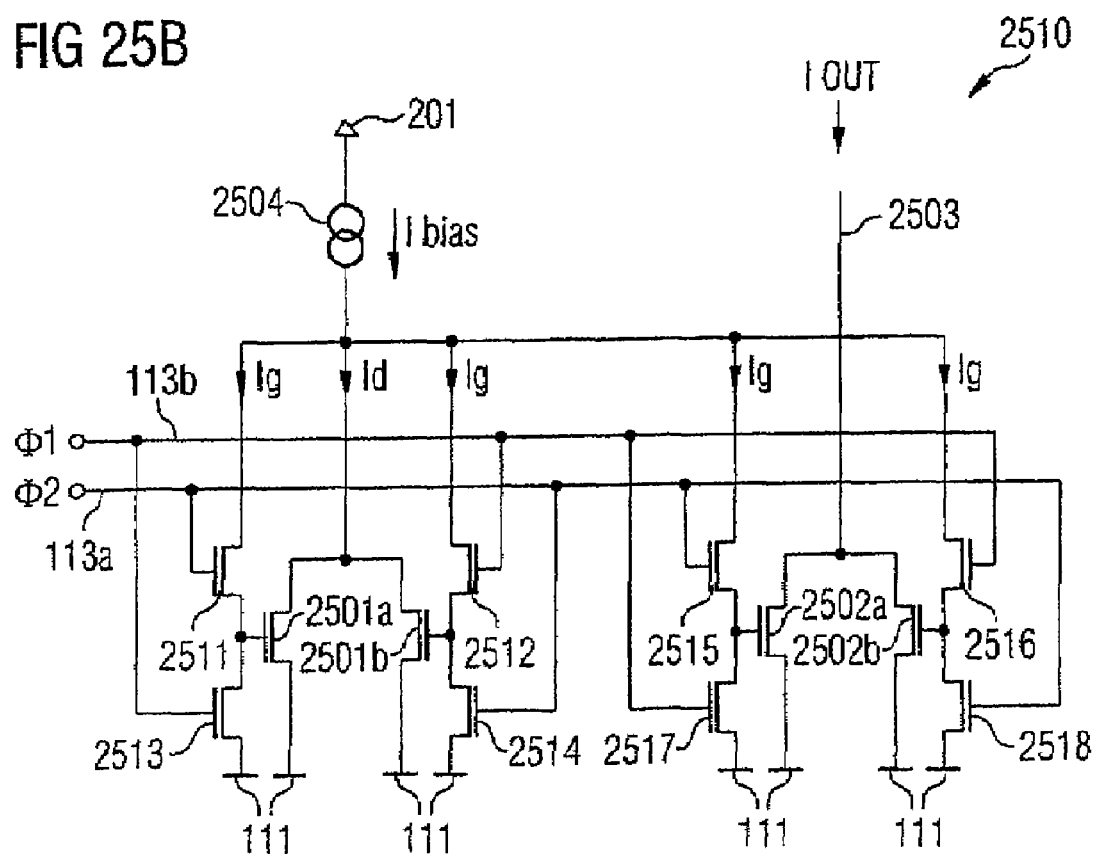
FIGS. 25B, 26 show current mirrors as integrated circuits in accordance with fifteenth and sixteenth exemplary embodiments of the invention.

Furthermore, FIG. 25B shows first to eighth n-MOS switching transistors 2511 to 2518 for driving the first to fourth replacement current mirror transistors 2501a, 2501b, 2502a, 2502b in accordance with the invention, which are connected up in a manner similar to the first to eighth n-MOS switching transistors 1601 to 1608 shown in FIG. 16A, FIG. 16B.

It should be noted that the current mirror circuit 2510 shown in FIG. 25B can be modified or extended to the effect that a cascaded structure (similar to that in FIG. 14A) can be used or that the common source/drain potentials of all the transistors can be set to a value that is different from the ground potential (in a manner similar to that for example in accordance with FIG. 15A).

Furthermore, the current mirror circuit 2500 shown in FIG. 25B may be realized particularly advantageously in SOI technology. In this case, the transistors from FIG. 25B are formed on and/or in an SOI substrate. In the case of a current mirror circuit 2501 with SOI transistors, disturbing self-heating effects and floating body effects are effectively suppressed on account of the clocked driving according to the invention.

A description is given below, referring to FIG. 26, of a current mirror circuit 2600 as an integrated circuit in accordance with a sixteenth exemplary embodiment of the invention.

Figure 26:
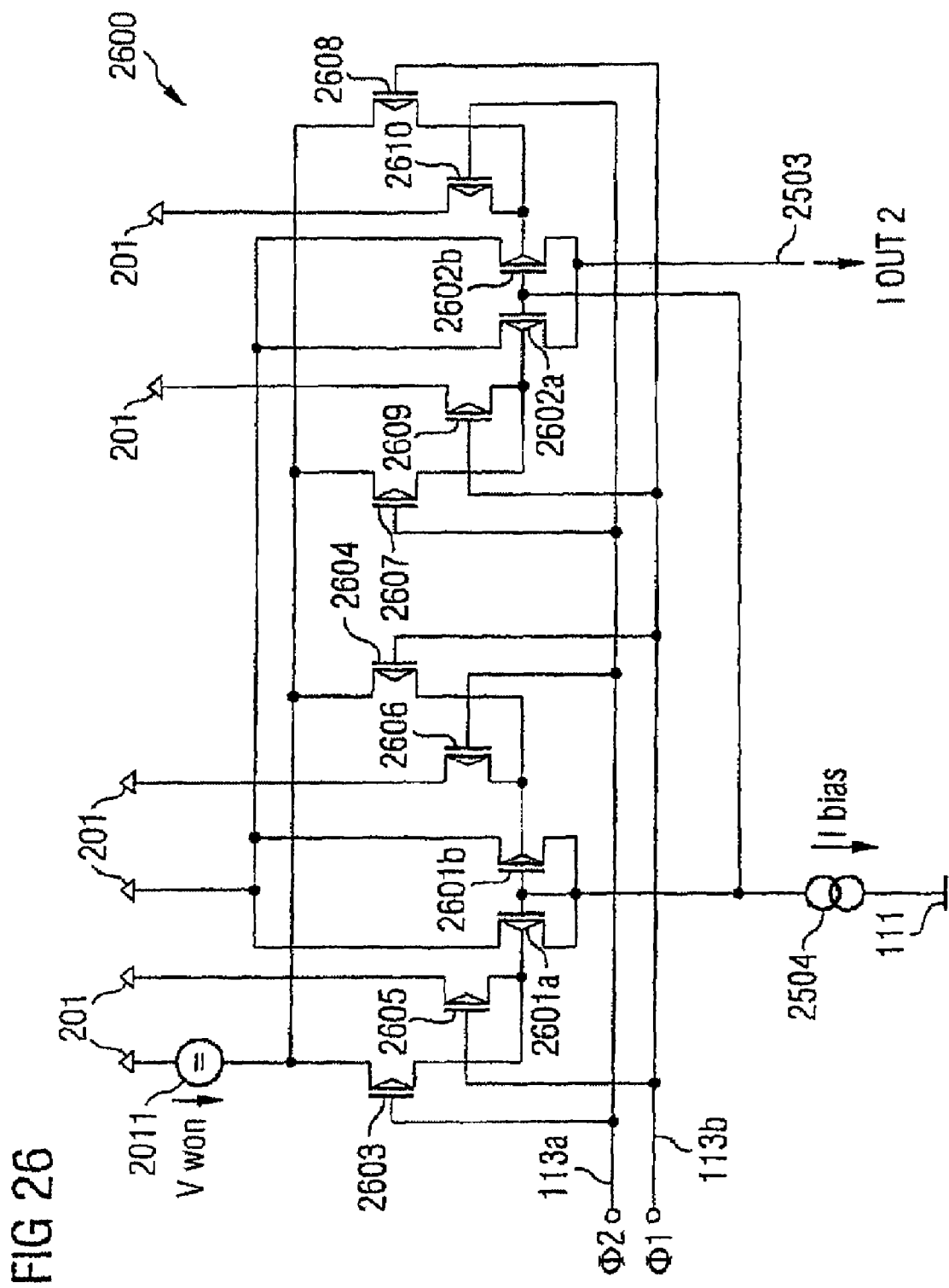

The current mirror circuit 2600 differs from the current mirror circuit 2510 shown in FIG. 25B essentially by virtue of the fact that p-MOS transistors are used for the replacement current mirror transistors and also for the switching transistors in accordance with FIG. 26, whereas n-MOS transistors are used in accordance with FIG. 25B. In the case of the current mirror circuit 2600, first and second p-MOS replacement current mirror transistors 2601a and 2601b are provided instead of the first and second n-MOS replacement current mirror transistors 2501a and 2501b, and, in accordance with FIG. 26B, third and fourth p-MOS replacement current mirror transistors 2602a, 2602b are provided instead of the third and fourth n-MOS replacement current mirror transistors 2502a, 2502b and first to eighth p-MOS switching transistors 2603 to 2610 are provided instead of the first to eighth n-MOS switching transistors 2511 to 2518.

The noise suppression according to the invention in accordance with the principle described in FIG. 4B is realized in the case of the current mirror circuit 2600. One advantage of the current mirror circuit 2600 over the realization shown in FIG. 25B is that the input current flows exclusively through the input transistors, that is to say that no further contribution is taken from it (e.g. in accordance with the relationship discussed above for Icg, c.f. equation (6)).

It goes without saying that the current mirror circuit 2600, too, can be modified or extended to the effect that a cascaded structure is used or that the source/drain potentials of the transistors, which are brought to VDD potential 201 in FIG. 26, are brought to a value that is different from the VDD potential 201.

Two different operational amplifier circuits are taken as a basis below, referring to FIG. 27 and to FIG. 30, to show how the basic idea according to the invention and the discussed subcircuits according to the invention can be coupled to one another in the context of more complex circuits.

Figure 27:
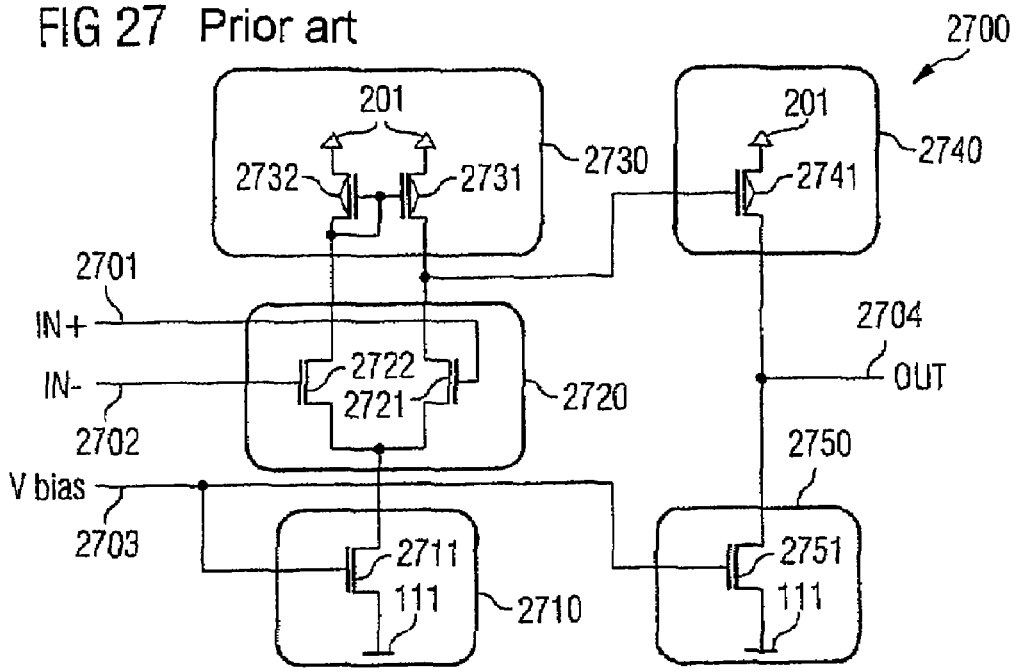
FIGS. 27 and 28 show operational amplifiers in accordance with the prior art.

FIG. 27 shows a simple, so-called two-stage (single-ended) operational amplifier 2700 in accordance with the prior art such as is described in R. Gregorian, G. C. Temes, "Analog MOS Integrated Circuits", N.Y., John Wiley & Sons, 1986, P. E. Allen, and D. R. Holberg, "CMOS analog circuit design," N.Y., Oxford University Press, 1987, P. R. Gray, R. G. Meyer, "Analysis and design of analog integrated circuits," N.Y., John Wiley & Sons, 1993, and A. B. Grebene, "Bipolar and MOS analog integrated circuit design", N.Y., John Wiley & Sons, 1984.

The individual circuit blocks of the operational amplifier 2700 will be described first.

The operational amplifier 2700 is formed from a first current source 2710, a differential input transistor pair 2720, a current mirror 2730, a second current source 2740 and a third current source 2750.

The operational amplifier 2700 contains a first input 2701 IN+ and a second input 2702 IN−, the first input 2701 being coupled to the gate region of a first n-MOS differential stage transistor 2721. The second input 2702 is coupled to the gate region of a second n-MOS differential stage transistor 2722 of the differential input transistor pair 2720. One respective source/drain terminal of the n-MOS differential stage transistors 2721, 2722 is coupled to a source/drain terminal of a first n-MOS current source transistor 2711 of the first current source 2710. The other source/drain terminal of the first n-MOS current source transistor 2711 is coupled to the ground potential 111. Furthermore, a bias voltage 2703 Vbias is applied to the gate terminal of the first n-MOS current source transistor 2711. The bias voltage 2703 is furthermore applied to the gate terminal of a second n-MOS current source transistor 2751. One source/drain terminal of the second n-MOS current source transistor 2751 is coupled to electrical ground potential 111, and the other source/drain terminal of the second n-MOS current source transistor 2751 is coupled to an output 2704 and also to one source/drain terminal of a first p-MOS current source transistor of the second current source 2740. The second source/drain terminal of the first p-MOS current source transistor 2741 is coupled to supply potential 201, whereas the gate terminal of the first p-MOS current source transistor 2741 is coupled to the other source/drain terminal of the first n-MOS differential stage transistor 2721 of the differential input transistor pair 2720. Furthermore, the gate terminal of the first p-MOS current source transistor 2741 is coupled to one source/drain terminal of a first p-MOS current mirror transistor 2731 of the current mirror 2730. The other source/drain terminal thereof is at the supply potential 201. The gate terminal of the first p-MOS current mirror transistor 2731 is coupled to the gate terminal of a second p-MOS current mirror transistor 3732 of the current mirror 2730 and is furthermore coupled to one source/drain terminal of the second p-MOS current mirror transistor 2732. The other source/drain terminal of the second p-MOS current mirror transistor 2732 is at supply potential 201. The first source/drain terminal of the second p-MOS current mirror transistor 2732 is coupled to the other source/drain terminal of the second n-MOS differential stage transistor 2722 of the differential input transistor pair 2720.

The first current source 2710 is an n-MOS current source for operation of the single-ended differential stage, formed from the differential input transistor pair 2720 and the current mirror 2730. The operating point of the first current source transistor 2711 is effected using the constant bias voltage 2703. The second current source 2740 is a p-MOS current source and part of the output stage, the second current source 2740 being driven with the output signal of the single-ended differential stage. The third current source 2750 is an n-MOS current source and part of the output stage, the driving, that is to say operating point setting, of the third current source 2750 being effected with the bias voltage 2703 Vbias.

A description is given below, referring to FIG. 28, of another operational amplifier 2800 in accordance with the prior art.

This operational amplifier constitutes a so-called fully differential folded cascode circuit, which is described in R. Gregorian, G. C. Temes, "Analog MOS Integrated Circuits", N.Y., John Wiley & Sons, 1986, P. E. Allen, and D. R. Holberg, "CMOS analog circuit design," N.Y., Oxford University Press, 1987, P. R. Gray, R. G. Meyer, "Analysis and design of analog integrated circuits," N.Y., John Wiley & Sons, 1993, and A. B. Grebene, "Bipolar and MOS analog integrated circuit design", N.Y., John Wiley & Sons, 1984.

The operational amplifier 2800 is formed from five circuit blocks, namely a first current source 2810, a differential input transistor pair 2820, a second current source 2830, a third current source 2840 and a common-mode feedback circuit 2850.

Once again a first input 2701 IN+ and a second input 2702 IN− are provided. Furthermore, first to fifth bias voltages 2801 to 2805 are provided, at which bias voltages Vbias1, Vbias2, Vbias3, Vbias4, Vbias5 are provided. Furthermore, a first output 2806 OUT+ and a second output 2807 OUT− are provided. The first current source 2810 has a first n-MOS current source transistor 2811, to the gate region of which the fifth bias voltage 2805 Vbias is applied. One source/drain region of the first n-MOS current source transistor 2811 is at ground potential 111, whereas the second source/drain terminal of the first n-MOS current source transistor is coupled to one respective source/drain terminal of a first and of a second n-MOS differential stage transistor 2721, 2722 of the differential input transistor pair 2820. It should be noted that the differential input transistor pair 2820 is configured and connected up like the differential input transistor pair 2720 from FIG. 27. The second source/drain terminal of the second n-MOS differential stage transistor 2722 is coupled to a respective first source/drain terminal of a first and of a second p-MOS current source transistor 2831, 2832 of the second current source 2830. The other source/drain terminal of the first p-MOS current source transistor 2831 is at supply potential 201, whereas the gate terminal of the first p-MOS current source transistor 2831 is at the first bias voltage 2801 Vbias1. Furthermore, a third and a fourth p-MOS current source transistor 2833, 2834 are provided in the second current source 2830. The first source/drain terminal of the third p-MOS current source transistor 2833 is at supply potential 201, whereas the second source/drain terminal of the third p-MOS current source transistor 2833 is coupled to the first source/drain terminal of the fourth p-MOS current source transistor 2834. The first bias voltage 2801 Vbias1 is applied to the gate terminals of the first and of the third p-MOS current source transistor 2831, 2833. The second bias voltage 2802 Vbias2 is applied to the gate terminals of the second and of the fourth p-MOS current source transistor 2832 and 2834. Furthermore, the second source/drain region of the third p-MOS current source transistor 2833 and the first source/drain region of the fourth p-MOS current source transistor 2834 are coupled to the second source/drain region of the first n-MOS differential stage transistor 2721 of the differential input transistor pair 2820. The second source/drain region of the second p-MOS current source transistor 2832 is coupled to the second output 2807 OUT−, whereas the second source/drain terminal of the fourth p-MOS current source transistor 2834 is coupled to the first output 2806 OUT+. The third current source 2840 has second to fifth n-MOS current source transistors 2841 to 2844. The second n-MOS current source transistor 2841 is coupled by one source/drain terminal to the first output 2806 OUT+, whereas the second source/drain terminal of the second n-MOS current source transistor 2841 is coupled to a first source/drain terminal of the third n-MOS current source transistor 2842. The second source/drain terminal of the third n-MOS current source transistor 2842 is coupled to a first source/drain terminal of the fifth n-MOS current source transistor 2844, the second source/drain terminal of which is coupled to a first source/drain terminal of the fourth n-MOS current source transistor 2843. The second source/drain terminal of the fourth n-MOS current source transistor 2843 is coupled to the second output 2807 OUT−. Furthermore, the third bias voltage 2803 Vbias3 is applied to the gate terminals of the second and of the fourth n-MOS current source transistor 2841, 2843, whereas the fourth bias voltage 2804 Vbias4 is applied to the gate terminals of the third and of the fifth n-MOS current source transistor 2842, 2844. Furthermore, the second source/drain terminal of the third n-MOS current source transistor 2842 and the first source/drain terminal of the fifth n-MOS current source transistor 2844 are coupled to a respective first source/drain terminal of a first and of a second common-mode feedback transistor 2851, 2852 of the common-mode feedback circuit 2850. The respective second source/drain terminals of the common-mode feedback transistors 2851, 2852 are at ground potential 111. The gate terminal of the first common-mode feedback transistor 2851 is coupled to the first output 2806 OUT+, whereas the gate terminal of the second common-mode feedback transistor 2852 is coupled to the second output 2807 OUT−.

The first current source 2810 is provided for operation of the differential stage 2820. The operating point of the first current source 2810 is set by means of the constant bias voltage 2805 Vbias5. The second current source 2830 is a cascaded current source having p-MOS transistors with a center tap. Furthermore, the second current source 2830 is part of the output stage. The third current source 2840 is a cascaded current source having n-MOS transistors and is part of the output stage. It should once again be noted that the transistors of the common-mode feedback circuit 2850 contribute only negligible contributions to the overall noise of the circuit since their noise is fed as a common-mode signal into both branches of the output stage.

A description is given below, referring to FIG. 29 of an operational amplifier 2900 as an integrated circuit in accordance with a seventeenth exemplary embodiment of the invention.

The operational amplifier 2900 is obtained by means of all the blocks of the operational amplifier 2700 from FIG. 27 that are relevant to low-frequency noise being replaced by corresponding subcircuits configured according to the invention.

In the first current source 2710, such replacement is dispensable since this circuit block makes only a small contribution to the overall noise of the circuit. If this block is also intended additionally to be subjected to noise compensation, an interconnection as in the third current source 2750 in FIG. 29 can be performed instead of the first n-MOS current source transistor 2711.

In the differential input transistor pair 2720, the first n-MOS differential stage transistor 2721 is replaced by first and second n-MOS replacement differential stage transistors 2721a, 2721b. Furthermore, the second n-MOS differential stage transistor 2722 is replaced by third and fourth n-MOS replacement differential stage transistors 2722a, 2722b in the manner according to the invention. Furthermore, n-MOS switching transistors 2901 are provided in order that the transistors 2721a, 2721b, 2722a, 2722b are connected up in accordance with the invention and are driven using clock signals $\phi_1$, $\phi_2$.

In the current mirror 2730, the first p-MOS current mirror transistor 2731 is replaced by first and second p-MOS replacement current mirror transistors 2731a, 2731b, and the second p-MOS current mirror transistor 2732 is replaced by third and fourth p-MOS replacement current mirror transistors 2732a, 2732b. Furthermore, p-MOS switching transistors 2902 are provided in order that the transistors 2731a, 2731b, 2732a, 2732b are driven using the clock signals $\phi_1$, $\phi_2$ in accordance with the invention.

In the second current source 2740, the first p-MOS current source transistor 2741 is replaced by first and second p-MOS replacement current source transistors 2741a, 2741b. Furthermore, p-MOS switching transistors 2902 are also provided in this circuit block.

Figure 29:
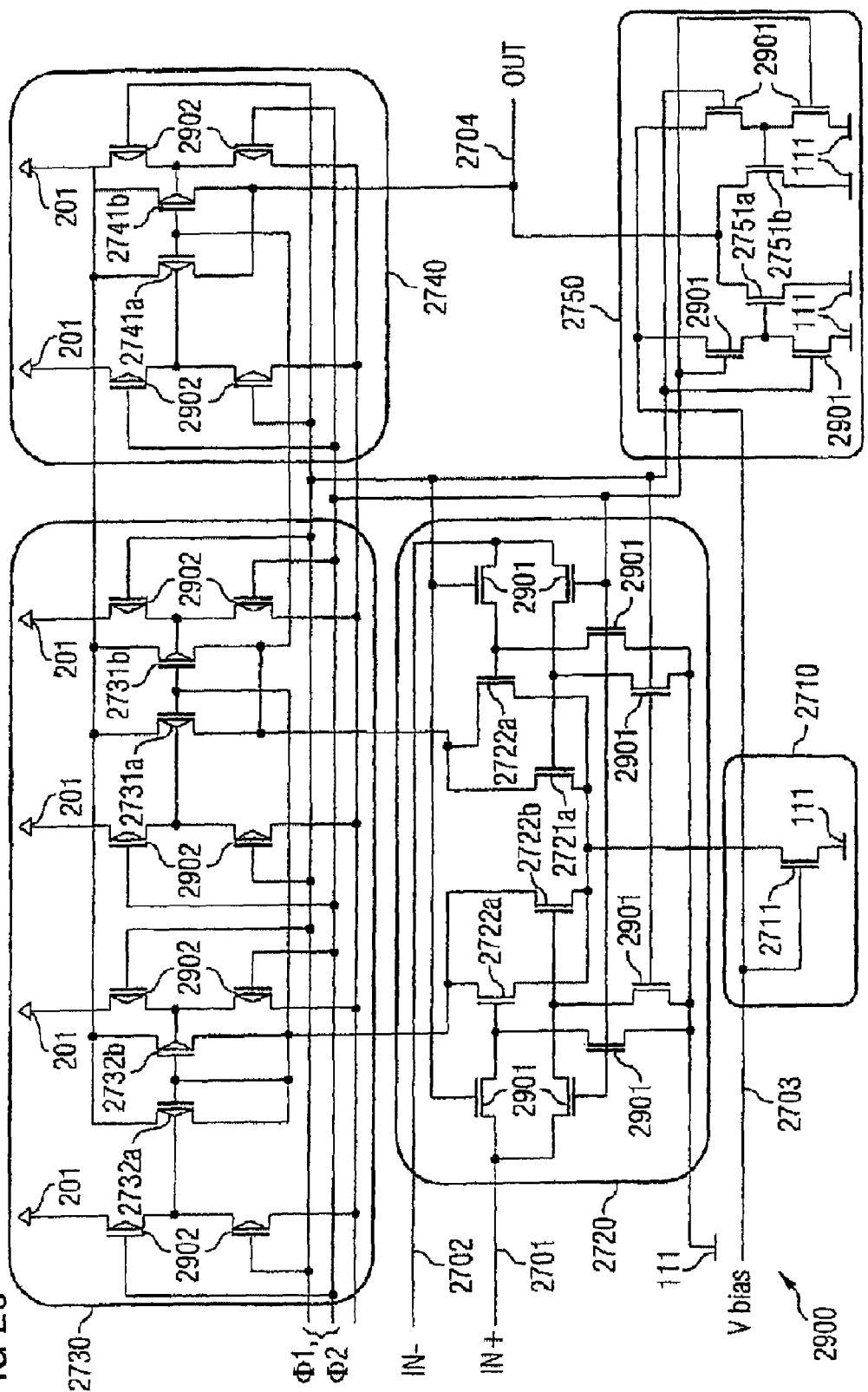
FIGS. 29, 30 show operational amplifiers as integrated circuits in accordance with seventeenth and eighteenth exemplary embodiments of the invention.

In the third current source 2750, in FIG. 29 the second n-MOS current source transistor 2751 is replaced by third and fourth p-MOS replacement current source transistors 2751a, 2751b. Furthermore, n-MOS switching transistors 2901 are also provided in this subcircuit.

Clearly, in the circuit blocks 2720, 2750, the driving of the noise-compensated transistors is performed via the gate nodes thereof, whereas in the blocks 2730, 2740 replaced according to the invention, the driving of the noise-compensated transistors is performed via the well nodes thereof.

A description is given below, referring to FIG. 30, of an operational amplifier 3000 as an integrated circuit in accordance with an eighteenth exemplary embodiment of the invention.

Figure 28:
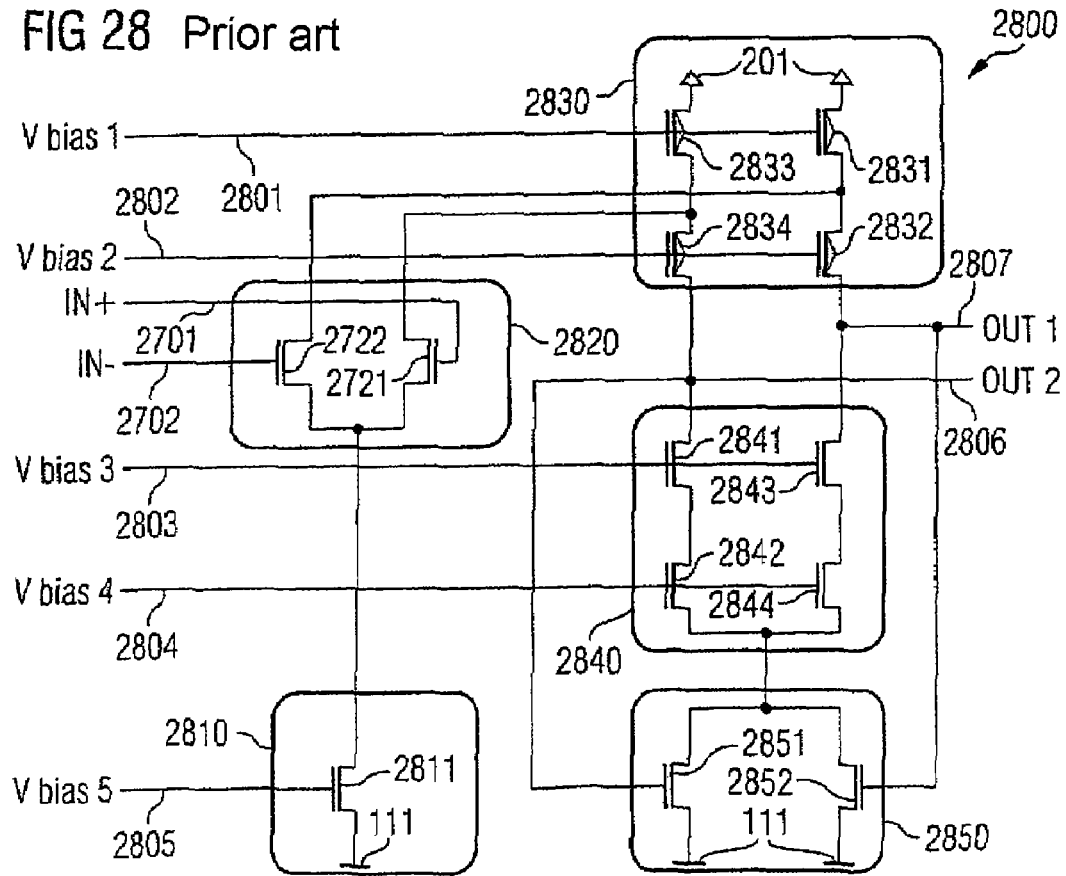
Figure 30:
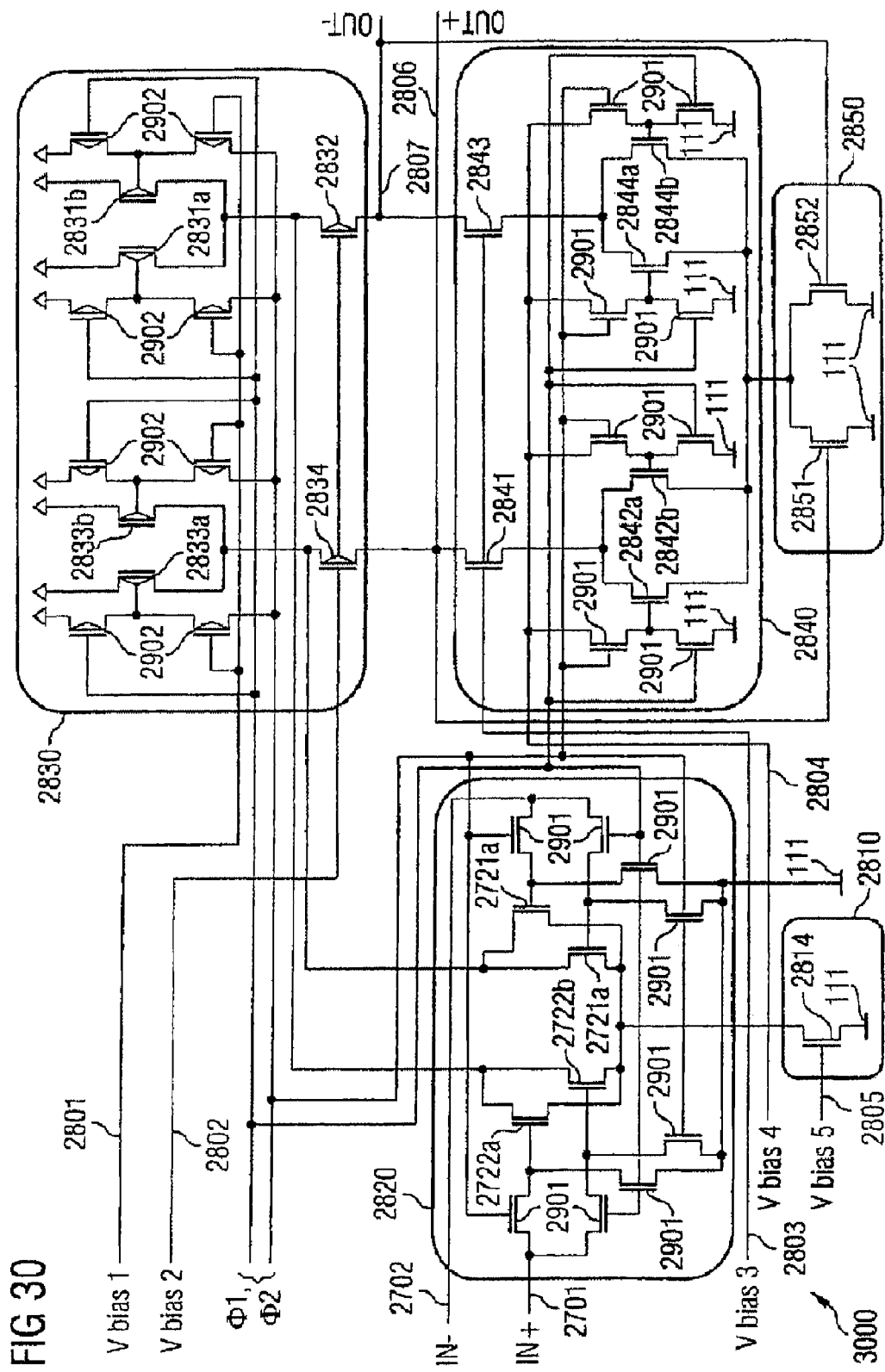

The operational amplifier 3000 from FIG. 30 differs from the operational amplifier 2800 shown in FIG. 28 essentially by virtue of the fact that in the circuit blocks 2820, 2830 and 2840 transistors are replaced, connected up and driven using the clock signals $\phi_1$, $\phi_2$ in accordance with the invention.

The differential input transistor pair 2820 is connected up like the differential input transistor pair 2720 from FIG. 29.

In the second current source 2830, the first p-MOS current source transistor 2831 is replaced by first and second p-MOS replacement current source transistors 2831a, 2831b. Furthermore, the third p-MOS current source transistor 2833 is replaced by third and fourth p-MOS replacement current source transistors 2833a, 2833b. Furthermore, p-MOS switching transistors 2902 are provided in order to enable the interconnection and driving according to the invention.

In the third current source 2840, the third n-MOS current source transistor 2842 is replaced by first and second n-MOS replacement current source transistors 2842a, 2842b, and furthermore the fifth n-MOS current source transistor 2844 is replaced by third and fourth n-MOS replacement current source transistors 2844a, 2844b. Furthermore, n-MOS switching transistors 2901 are provided in order to enable the interconnection and driving according to the invention.

In the case of the operational amplifier 3000, the blocks 2810, 2850 are not altered by comparison with FIG. 28, since the noise of these blocks makes only a negligible contribution. In the blocks 2820, 2830, 2840, the driving of noise-compensated transistors is performed via the gate nodes thereof, only a portion of the transistors, but not the cascode elements (transistors 2834, 2832, 2841, 2843), being replaced in the current source blocks 2830, 2840. It goes without saying that these cascode transistors can also be replaced if a particularly low noise is sought.

A description is given below, referring to FIG. 31A, of a conventional n-MOS SOI transistor 3100 and, referring to FIG. 31B, of an SOI transistor arrangement 3100 that replaces the latter in accordance with a fourth exemplary embodiment of the invention.

FIG. 31A shows a conventional n-MOS SOI transistor 3100, which is provided in the manner integrated on an SOI substrate 101 (silicon on insulator). The n-MOS SOI transistor 3100 has a first source/drain terminal 3102, a second source/drain terminal 3103 and a gate terminal 3104.

If it is operated in a circuit, the n-MOS SOI transistor 3100 makes a contribution to the low-frequency noise of the circuit. Furthermore, the SOI transistor 3100 may be exposed to the floating body effect and the self-heating effect, which effects may occur in SOI circuits.

FIG. 31B shows an SOI transistor arrangement 3100 in accordance with the fourth exemplary embodiment of the invention, in which the n-MOS SOI transistor 3100 is replaced according to the invention by two suitably connected up transistors in such a way that low-frequency noise is suppressed and the floating body and also the self-heating effect are suppressed.

In the case of the SOI transistor arrangement 3100, the n-MOS SOI transistor 3100 is replaced by a first and a second SOI replacement transistor 3100a, 3100b, which are in each case structurally identical to the n-MOS SOI transistor 3100, in particular have the same geometrical dimensions as the n-MOS SOI transistor 3100. The first source/drain terminals 3102 of the SOI replacement transistors 3100a, 3100b are coupled to one another and the second source/drain terminals 3103 of the n-MOS SOI replacement transistors 3100a, 3100b are coupled to one another. It can furthermore be seen from FIG. 31B, the gate terminal 3104 from FIG. 31A is replaced by a first replacement gate terminal 3104a as gate terminal of the first n-MOS SOI replacement transistor 3100a and by a second replacement gate terminal 3104b as gate terminal of the second n-MOS SOI replacement transistor 3100b. The first replacement gate terminal 3104a of the first n-MOS SOI replacement transistor 3100a is coupled to a first switch element 3112a, which is controlled by means of a first clock signal $\phi_2$ applied to a first clock signal input 3113a. Furthermore, the second replacement gate terminal 3104 of the second n-MOS SOI replacement transistor 3100b is coupled to a second switch element 3112b, which is controlled by means of a second clock signal $\phi_1$. The switch elements 3112a, 3112b are driven with the clock signals $\phi_1$ and $\phi_2$ which are in antiphase (as shown in FIG. 31B). As a result, a respective one of the replacement gate terminals 3104a, 3104b is brought to ground potential 3111 and the respective other replacement gate terminal 3104b, 3104a is brought to the electrical potential applied to another gate circuit node 3114. If the electrical potential of the gate circuit mode 3104 is applied to one of the replacement gate terminals 3104a, 3104b of one of the SOI transistors 3100a, 3100b, then the corresponding SOI transistor 3100a or 3100b (assuming a suitable electrical potential) can be brought to a conductive state and assume an operating point in inversion. If, on the other hand, the electrical ground potential 3111 is applied to the replacement gate terminal 3100a, 3100b of an SOI transistor 3100a or 3100b, then the corresponding transistor 3100a, 3100b turns off and assumes an operating point in depletion or accumulation.

In the case of the transistor arrangement 3110, in a manner similar to that in the case of the transistor arrangement 110 from FIG. 1B, the low-frequency noise is reduced on account of clocked driving of the two transistors 3100a, 3100b. Furthermore, the clocked driving of the transistors 3100a, 3100b in the case of the SOI circuit arrangement 3110 from FIG. 31B additionally leads to a reduction of the floating body effect and to a reduction of the heating effect.

The circuit implementation comprising n-MOS SOI transistors in accordance with FIG. 31B constitutes an advantageous realization of an integrated analog circuit. By means of the two complementary full swing range clock signals $\phi_1$ and $\phi_2$ and by means of the two switch elements 3112a, 3112b, the gate terminal 3104a and 3104b of the respective SOI field effect transistors 3100a and 3110b is connected to the gate circuit node 3114 or to an electrical ground potential 3111, in each case during a half-cycle of the respective clock signal. One of the two transistors (in a specific operating state for example transistor 3100a) is caused to be operated in an inversion state (on state) whereas the other (for example transistor 3100b) is operated in relation (off state) during the same period. In this configuration, both transistors will be in accumulation for a respective time, whereby the respective transistors are given time to relax thermally and to discharge a floating body node. This time is necessary for suppressing the floating body effect and the self-heating effect.

By means of the alternate switching or two (or more) transistors, a respective one of the transistors is in an active operating state for the circuit, and the other (or the others) is (are) in a relaxation state, so that the circuit implementation according to the invention constitutes an advantageous realization for many integrated analog circuits.

With the configuration from FIG. 31B, a clock duration for operation is set such that it is essentially equal to the relaxation time for the cooling of a respective SOI transistor 3100a or 3100b.

A description is given below, referring to FIG. 32A, of an SOI transistor arrangement 3200 in accordance with the prior art and, referring to FIG. 32B, of an SOI transistor arrangement 3210 that replaces the latter in accordance with a fifth exemplary embodiment of the invention.

FIG. 32A shows a conventional p-MOS SOI transistor 3200 integrated in an SOI substrate 3201. The SOI transistor 3200 has a first source/drain terminal 3202, a second source/drain terminal 3203 and a gate terminal 3204.

FIG. 32B shows an SOI transistor arrangement 3210 in accordance with the fifth exemplary embodiment of the invention, in which the p-MOS SOI transistor 3200 is replaced according to the invention by a first p-MOS SOI replacement transistor 3200a and by a second p-MOS SOI replacement transistor 3200b.

In a departure from the configuration of FIG. 31B, in accordance with FIG. 32B the gate potentials of the p-MOS SOI replacement transistors 3200a and 3200b are switched between the potential of a gate circuit node 3214 and a supply potential VDD. In accordance with this configuration, the p-MOS SOI replacement transistors 3200a, 3200b turn off if the supply potential VDD 3211 is present at their respective gate terminal 3204a or 3204b. The switching of the two operating states of the two p-MOS SOI transistors 3200a, 3200b is realized by means of two switch elements 3212a, 3212b, which are switched by means of the clock signals $\phi_1$, $\phi_2$ that are in antiphase with respect to one another and are shown in FIG. 32B.

A description is given below, referring to FIG. 33, of a cross-sectional view of a semiconductor-technological realization of the SOI transistor arrangement 3110 in accordance with the fourth exemplary embodiment of the invention shown in FIG. 31B.

Figure 33:
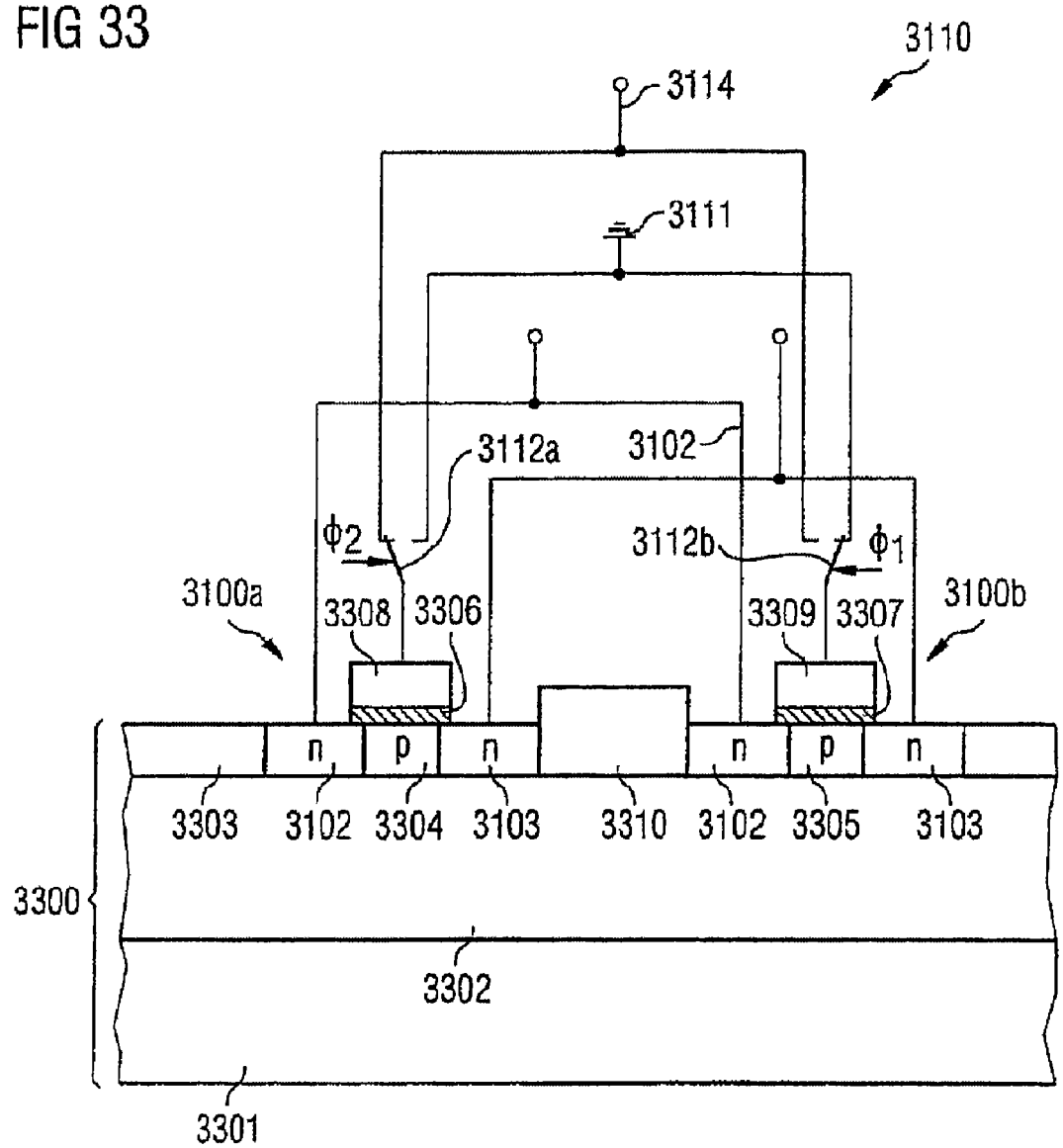
FIG. 33 shows a cross-sectional view of a semiconductor-technological realization of the n-MOS SOI transistor arrangement in accordance with the fourth exemplary embodiment of the invention.

The SOI transistor arrangement 3210 is realized in the SOI substrate 3300 shown in FIG. 33. The SOI substrate 3300 is formed from a silicon chip 3301, a buried silicon oxide layer 3302 on the silicon chip 3101 and from a thin silicon layer 3303 on the buried silicon oxide layer 3302. Regions are n-doped and p-doped in the silicon layer 3302. n-doped regions of the silicon layer 3303 form the first source/drain terminals 3102 and the second source/drain terminals 3103. A channel region 3304, 3305 is in each case formed as a p-doped region between the respective source/drain terminals 3102, 3103 of the first n-MOS SOI replacement transistors 3100a and of the second n-MOS replacement transistors 3100b. A first and a second gate insulating layer 3306 and 3307, respectively, are arranged on the respective channel region 3304, 3305 between the assigned source/drain terminals 3102, 3103. A first gate region 3308 and a second gate region 3309 are formed on the gate insulating layer 3306 and 3307, respectively. The field effect transistors 3100a and 3100b are electrically decoupled from one another by means of a silicon oxide decoupling structure 3310.

A description is given below, referring to FIG. 34A, of a conventional n-MOS SOI transistor 3400 and, referring to FIG. 34B, of an SOI transistor arrangement 3410 that replaces the latter in accordance with a sixth exemplary embodiment of the invention.

The first n-MOS SOI transistor 3400 in accordance with the prior art is formed in an SOI substrate 3401 and has a first source/drain terminal 3402, a second source/drain terminal 3403 and a gate terminal 3404. The n-MOS SOI transistor 3400 in accordance with the prior art is subjected to the floating gate effect and to the self-heating effect and is furthermore adversely influenced by low-frequency noise.

Figure 34B:
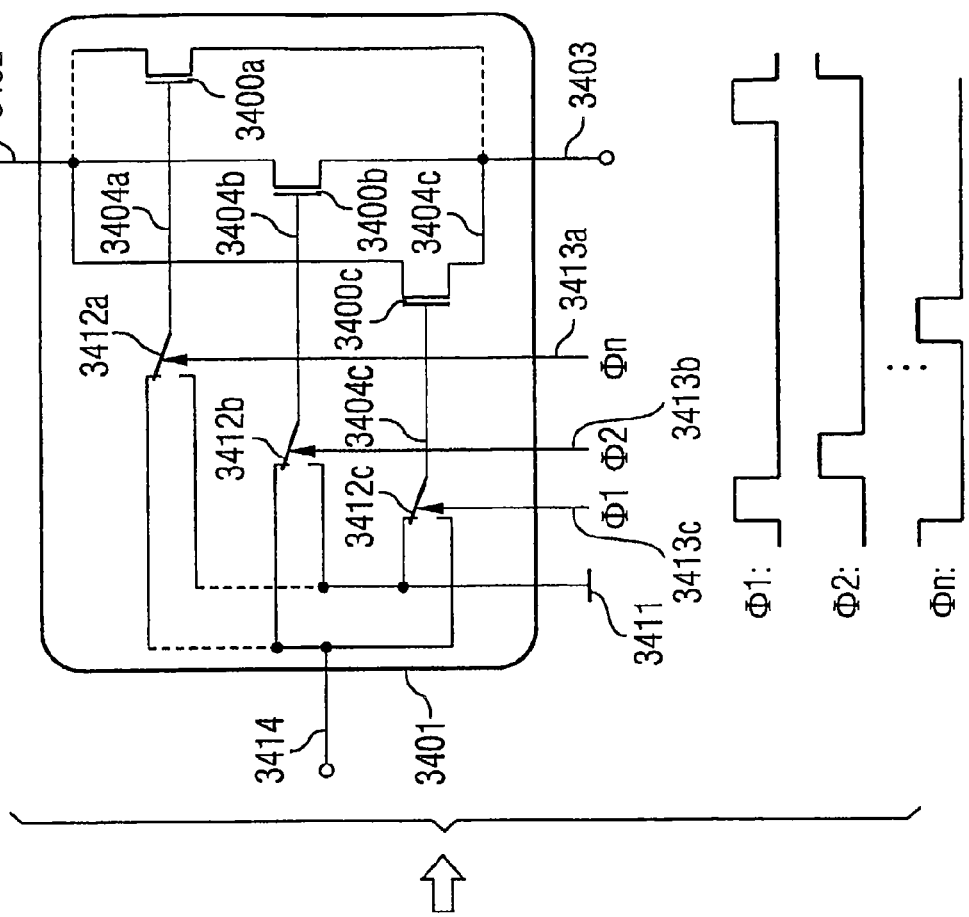
FIG. 34A shows a conventional n-MOS SOI transistor and FIG. 34B shows an n-MOS SOI transistor arrangement that replaces the latter in accordance with a sixth exemplary embodiment of the invention.
Figure 34A:
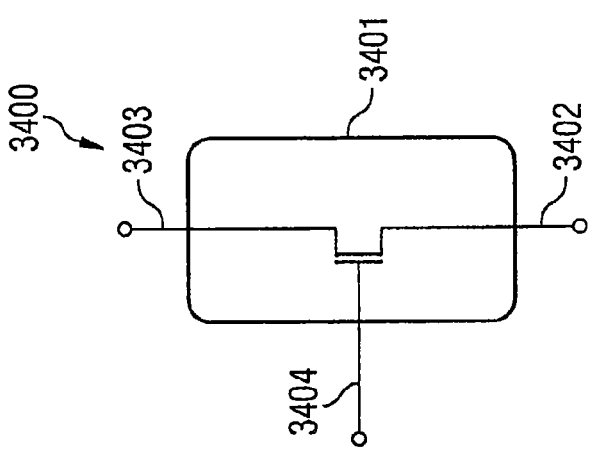

FIG. 34B shows the SOI transistor arrangement 3410 in accordance with a sixth exemplary embodiment of the invention, in which the n-MOS SOI transistor 3400 is replaced by first to n-th n-MOS SOI transistors 3400a and 3400c. All the n-MOS SOI replacement transistors 3400a to 3400c have a common first source/drain terminal 3402 and common source/drain terminal 3403. Each n-MOS SOI replacement transistor 3400a to 3400c is assigned a switch element 3412a to 3412b, which is switched by means of first to n-th clock signals $\phi_n, \ldots, \phi_2, \phi_1$. The respective gate terminal 3404a to 3404c of the respective n-MOS SOI replacement transistor 3400a to 3400c may be coupled to the gate circuit node 3414 or to the electrical ground potential 3411 depending on the switch position of the assigned switch element 3412a to 3412c.

The switch positions of the switch elements 3412a to 3412c which are controlled by means of the clock signals $\phi_n, \ldots, \phi_2, \phi_1$ are set in such a way that precisely one of the n-MOS SOI replacement transistors 3400a to 3400c in each case is coupled to the gate circuit node 3414 and all the others are coupled to the electrical ground potential 3411. This is realized by means of the clock signals $\phi_n, \ldots, \phi_2, \phi_1$ that are temporally offset relative to one another, each of the clock signals being at a logic value "1" for an n-th of the time and the respective transistor being in the off state for the remaining proportional time period (n−1)/n of the clock cycle. To put it another way, at a specific point in time there is only ever precisely one of the clock signals which has a logic value "1", whereas all the other clock signals are at a logic value "0".

The clocking of the n-MOS SOI replacement transistors 3400a to 3400c shown has the effect that the relaxation time is increased for all the transistors 3400a to 3400c (the dimensions of which are preferably identical), so that the transistors can relax for a proportioned (n−1)/n of each clock period and are in an on state, during which energy that heats the transistor is subsequently supplied, only for a time proportion 1/n. Consequently, with the configuration of FIG. 34B, the self-heating effect of MOS transistors on an SOI film is significantly reduced, in a scenario in which the circuit arrangements shown in FIG. 31B, FIG. 32B cannot sufficiently suppress the self-heating of the SOI transistors. To put it another way, for a respective one of the transistors 3400a to 3400c in accordance with FIG. 34B, the relaxation time is greater than the operating time.

The interconnection shown in FIG. 34B can also be realized with p-MOS transistors instead of with n-MOS transistors. In principle, the replacement of a transistor by n>2 transistors is also possible for conventional bulk transistors.

A description is given below, referring to FIG. 35A, of a current mirror circuit 3500 with p-MOS transistors in accordance with the prior art and, referring to FIG. 35B, of a current mirror circuit 3510 as an integrated circuit in accordance with a nineteenth exemplary embodiment of the invention.

Figure 35B:
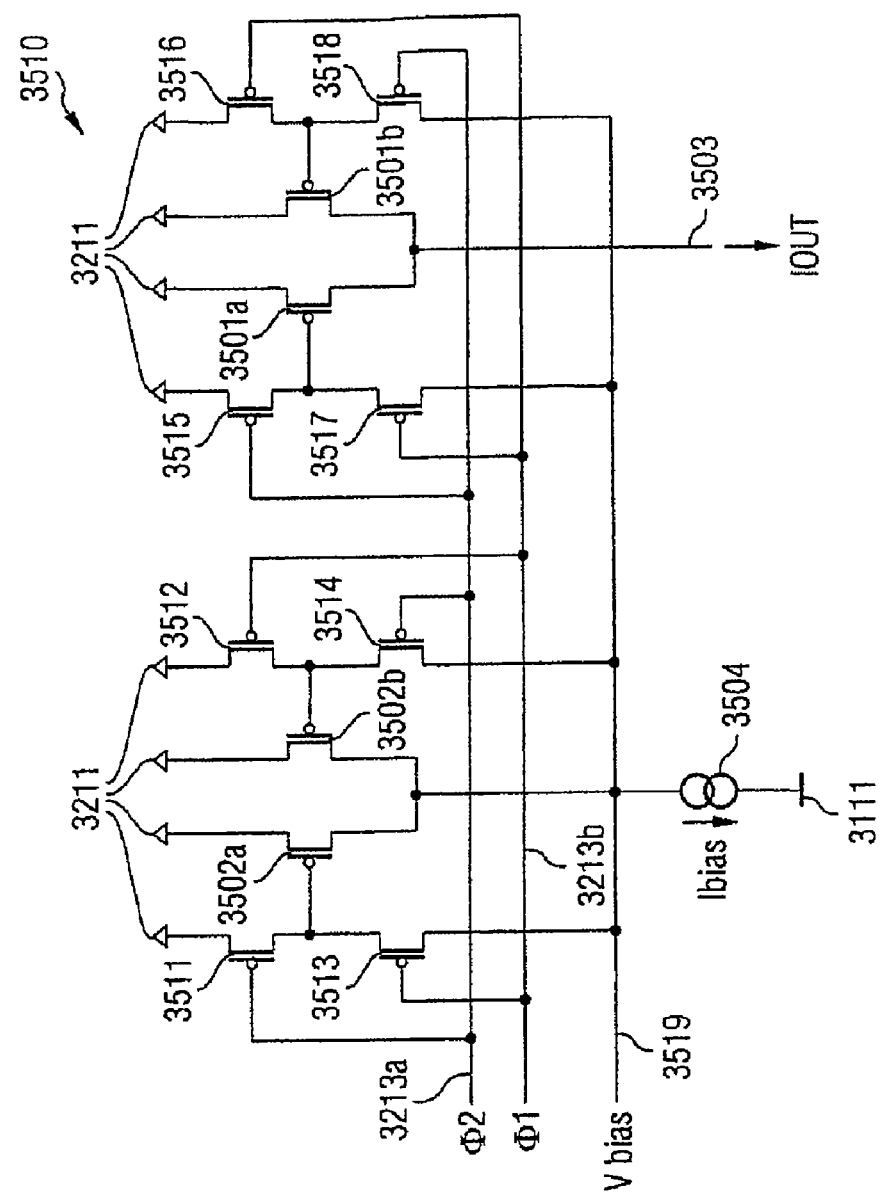
FIG. 35B shows a current mirror with p-MOS SOI transistors as an integrated circuit in accordance with a nineteenth exemplary embodiment of the invention.
Figure 35A:
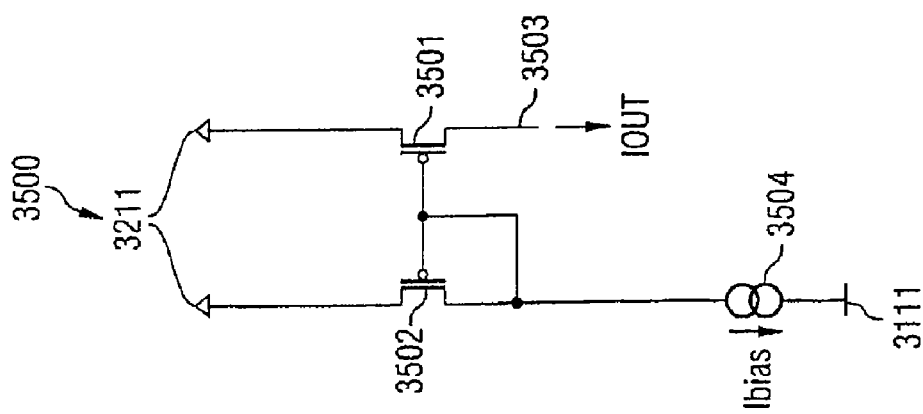
FIG. 35A shows a current mirror with p-MOS transistors in accordance with the prior art.

The current mirror circuit 3500 from FIG. 35A constitutes a realization of a current mirror with p-MOS transistors and otherwise largely corresponds to the realization of a current mirror with n-MOS transistors as shown in FIG. 25A. An important particular feature of the current mirror circuit 3500 from FIG. 35A is that the transistors 3501, 3502 are realized as SOI p-MOS transistors, and, on account of the SOI technology used, apart from the low-frequency noise, are also exposed to the self-heating effect and the floating body effect as disturbing effects. These disturbing effects are greatly reduced in the case of the invention's realization of the current mirror circuit 3510 from FIG. 35B.

The current mirror circuit 3500 has a first and a second p-MOS SOI current mirror transistor 3501 and 3502, the gate terminals of which are coupled to one another. One respective source/drain terminals of the first p-MOS SOI current mirror transistor 3501 and of the second p-MOS SOI current mirror transistor 3502 is at the electrical supply potential 3211. The other source/drain terminal of the first p-MOS SOI current mirror transistor 3501 is coupled to an output 3503 of the current mirror circuit 3500. The other source/drain terminal of the second p-MOS SOI current mirror transistor 3502 is coupled both to its own gate terminal and to one terminal of a current source 3504 Ibias, the other terminal of which is at the electrical ground potential 3111.

A description is given below, referring to FIG. 35B, of the current mirror circuit 3510 as an integrated circuit in accordance with a nineteenth exemplary embodiment of the invention. It must be emphasized that the current mirror circuit 3510 is realized in SOI technology, according to the invention each of the current mirror transistors 3501, 3502 being replaced by respective first and second n-MOS SOI replacement current mirror transistors 3501a, 3501b and 3502a, 3502b. As a result, the floating body effect and the self-heating effect are reduced in the case of the circuit arrangement 3510 realized in SOI technology.

To put it another way, in the case of the current mirror circuit 3510, the first and second p-MOS SOI current mirror transistors 3501 and 3502 are in each case replaced by a configuration according to the invention, in a similar manner to that shown in FIG. 31B. In particular, the first p-MOS SOI current mirror transistor 3501 is replaced by a first p-MOS SOI replacement current mirror transistor 3501a and by a second p-MOS SOI replacement current mirror transistor 3501b. The second p-MOS SOI current mirror transistor 3502 is replaced by a third p-MOS replacement current mirror transistor 3502a and by a fourth p-MOS SOI replacement current mirror transistor 3502b.

Furthermore, in FIG. 35B provision is made of first to eighth p-MOS SOI switching transistors 3511 to 3518 for driving a first to fourth p-MOS replacement current mirror transistors 3501a, 3501b, 3502a, 3502b, which are connected up in a similar manner to the first to eight n-MOS switching transistors 2511 to 2518 in FIG. 25B.

It should be noted that each of the integrated circuits according to the invention described with reference to FIG. 5A to FIG. 30 can also be realized in SOI technology. Circuit arrangements realized in SOI technology generally do not have transistors comprising a substrate terminal, since, in accordance with SOI technology, a transistor is usually driven via the gate terminal. In the case of the realization of the circuit arrangements with SOI transistors which are shown in FIG. 5A to FIG. 30, the advantages of SOI technology can be effectively utilized, the floating body effect and self-heating effect which occur to a great extent in SOI transistors simultaneously being reduced on account of the invention's driving of the transistors using alternating clock signals.

A description is given below, referring to FIG. 36, of an operational amplifier 3600 as an integrated circuit in accordance with a twentieth exemplary embodiment of the invention.

The operational amplifier 3600 constitutes a CMOS Miller two-stage operational amplifier. The operational amplifier 3600 constitutes a realization according to the invention of the operational amplifier 2700 from FIG. 27 that is known from the prior art, this realization being an alternative to FIG. 29.

Figure 36:
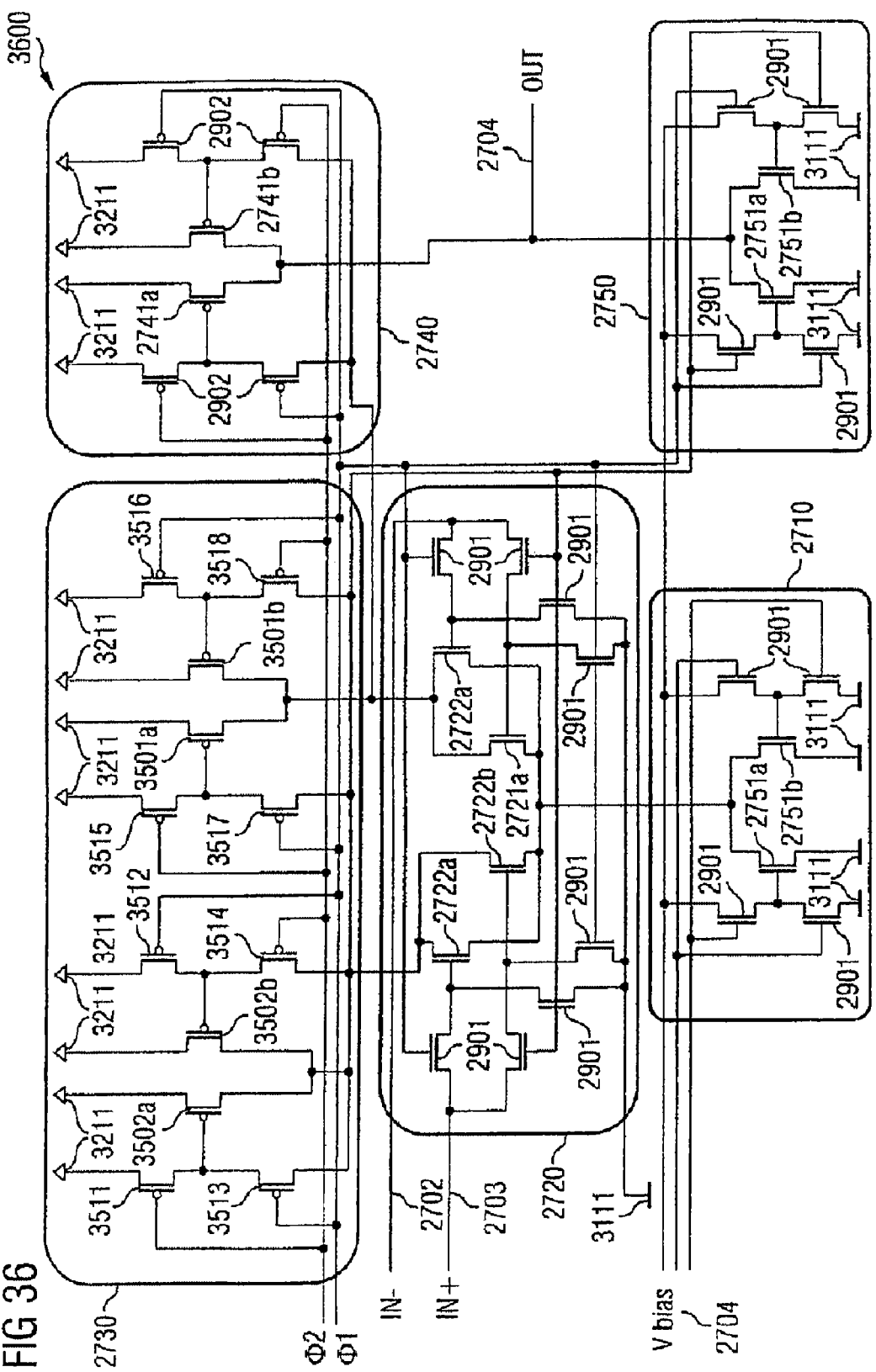
FIG. 36 shows an operational amplifier in SOI technology as an integrated circuit in accordance with a twentieth exemplary embodiment of the invention.

The operational amplifier 3600 is realized on an SOI substrate, so that the transistors shown in FIG. 36 are all SOI field effect transistors. The floating body effect and the self-heating effect that otherwise occurs in the case of SOI field effect transistors are avoided on account of the invention's clock operation of the transistors of the operational amplifier 3600.

The internal interconnection of the differential input transistor pair 2720 from FIG. 36 corresponds to interconnection within the corresponding block of FIG. 29. The current mirror 2730 in FIG. 36 was likewise realized as in FIG. 29. The internal interconnection of the second current source 2740 in FIG. 36 corresponds to that of FIG. 29. The third current source 2750, too, in FIG. 36 is realized as in FIG. 29 with regard to its internal interconnection. In a departure from FIG. 29, a first current source 2710 in accordance with FIG. 36 is realized not just by a single transistor 2711 but by an internal interconnection such as corresponds to the internal interconnection of the block 2750 from FIG. 36.

The invention claimed is:

1. A noise-reducing transistor arrangement, comprising:
a first and a second field effect transistor, each of which has a source terminal, a drain terminal, and a control terminal for application of a first signal or a second signal;
wherein the source terminal of the first field effect transistor and the source terminal of the second field effect transistor are coupled to one another, and
wherein the drain terminal of the first field effect transistor and the drain terminal of the second field effect transistor are coupled to one another, and
a clock generator unit being configured to generate a first clock signal and a second clock signal, wherein the control terminal of the first field effect transistor is coupled to a first switching element which is switched by means of the first clock signal, and the control terminal of the second field effect transistor is coupled to a second switching element, which is switched by means of the second clock signal, wherein the first and the second switch elements are configured to switch between a connection with the first signal and a connection with the second signal such that the first signal and the second signal are alternately provided to the field effect transistors with an alternating frequency which is at least as great as the cut-off frequency of the noise characteristic of the field effect transistors, or with a reciprocal alternating frequency which is less than a mean lifetime of an occupation state of a defect in the boundary region between channel region and gate insulating layer of the field effect transistors,
wherein the first clock signal and the second clock signal are configured to control the first switch element and the second switch element respectively such that
the first signal is applied to the control terminal of the first field effect transistor and, simultaneously, the second signal is applied to the control terminal of the second field effect transistor, and
the second signal is applied to the control terminal of the first field effect transistor and, simultaneously, the first signal is applied to the control terminal of the second field effect transistor.

2. The transistor arrangement as claimed in claim 1, wherein the control terminal is a gate terminal or a substrate terminal.

3. The transistor arrangement as claimed in claim 1, wherein:
for a case where the control terminal of the first and of the second field effect transistor is a gate terminal, the first field effect transistor and the second field effect transistor have a substrate terminal as additional control terminal,
for a case where the control terminal of the first field effect transistor and of the second field effect transistor is a substrate terminal, the first field effect transistor and the second field effect transistor have a gate terminal as an additional control terminal, and
the additional control terminals of the first field effect transistor and of the second field effect transistor are coupled to one another.

4. The transistor arrangement as claimed in claim 1, wherein one of the first and second signals is a useful signal and the respective other signal is a reference potential, or in which the first signal and the second signal are in each case a reference potential.

5. The transistor arrangement as claimed in claim 1, wherein the first field effect transistor and the second field effect transistor are structurally identical.

6. The transistor arrangement as claimed in claim 1, wherein the first signal and the second signal are applied alternately to the control terminal of the first field effect transistor and second field effect transistor, respectively, with an alternating frequency which is greater than the frequencies of a useful frequency band of an assigned circuit.

7. The transistor arrangement as claimed in claim 2, wherein at least one of the substrate terminals is set up as a well terminal of one of the two field effect transistors, which is formed in a well.

8. The transistor arrangement as claimed in claim 1, wherein both field effect transistors are of the same conduction type.

9. The transistor arrangement as claimed in claim 8, wherein both field effect transistors are n-MOS transistors.

10. The transistor arrangement as claimed in claim 8, wherein both field effect transistors are p-MOS transistors.

11. The transistor arrangement as claimed in claim 1, which is set up such that a respective one of the two field effect transistors is operated at an inversion operating point and the respective other of the two field effect transistors is operated at an accumulation or depletion operating point.

12. The transistor arrangement as claimed in claim 1, wherein:
the first switching element is switched by means of the first clock signal with an alternating frequency,
the second switching element is switched by means of the second clock signal, which is complementary to the first clock signal, with the alternating frequency, and
by means of the respective switching elements, the first or the second signal is alternately applied to the respective control terminal of the respective field effect transistor with the alternating frequency.

13. The transistor arrangement as claimed in claim 12, wherein the first switching element and the second switching element are a first switching transistor arrangement and a second switching transistor arrangement, respectively, to the respective gate terminal of which the respective clock signal can be applied, and a respective source/drain terminal of a respective switching transistor being coupled to the control terminal of the respective field effect transistor.

14. The transistor arrangement as claimed in claim 1, which is formed at least one of on and in a silicon on insulator substrate.

15. The transistor arrangement as claimed in claim 1, which is realized using analog circuit technology.

16. The transistor arrangement as claimed in claim 14, further comprising at least one additional field effect transistor,
wherein each of the at least one additional field effect transistor has a source terminal and a drain terminal and also has a control terminal, to which the first signal or the second signal can be applied,
wherein the source terminal of the first field effect transistor and the source terminal of the second field effect transistor are coupled to the source terminal of each of the at least one additional field effect transistors,
wherein the drain terminal of the first field effect transistor and the drain terminal of the second field effect transistor are coupled to the drain terminal of each of the at least one additional field effect transistors, and
wherein the transistor arrangement is set up such that, in a first operating state, the first signal is applied to the control terminal of the first field effect transistor or of the second field effect transistor or of precisely one of the at least one additional field effect transistor and, simultaneously, the second signal is applied to the control terminals of all of the other field effect transistors, in subsequent operating states, the first signal being applied progressively to the control terminal of in each case one of the remaining field effect transistors and, simultaneously, the second signal being applied to the control terminals of all of the other field effect transistors.

17. The transistor arrangement as claimed in claim 1, wherein the clock generator unit is set up such that the clock generator unit provides the clock signals that are shifted relative to one another to control the switch elements that are coupled to the field effect transistors so that the first signal or the second signal is alternately provided to the field effect transistors.

18. The transistor arrangement as claimed in claim 16, wherein the clock generator unit is set up such that the clock generator unit prescribes the clock signals at least one of for reducing the heating of the field effect transistors formed at least one of on and in the silicon on insulator substrate, and for reducing the floating body effect of the field effect transistors formed at least one of on and in the silicon on insulator substrate.

19. An integrated circuit comprising at least one transistor arrangement as claimed in claim 1.

20. The integrated circuit as claimed in claim 19, set up as one of a differential stage circuit, a current source circuit, a current mirror circuit, and an operational amplifier circuit.

21. The integrated circuit as claimed in claim 19, set up as a current source circuit, wherein the drain terminal of the first field effect transistor and the drain terminal of the second field effect transistor are at ground potential.

22. The integrated circuit as claimed in claim 19, set up as a current source circuit, and further comprising a voltage source, wherein the drain terminal of the first field effect transistor and the drain terminal of the second field effect transistor are brought to a potential that is different from ground potential by means of the voltage source.

23. The integrated circuit as claimed in claim 19, set up as a cascaded current source circuit.

24. The transistor arrangement as claimed in claim 1, wherein the gate terminal of the first field effect transistor and the gate terminal of the second field effect transistor are coupled to one another.

25. The transistor arrangement as claimed in claim 24, wherein the well terminal of the first field effect transistor and the well terminal of the second field effect transistor are provided separately one another.

26. A method of reducing the noise of field effect transistors, comprising:
connecting a first field effect transistor and a second field effect transistor to one another, each of the field effect transistors having a source terminal and a drain terminal and also a control terminal for application of a first or a second signal, wherein the source terminal of the first field effect transistor and the source terminal of the second field effect transistor are coupled to one another, and wherein the drain terminal of the first field effect transistor and the drain terminal of the second field effect transistor are coupled to one another; and
applying the first signal and the second signal alternately to the field effect transistors with an alternating frequency which is at least as great as the cut-off frequency of the noise characteristic of the field effect transistors, or with a reciprocal alternating frequency which is less than a mean lifetime of an occupation state of a defect in the boundary region between channel region and gate insulating layer of the field effect transistors, wherein the applying step comprises:
applying the first signal to the control terminal of the first field effect transistor and, simultaneously applying the second signal to the control terminal of the second field effect transistor; and
applying the second signal to the control terminal of the first field effect transistor and, simultaneously applying the first signal to the control terminal of the second field effect transistor.

27. The method as claimed in claim 26, wherein a gate terminal or a substrate terminal is used as the control terminal.

28. The method as claimed in claim 27, wherein, by means of the alternating application of the first and second signals, the quasi-Fermi energy in a boundary region between channel region and gate insulating layer of the field effect transistors is periodically altered by a value which is greater than the product of the Boltzmann constant and the absolute temperature.

29. The method as claimed in claim 27, wherein, by means of the alternating application of the first and second signals, the quasi-Fermi energy in a boundary region between channel region and gate insulating layer of the field effect transistors is periodically altered by between approximately 100 meV and approximately 1 eV.

30. The method as claimed in claim 26, wherein the arrangement of the field effect transistors is formed at least one of on and in a silicon on insulator substrate.

31. The method as claimed in claim 26, wherein the first signal and the second signal are applied alternately to the control terminals of the first field effect transistor and of the second field effect transistor in such a way that at least one of the heating of the field effect transistors formed at least one of on and in the silicon on insulator substrate is reduced, and the floating body effect of the field effect transistors formed at least one of on and in the silicon on insulator substrate is reduced.

* * * * *